(12) United States Patent  
Chen

(10) Patent No.: US 12,047,059 B2  
(45) Date of Patent: Jul. 23, 2024

(54) METHOD OF TUNING LIGHT COLOR TEMPERATURE FOR LED LIGHTING DEVICE AND APPLICATION THEREOF

(71) Applicant: Vaxcel International Co., Ltd., Carol Stream, IL (US)

(72) Inventor: Chia-Teh Chen, Taipei (TW)

(73) Assignee: VAXCEL INTERNATIONAL CO., LTD., Carol Stream, IL (US)

( * ) Notice: Subject to any disclaimer, the term of this patent is extended or adjusted under 35 U.S.C. 154(b) by 0 days.

(21) Appl. No.: 18/144,034

(22) Filed: May 5, 2023

(65) Prior Publication Data

US 2023/0275580 A1  Aug. 31, 2023

Related U.S. Application Data

(60) Division of application No. 17/341,547, filed on Jun. 8, 2021, now Pat. No. 11,689,197, which is a (Continued)

(30) Foreign Application Priority Data

Oct. 15, 2012 (TW) ................................ 101137918

(51) Int. Cl.  
*H03K 17/13* (2006.01)  
*F21V 3/00* (2015.01)  
(Continued)

(52) U.S. Cl.  
CPC ......... *H03K 17/133* (2013.01); *H03K 17/941* (2013.01); *H05B 39/08* (2013.01); (Continued)

(58) Field of Classification Search  
CPC ............... H03K 17/133; H03K 17/941; H03K 2217/94108; H05B 39/08; H05B 45/10; (Continued)

(56) References Cited

U.S. PATENT DOCUMENTS 6,016,038 A   1/2000 Mueller et al.  
6,528,954 B1  3/2003 Lys et al.  
(Continued)

*Primary Examiner* — Abdullah A Riyami  
*Assistant Examiner* — Syed M Kaiser  
(74) *Attorney, Agent, or Firm* — Li & Cai Intellectual Property (USA) Office

(57) ABSTRACT

A color temperature switching scheme for an LED lighting device is disclosed. The color temperature switching scheme comprises a plurality of different color temperature performances correspondingly generated by a plurality of different paired combinations of a first electric power allocated to a first LED load emitting a light with a first color temperature and a second electric power allocated to a second LED load emitting a light with a second color temperature such that a mingled color temperature between the first color temperature and the second color temperature can be generated thru a light diffuser. For tuning the mingled color temperature of the LED lighting device a reverse yet complementary power adjustment process for distributing a total electric power T between the first LED circuit and the second LED circuit is required such that a total light intensity remains unchanged while the mingled color temperature is being adjusted.

18 Claims, 37 Drawing Sheets

Related U.S. Application Data continuation of application No. 16/533,916, filed on Aug. 7, 2019, now Pat. No. 11,063,585, which is a continuation of application No. 16/162,460, filed on Oct. 17, 2018, now Pat. No. 10,470,276, which is a continuation of application No. 15/702,837, filed on Sep. 13, 2017, now Pat. No. 10,136,503, which is a continuation of application No. 15/292,395, filed on Oct. 13, 2016, now Pat. No. 9,795,008, which is a continuation of application No. 15/095,540, filed on Apr. 11, 2016, now Pat. No. 9,497,834, which is a continuation of application No. 14/579,248, filed on Dec. 22, 2014, now Pat. No. 9,345,112, which is a continuation-in-part of application No. 13/792,002, filed on Mar. 9, 2013, now Pat. No. 8,947,000.

(51) Int. Cl.

| | | |
|---|---|---|
| *F21Y 115/10* | (2016.01) | |
| *H03K 17/94* | (2006.01) | |
| *H05B 39/08* | (2006.01) | |
| *H05B 45/10* | (2020.01) | |
| *H05B 45/20* | (2020.01) | |
| *H05B 45/37* | (2020.01) | |
| *H05B 47/105* | (2020.01) | |
| *H05B 47/13* | (2020.01) | |
| *H05B 47/19* | (2020.01) | |

(52) U.S. Cl.
CPC ............ *H05B 45/10* (2020.01); *H05B 45/20* (2020.01); *H05B 45/37* (2020.01); *H05B 47/105* (2020.01); *H05B 47/13* (2020.01); *H05B 47/19* (2020.01); *F21V 3/00* (2013.01); *F21Y 2115/10* (2016.08); *Y02B 20/40* (2013.01)

(58) Field of Classification Search
CPC ...... H05B 45/20; H05B 45/37; H05B 47/105; H05B 47/13; H05B 47/19; F21V 3/00; F21Y 2115/10; Y02B 20/40
See application file for complete search history.

(56) References Cited

U.S. PATENT DOCUMENTS

| | | |
|---|---|---|
| 6,788,011 B2 | 9/2004 | Mueller et al. |
| 6,820,998 B2 | 11/2004 | Chen |
| 6,909,239 B2 | 6/2005 | Gauna |
| 7,014,336 B1 | 3/2006 | Ducharme et al. |
| 7,038,399 B2 | 5/2006 | Lys et al. |
| 7,088,059 B2 | 8/2006 | McKinney et al. |
| 7,178,941 B2 | 2/2007 | Roberge et al. |
| 7,192,160 B2 | 3/2007 | Reiff, Jr. et al. |
| 7,255,457 B2 | 8/2007 | Ducharme et al. |
| 7,268,497 B2 | 9/2007 | Hsieh |
| 7,339,471 B1 | 3/2008 | Chan et al. |
| 7,350,936 B2 | 4/2008 | Ducharme et al. |
| 7,476,002 B2 | 1/2009 | Wolf et al. |
| 7,777,427 B2 | 8/2010 | Stalker, III |
| 8,159,125 B2 | 4/2012 | Miao |
| 8,194,061 B2 | 6/2012 | Wang et al. |
| 8,203,260 B2 | 6/2012 | Li et al. |
| 8,222,584 B2 | 7/2012 | Rains, Jr. et al. |
| 8,390,207 B2 | 3/2013 | Dowling et al. |
| 8,436,549 B2 | 5/2013 | Hasnain |
| 8,515,275 B2 | 8/2013 | Machida et al. |
| 8,581,520 B1 | 11/2013 | Wray |
| 8,680,789 B2 | 3/2014 | Mohan et al. |
| 8,710,754 B2 | 4/2014 | Baddela et al. |
| 8,729,812 B2 | 5/2014 | Kuwu |
| 8,866,392 B2 | 10/2014 | Chen |
| 8,901,825 B2 | 12/2014 | Reed |
| 8,907,576 B2 | 12/2014 | Ferrier |
| 9,113,528 B2 | 8/2015 | Bora et al. |
| 9,179,508 B2 | 11/2015 | Mccune, Jr. et al. |
| 9,179,511 B2 | 11/2015 | Sugiura et al. |
| 9,185,755 B2 | 11/2015 | Sutardja et al. |
| 9,210,760 B2 | 12/2015 | Sanders et al. |
| 9,247,597 B2 | 1/2016 | Miskin et al. |
| 9,265,116 B2 | 2/2016 | Chen et al. |
| 9,374,854 B2 | 6/2016 | Quilici et al. |
| 9,456,478 B2 | 9/2016 | Rodriguez et al. |
| 9,719,642 B1 | 8/2017 | Macias |
| 9,872,358 B2 | 1/2018 | Beijer et al. |
| 11,063,585 B2* | 7/2021 | Chen ..................... H05B 47/13 |
| 2005/0174473 A1* | 8/2005 | Morgan ............... H05B 45/355 |
| | | 348/370 |
| 2005/0259416 A1 | 11/2005 | Gauna et al. |
| 2006/0002110 A1* | 1/2006 | Dowling ............... F21V 23/005 |
| | | 362/249.05 |
| 2010/0277905 A1* | 11/2010 | Janik ..................... H05B 45/30 |
| | | 315/297 |
| 2011/0043133 A1 | 2/2011 | Van Laanen et al. |
| 2011/0062888 A1 | 3/2011 | Bondy et al. |
| 2011/0175527 A1* | 7/2011 | Ramer ..................... F21V 3/02 |
| | | 315/32 |
| 2011/0221348 A1* | 9/2011 | Kwag .................... H05B 47/19 |
| | | 315/130 |
| 2012/0306377 A1 | 12/2012 | Igaki et al. |
| 2013/0020955 A1* | 1/2013 | Igaki ...................... H05B 45/20 |
| | | 315/210 |
| 2013/0026927 A1* | 1/2013 | Uhara .................... F21V 3/061 |
| | | 315/129 |
| 2013/0188347 A1* | 7/2013 | Bryan ..................... F21K 9/232 |
| | | 362/235 |
| 2014/0049971 A1* | 2/2014 | McGuire ................ H05B 45/30 |
| | | 362/382 |
| 2014/0049972 A1* | 2/2014 | McGuire .................. F21K 9/23 |
| | | 362/427 |
| 2014/0062313 A1 | 3/2014 | Ootsubo et al. |
| 2014/0197759 A1 | 7/2014 | Wray |
| 2014/0239828 A1 | 8/2014 | Smith |
| 2014/0355241 A1* | 12/2014 | Takenaka ................ F21K 9/232 |
| | | 362/296.05 |
| 2015/0002034 A1 | 1/2015 | Van De Ven et al. |
| 2015/0091464 A1* | 4/2015 | Yagi ..................... H05B 45/385 |
| | | 315/201 |
| 2015/0289339 A1 | 10/2015 | Wu et al. |
| 2015/0351190 A1* | 12/2015 | Walters ................ H05B 45/395 |
| | | 315/186 |
| 2019/0364645 A1* | 11/2019 | Chen ..................... H05B 47/13 |

* cited by examiner

METHOD OF TUNING LIGHT COLOR TEMPERATURE FOR LED LIGHTING DEVICE AND APPLICATION THEREOF

CROSS-REFERENCE TO RELATED PATENT APPLICATION

This application is a Divisional application of prior application Ser. No. 17/341,547 filed on Jun. 8, 2021. The application Ser. No. 17/341,547 is a continuation application of prior application Ser. No. 16/533,916 filed on Aug. 7, 2019, now U.S. Pat. No. 11,063,585. The application Ser. No. 16/533,916 is a continuation application of prior application Ser. No. 16/162,460 filed on Oct. 17, 2018, now U.S. Pat. No. 10,470,276. The application Ser. No. 16/162,460 filed on Oct. 17, 2018, now U.S. Pat. No. 10,470,276. The application Ser. No. 16/162,460 is a continuation application of prior application Ser. No. 15/702,837 filed on Sep. 13, 2017, now U.S. Pat. No. 10,136,503 B2. The application Ser. No. 15/702,837 is a continuation application of prior application Ser. No. 15/292,395 filed on Oct. 13, 2016, now U.S. Pat. No. 9,795,008. The application Ser. No. 15/292,395 is a continuation application of prior application Ser. No. 15/095,540 filed on Apr. 11, 2016, now U.S. Pat. No. 9,497,834. The application Ser. No. 15/095,540 is a continuation application of prior application Ser. No. 14/579,248 filed on Dec. 22, 2014, now U.S. Pat. No. 9,345,112 B2. The U.S. Pat. No. 9,345,112 B2 is a continuation-in-part of Non-provisional application Ser. No. 13/792,002 filed on Mar. 9, 2013, now U.S. Pat. No. 8,947,000 B2.

FIELD OF THE DISCLOSURE

The present disclosure relates to a technology using a microcontroller with program codes designed to provide a user friendly solution for performing on/off switch control, diming control, and timer management for a lighting apparatus or an electrical appliance.

BACKGROUND OF THE DISCLOSURE

A mechanical-type electric switch is a manually operated electromechanical device. Its function is based on attaching or detaching two metal conductors to produce a short or open circuit, respectively. This mechanical-type switch is not suitable for installing in a space where has the concern of gas explosion, because an instantaneous surge current, produced by suddenly engaging or releasing the metallic contact of the switch, may generate electric sparks to ignite fire.

A controllable semiconductor switching element, such as a triac, has nearly zero voltage between two output-electrodes in conduction mode and nearly zero current through two output-electrodes in cut-off mode. Solid state electronic switch utilizing the above unique features of triac for circuit on/off switch control can avoid generating electric arc, since the main current pathway of the solid-state switch is not formed by engaging the two metal conductors. It becomes a much better choice than mechanical-type electric switch from the stand point of safety consideration.

Solid-state electronic switches are constructed with various methods to trigger controllable switching element, like triac or thyristor, into conduction or cutoff for desired electric power transmission. For example, U.S. Pat. No. 4,322,637 disclosed a technique using optical coupling element to control bi-directional thyristor or triac in conduction or off state; or another U.S. Pat. No. 6,285,140B1 disclosed a technique using microcontroller incorporated with zero-crossing-point detector to generate AC-synchronized time-delay pulse to control triac in on or cut-off state so as to transmit variable electric power to a light-emitting diode load.

Mostly a mechanical toggle or spring button of similar setup is usually applied on the electronic switch to facilitate manual on/off switch operation. The operation of electronic switch with mechanical toggle means an inevitable contact by hand which is not appropriate in working places such as kitchens or hospitals. To relieve concerns of contagion or contamination resulted through hand contacts, touchless switches are developed. For example, U.S. Pat. No. 5,637,863 disclosed a technique utilized infrared sensor to activate electronic switch to operate on/off switch control, and even dimming control presumably by modifying its circuit design.

In retrospect, the above mentioned prior arts have however still some drawbacks. For instance, U.S. Pat. No. 5,637,863 used a complicated infrared sensor construction and circuit design; or U.S. Pat. No. 6,285,140B1 did not resort to an efficient control of electric power transmission from power source to various electric impedances which is required in lighting apparatus.

SUMMARY OF THE DISCLOSURE

An exemplary embodiment of the present disclosure provides a microcontroller based electronic switch for detecting an external motion signal. The microcontroller based electronic switch comprises a first controllable switching element, a second controllable switching element, a detection device and a microcontroller. The first controllable switching element is electrically connected between a power source and a first lighting load for emitting light with a first color temperature. The second controllable switching element is electrically connected between the power source and a second lighting load for emitting light with a second color temperature. The detection device is for detecting an external motion signal played by a user and converting said external motion signal into a message carrying sensing signal. The microcontroller with program codes is written and designed to read and interpret the message carrying sensing signal generated by said detection device, wherein said microcontroller is electrically connected between said first controllable switching element and said detection device, said microcontroller is electrically connected between said second controllable switching element and said detection device. Said microcontroller controls a conduction state or cutoff state of said first controllable switching element and said second controllable switching element according to said message carrying sensing signal generated by said detection device. When the first controllable switching element and the second controllable switching element are in the conduction state, said microcontroller further controls electric power transmission levels from the power source to the first lighting load and the second lighting load according to specific format of said message carrying sensing signal received from said detection device.

In one exemplary embodiment, the detection device is an infrared ray sensor comprising a means for emitting infrared light to form a defined infrared ray detecting zone and a means for detecting infrared light reflected from an object moving into said infrared ray detecting zone. A circuitry responsively generates a message carrying sensing signal having a first voltage with a time length corresponding to the time interval the object entering and staying in said infrared ray detecting zone. When the object leaves the infrared ray detecting zone, the infrared ray sensor delivers a second voltage signal.

In one exemplary embodiment, the detection device is an electrostatic induction sensor comprising a copper sheet sensing unit with adequately designed shape and size to form an electrostatic detecting zone. A circuitry responsively generates a message carrying sensing signal having a first voltage with a time length corresponding to the time interval an inductive object enters and stays in said electrostatic detecting zone. When said object leaves said electrostatic detecting zone, said electrostatic sensor delivers a second voltage signal.

In one exemplary embodiment, the detection device is a direct touch interface (such as a push button or a touch sensor) connecting with a pin of the microcontroller. When the user contacts the direct touch interface (for example, presses the push button) for a time interval, a first voltage signal is detected by the microcontroller which is a message carrying sensing signal having the first voltage with a time length corresponding to the time interval the touch interface being contacted. When the user leaves the direct touch interface (for example, releases the button), the direct touch interface delivers a second voltage signal.

An exemplary embodiment of the present disclosure provides a lighting apparatus comprising a first lighting load, a second lighting load, a diffuser and a microcontroller based electronic switch. The first lighting load is for emitting light with a first color temperature. The second lighting load is for emitting light with a second color temperature. The diffuser covers the first lighting load and the second lighting load. The microcontroller based electronic switch comprises a first controllable switching element, a second controllable switching element, a detection device and a microcontroller. The first controllable switching element is electrically connected between the first lighting load and a power source. The second controllable switching element is electrically connected between the second lighting load and the power source. The detection device is for detecting an external motion signal played by a user and converting said external motion signal into a message carrying sensing signal. The microcontroller with program codes is written and designed to read and interpret the message carrying sensing signal generated by said detection device, wherein said microcontroller is electrically connected between said first controllable switching element and said detection device, said microcontroller is electrically connected between said second controllable switching element and said detection device. Said microcontroller controls a conduction state or cutoff state of said first controllable switching element and said second controllable switching element according to said message carrying sensing signal generated by said detection device. When the first controllable switching element and second controllable switching element are in the conduction state, said microcontroller further controls electric power transmission levels from the power source to the first lighting load and the second lighting load according to specific format of said message carrying sensing signal received from said detection device. With the microcontroller based electronic switch to control the lighting power levels, the color temperature of the diffused light (also called the blended or mingled light) of the first lighting load and the second lighting load can be controlled.

In one exemplary embodiment, the detection device is an infrared ray sensor comprising a means for emitting infrared light to form a defined infrared ray detecting zone and a means for detecting infrared light reflected from an object moving into said infrared ray detecting zone. A circuitry responsively generates a message carrying sensing signal having a first voltage with a time length corresponding to the time interval the object entering and staying in said infrared ray detecting zone. When the object leaves the infrared ray detecting zone, the infrared ray sensor delivers a second voltage signal.

In one exemplary embodiment, the detection device is an electrostatic induction sensor comprising a copper sheet sensing unit with adequately designed shape and size to form an electrostatic detecting zone. A circuitry responsively generates a message carrying sensing signal having a first voltage with a time length corresponding to the time interval an inductive object enters and stays in said electrostatic detecting zone. When said object leaves said electrostatic detecting zone, said electrostatic sensor delivers a second voltage signal.

In one exemplary embodiment, the detection device is a direct touch interface (such as a push button or a touch sensor) connecting with a pin of the microcontroller. When the user contacts the direct touch interface (for example, presses the push button) for a time interval, a first voltage signal is detected by the microcontroller which is a message carrying sensing signal having the first voltage with a time length corresponding to the time interval the touch interface being contacted. When the user leaves the direct touch interface (for example, releases the button), the direct touch interface delivers a second voltage signal.

To sum up, the present disclosure is characteristic in, a contactless interface between the user and the multifunctional electronic switch is created to implement at least two operation modes of the electronic switch by using software codes written in OTPROM (one-time programmable read only memory) of microcontroller to analyze the message carrying sensing signals.

In order to further understand the techniques, means and effects of the present disclosure, the following detailed descriptions and appended drawings are hereby referred, such that, through which, the purposes, features and aspects of the present disclosure can be thoroughly and concretely appreciated; however, the appended drawings are merely provided for reference and illustration, without any intention to be used for limiting the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

FIG. 12-1A is a schematic block diagram of a color temperature tuning circuitry comprising two LED loads emitting lights with different light color temperatures, respectively being CT1 and CT2, to work with a power allocation circuitry configured with a two-way electric switch as a switching element to operate at least two loading options for generating two different diffused light color temperatures.

FIG. 12-1B is a schematic block diagram of a color temperature tuning circuitry comprising two LED loads emitting lights with different light color temperatures, respectively being CT1 and CT2, to work with a power allocation circuitry configured with a three-way electric switch as a switching element to operate at least three loading options for generating two different diffused light color temperatures.

FIG. 12-2 is a schematic diagram showing another embodiment of the light color temperature tuning platform using a power allocation circuitry configured with an electronic switch comprising a controller working in conjunction with at least two semiconductor switching devices operable by an external control device for controlling a power allocation between the first LED lighting load and the second LED lighting load according to a diffused light color temperature tuning algorithm.

FIG. 13-1 is a schematic diagram of a power allocation circuitry comprising a three-way electric switch configured with an adjustable resistor as a switching element for operating three power loading options to a light-emitting unit.

FIG. 13-2 is a schematic diagram of another power allocation circuitry comprising a two-way electric switch configured with two divided loads and a switching element for operating two power loading options to a light-emitting unit.

FIG. 13-3 is a schematic diagram of another power allocation circuitry comprising a switching element configured with a three-way electric switch to work with two divided loads for operating three power loading options to a light-emitting unit.

FIG. 13-4 is a schematic diagram of another power allocation circuitry comprising a switching element configured with a three-way electric switch to work with three divided loads for operating three power loading options of a light-emitting unit; and FIG. 13-5 is a schematic diagram of another power allocation circuitry comprising a switching element configured with a five-way electric switch to operate with three divided loads for operating five power loading options of a light-emitting unit.

Figure 1:
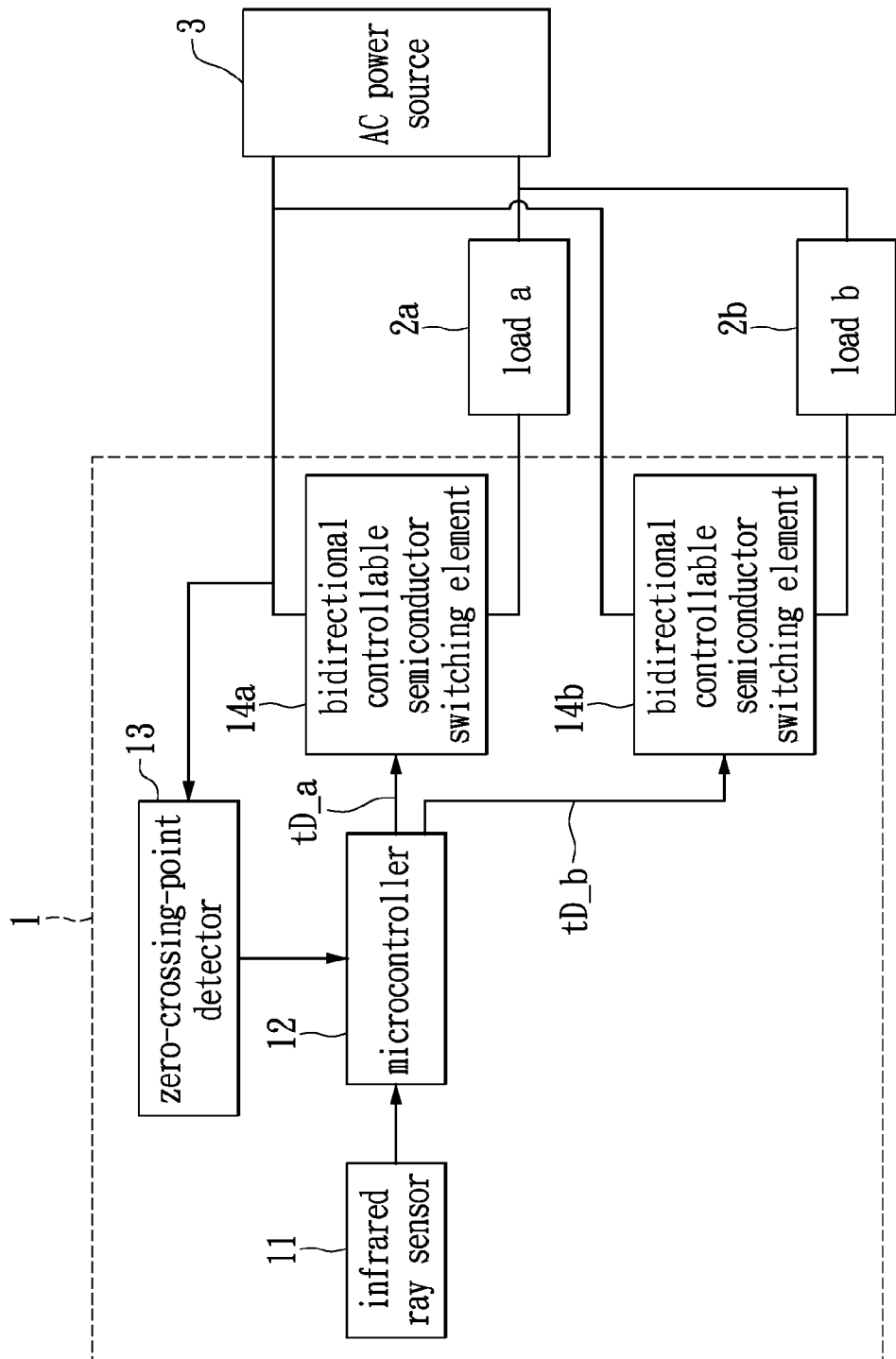
FIG. 1 is a block diagram of a microcontroller based electronic switch using an infrared ray sensor as a detection device applied for two AC lighting loads with different color temperatures powered by an AC power source according to an exemplary embodiment of the present disclosure.
Figures 1, 13:
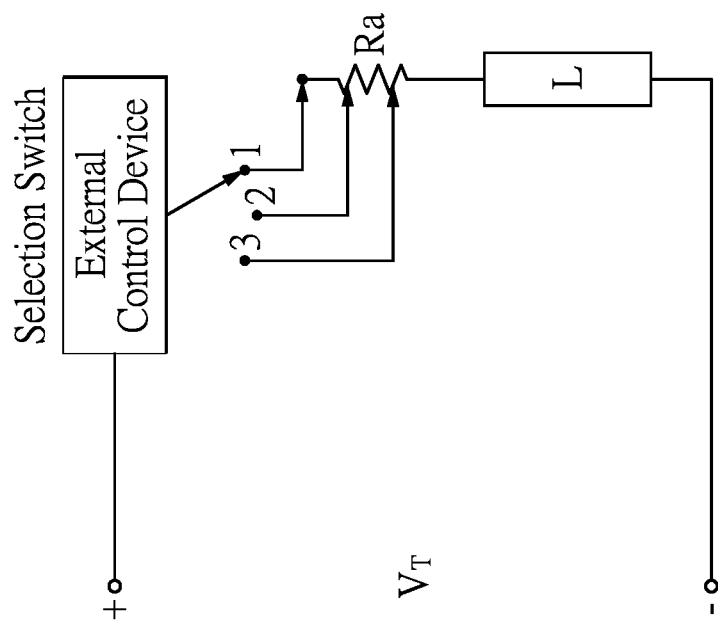
Figures 2, 13:
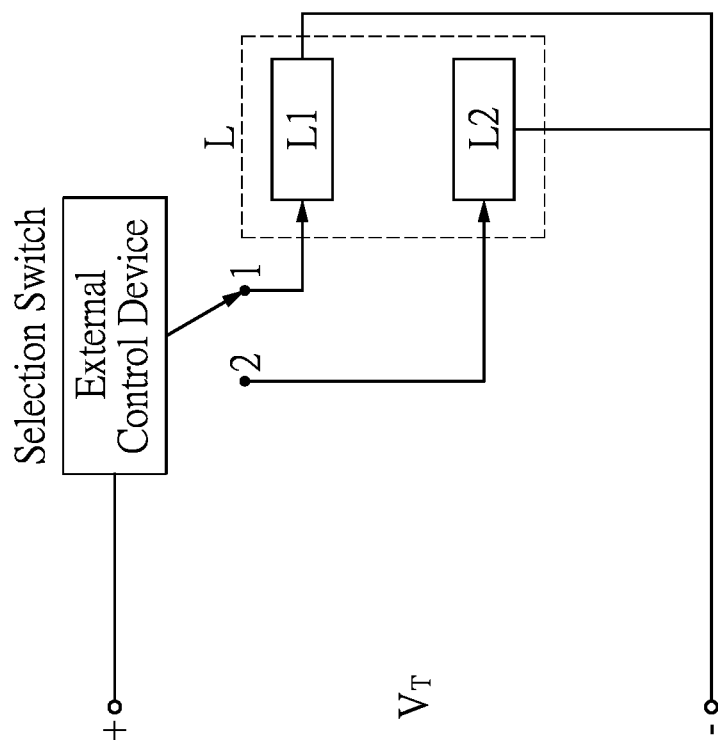

FIG. 16-1 is a schematic diagram of a color temperature tuning circuitry configured with two LED loads emitting lights with two different color temperatures CT1 and CT2 respectively connected to two reversely operated dimming circuitries of FIG. 13-1 operated with an adjustable resistor for performing a color temperature tuning scheme.

Figure 2:
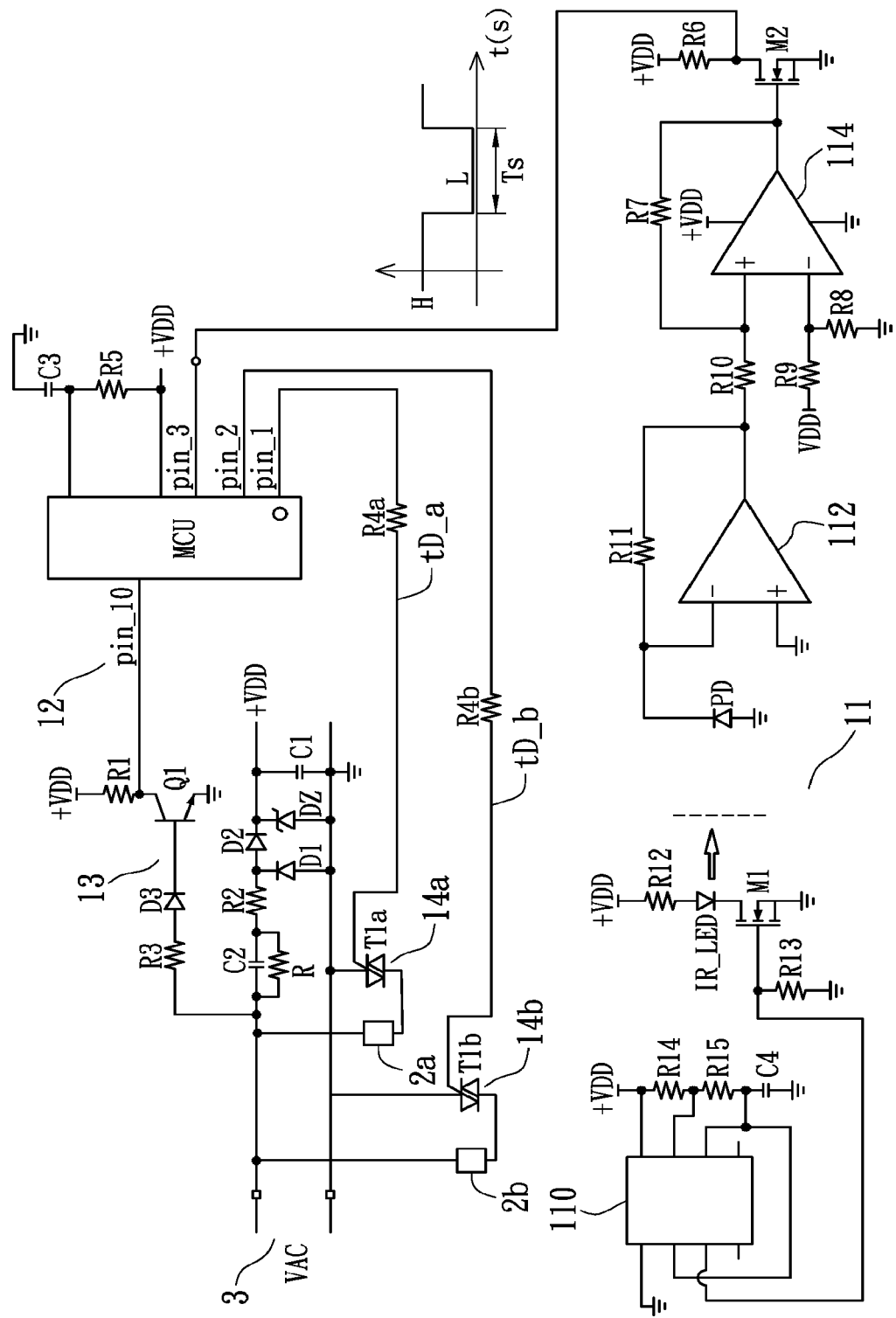
FIG. 2 is a circuit diagram of a microcontroller based electronic switch using an infrared ray sensor applied for two AC lighting loads with different color temperatures powered by an AC power source according to an exemplary embodiment of the present disclosure.
Figures 1, 16:
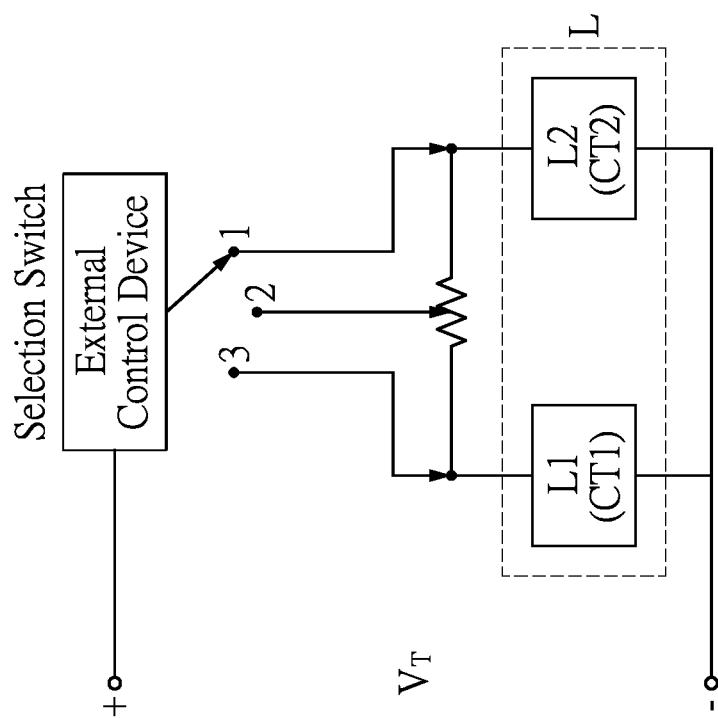
Figures 2, 16:
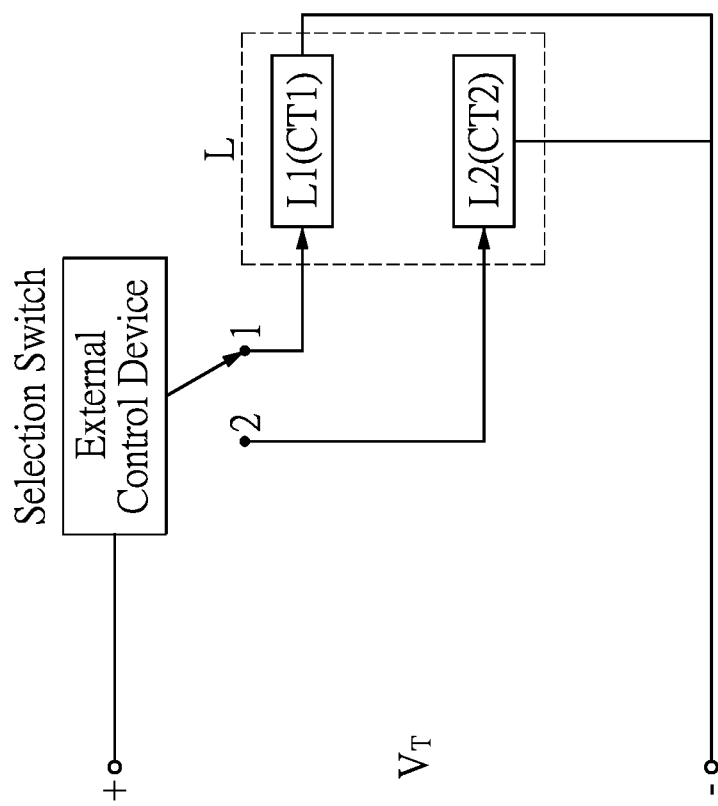
Figures 3, 16:
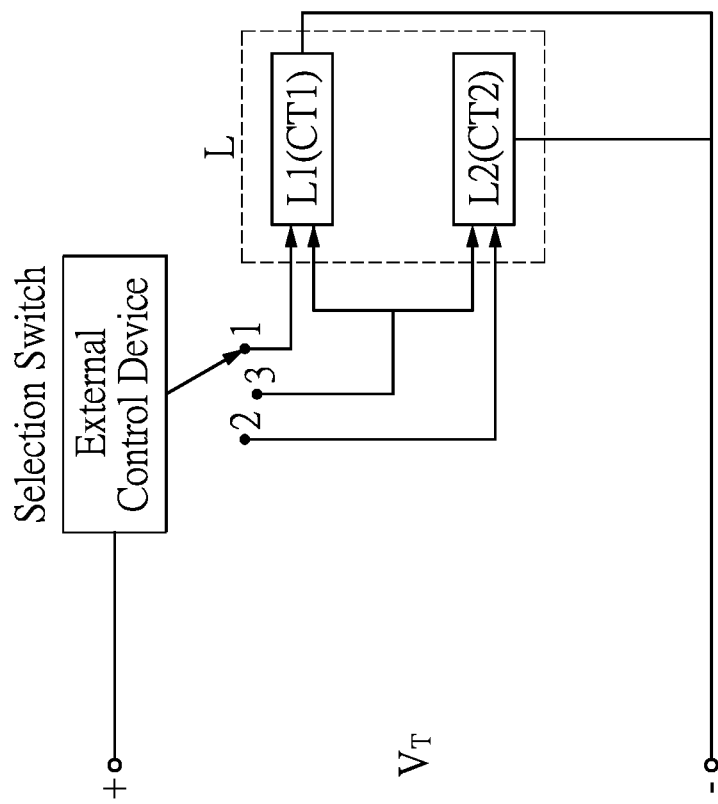
Figures 4, 16:
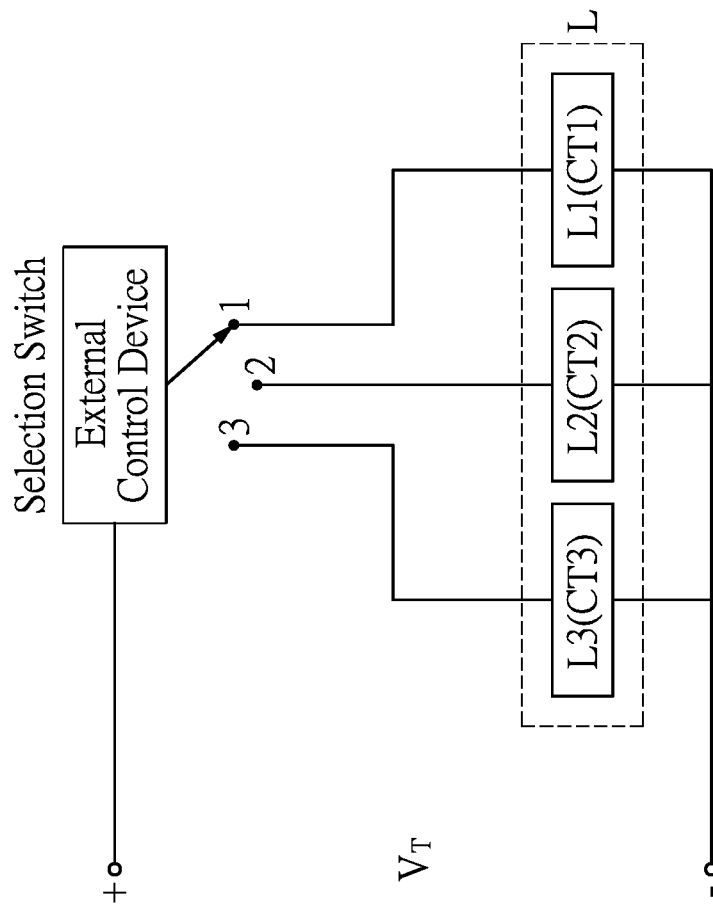
Figures 5, 16:
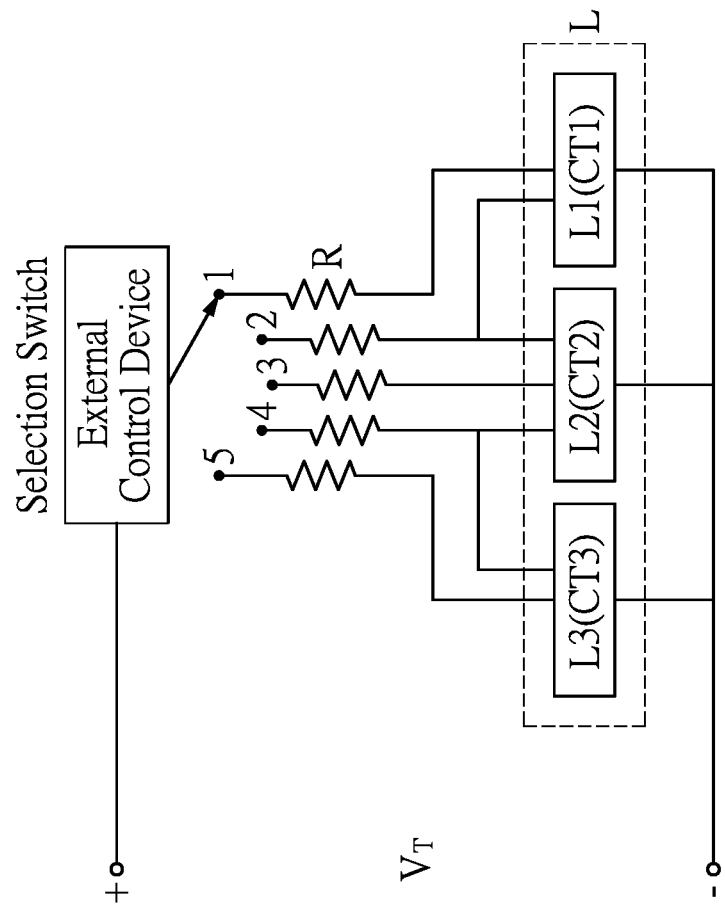

FIG. 16-2 is a schematic diagram of another color temperature tuning circuitry being identical to FIG. 13-2 in terms of circuit structure except the two LED loads are designed with two different light color temperatures namely CT1 and CT2 to operate a color temperature tuning scheme with two different diffused light color temperature performances.

Figures 3, 13:
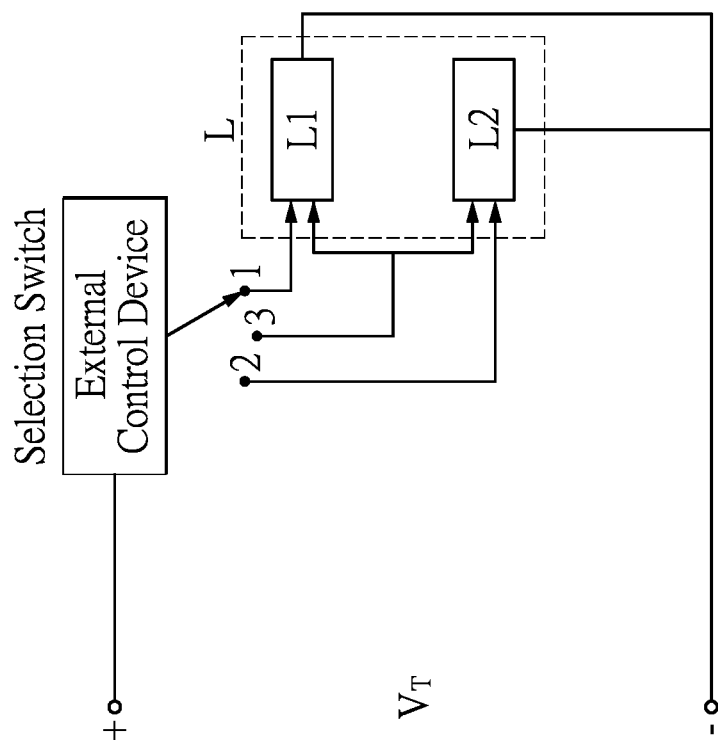
Figures 4, 13:
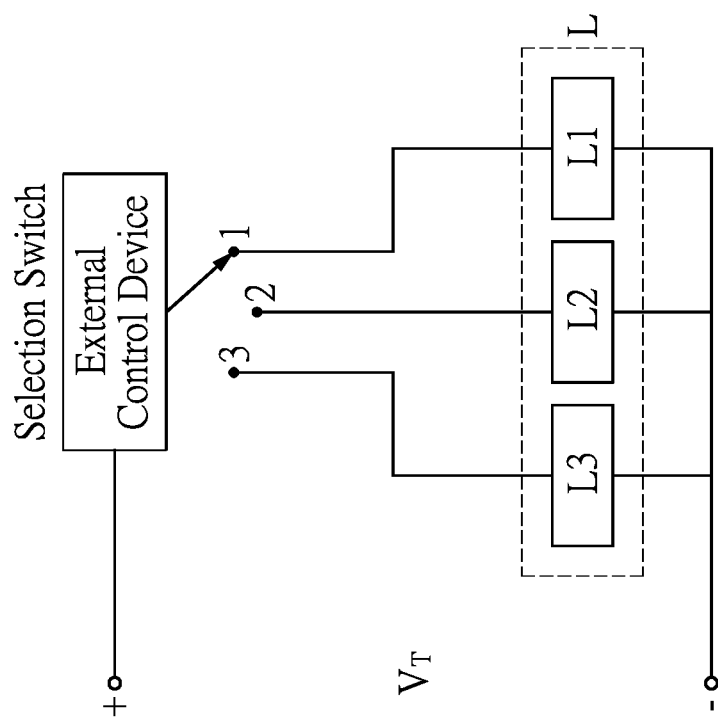
Figures 5, 13:
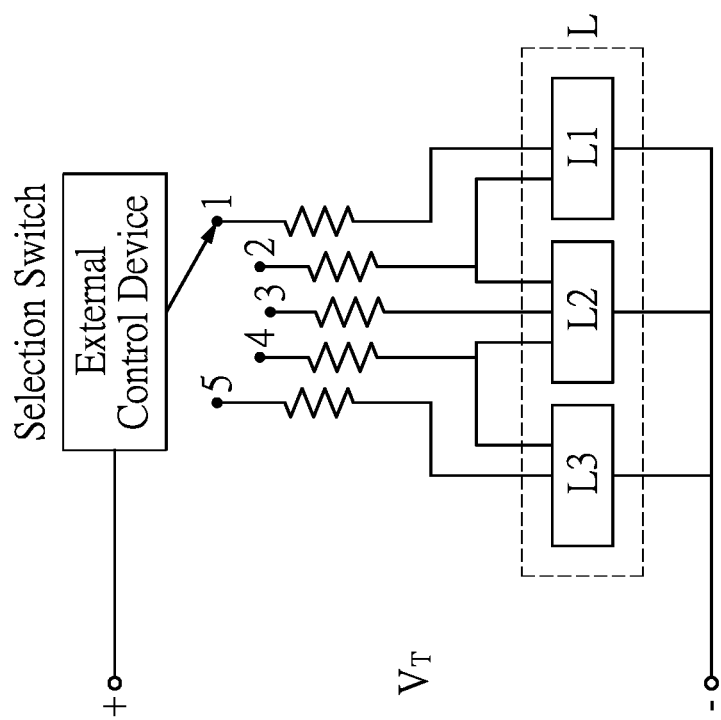

FIG. 16-3 is a schematic diagram of another color temperature tuning circuitry being identical to FIG. 13-3 in terms of circuit structure except the two LED loads are designed with two different light color temperatures CT1 and CT2 to operate a color temperature tuning scheme with three different diffused light color temperature performances.

Figure 4:
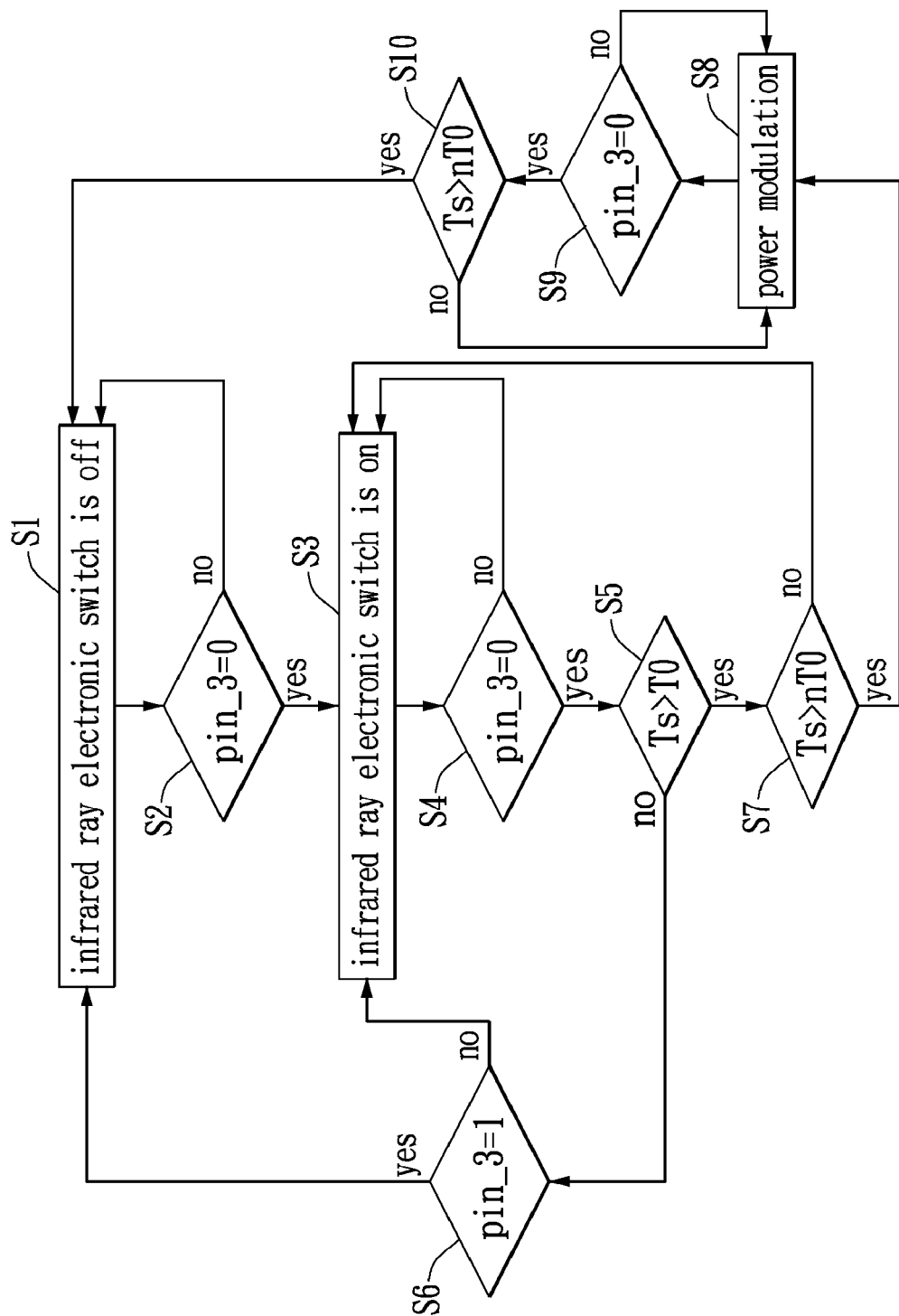
FIG. 4 is a flow chart of a program executed in a microcontroller based electronic switch according to an exemplary embodiment of the present disclosure.

FIG. 16-4 is a schematic diagram of another color temperature tuning circuitry being identical to FIG. 13-4 in terms of circuit structure except the three LED loads are designed with three different light color temperatures CT1, CT2 and CT3 to operate a color temperature tuning scheme with three different diffused light color temperature performances.

Figure 5:
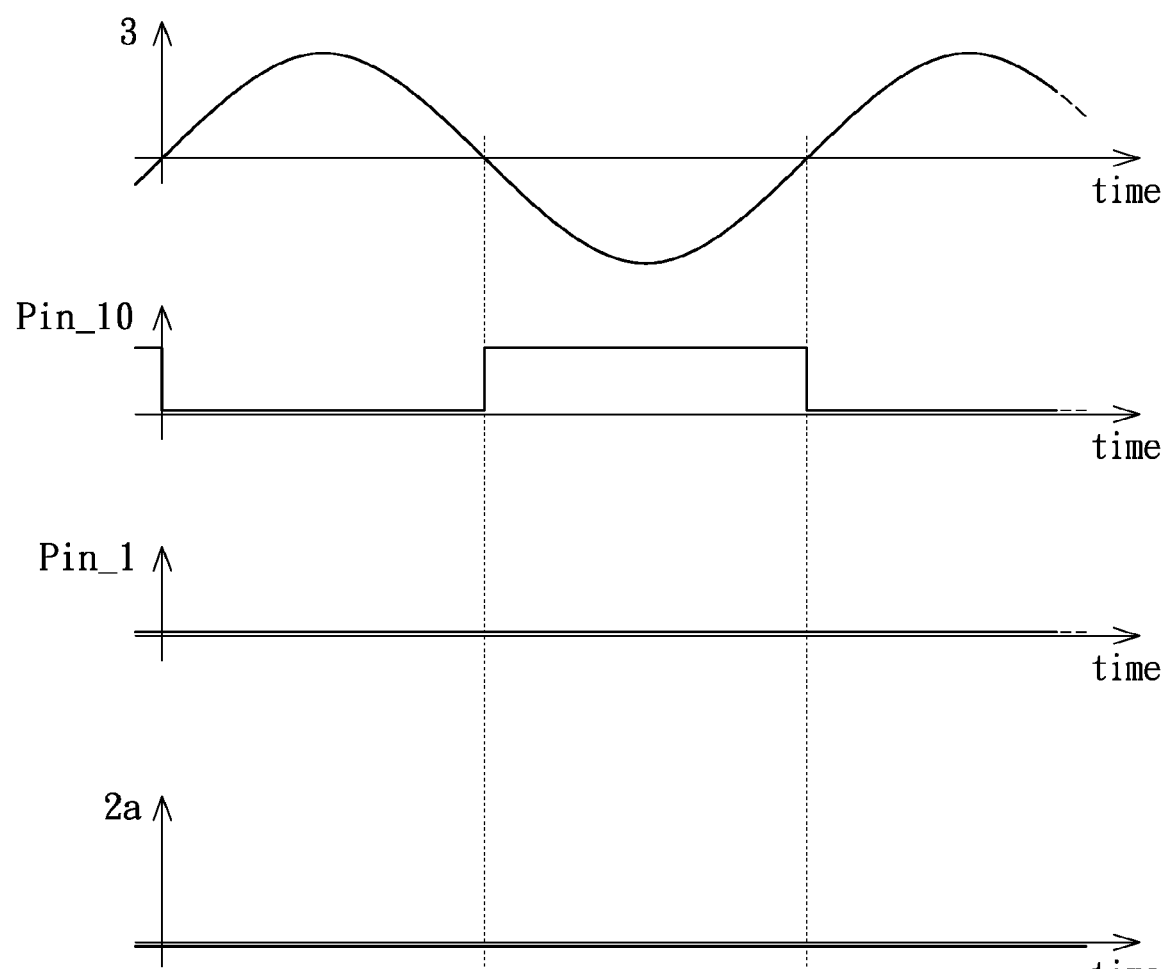
FIG. 5 is a voltage waveform diagram of a microcontroller based electronic switch when the electronic switch operating in the on/off switch control mode is in cut-off state according to an exemplary embodiment of the present disclosure.

FIG. 16-5 is a schematic diagram of another color temperature tuning circuitry being identical to FIG. 13-5 in terms of circuit structure except the three LED loads are designed with three different light color temperatures CT1, CT2 and CT3 to operate a color temperature tuning scheme with five different diffused light color temperature performances.

Figure 14:
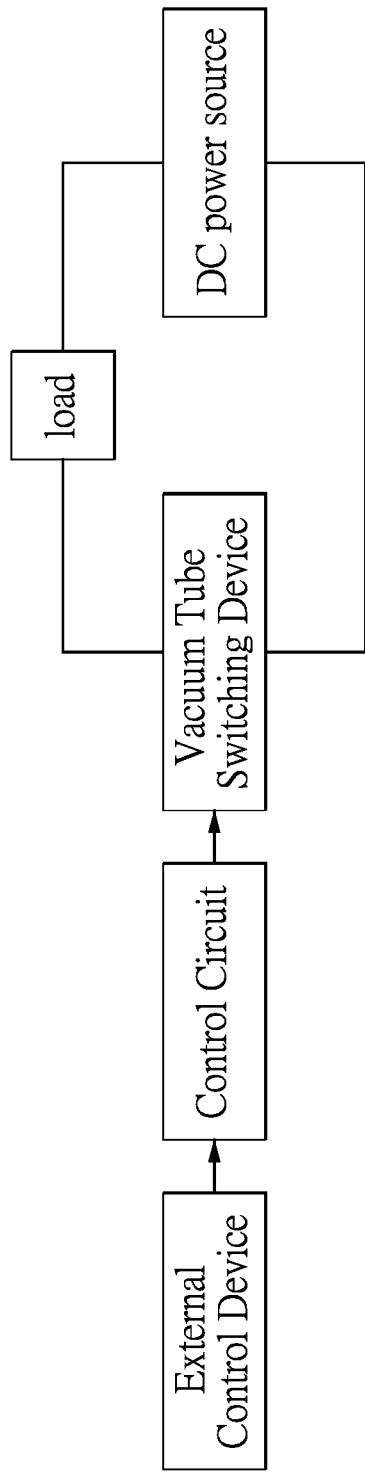
FIG. 14 is a block diagram of a power allocation circuitry configured with an electronic switch of vacuum tube working in conjunction with a control circuit to control a conduction rate of the vacuum tube for dimming a light intensity of the light-emitting unit.
Figure 17:
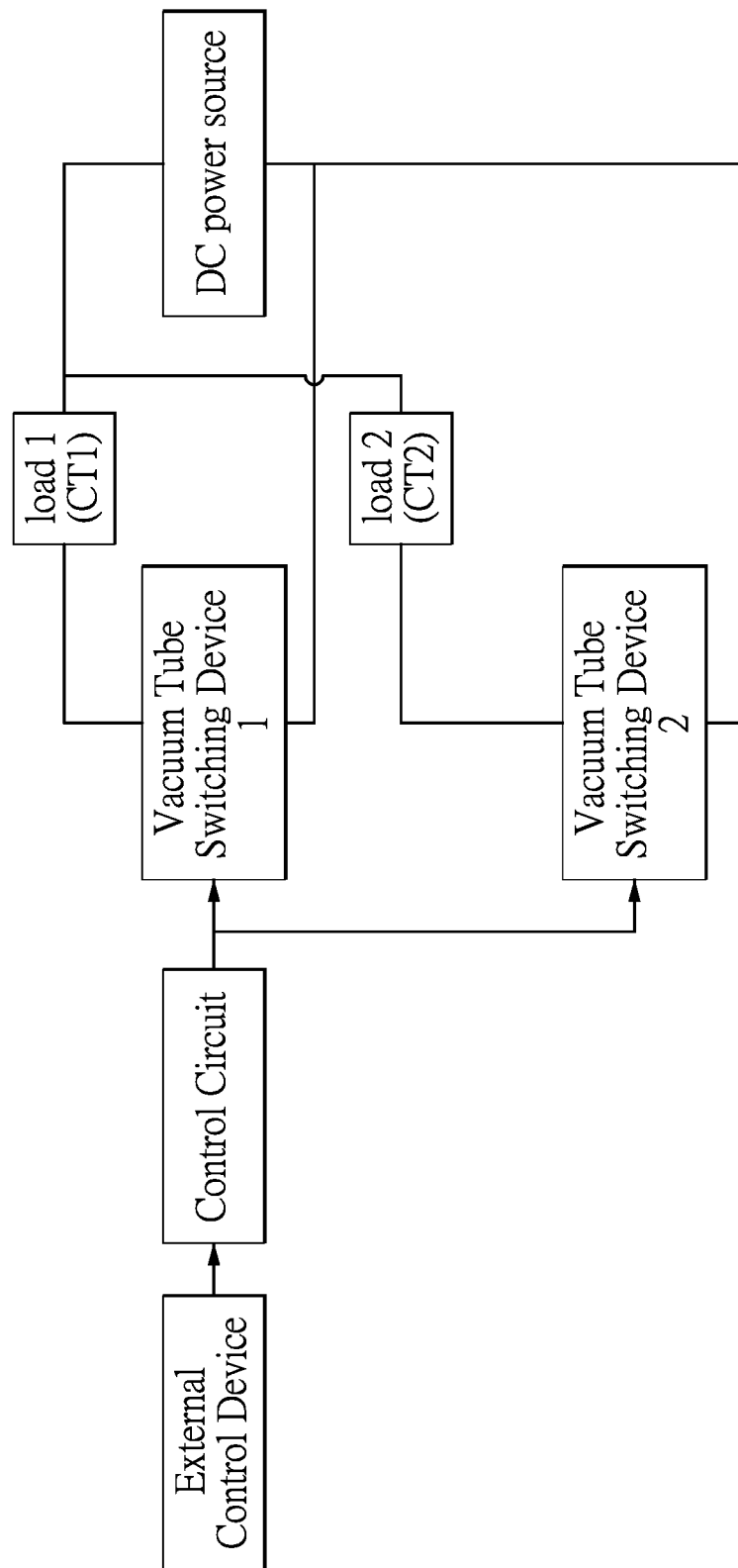

FIG. 17 is a block diagram of a color temperature tuning circuitry configured with two reversely operated dimming circuitries of FIG. 14 for operating a color temperature tuning scheme comprising a plurality of different diffused light color temperatures.

Figure 15:
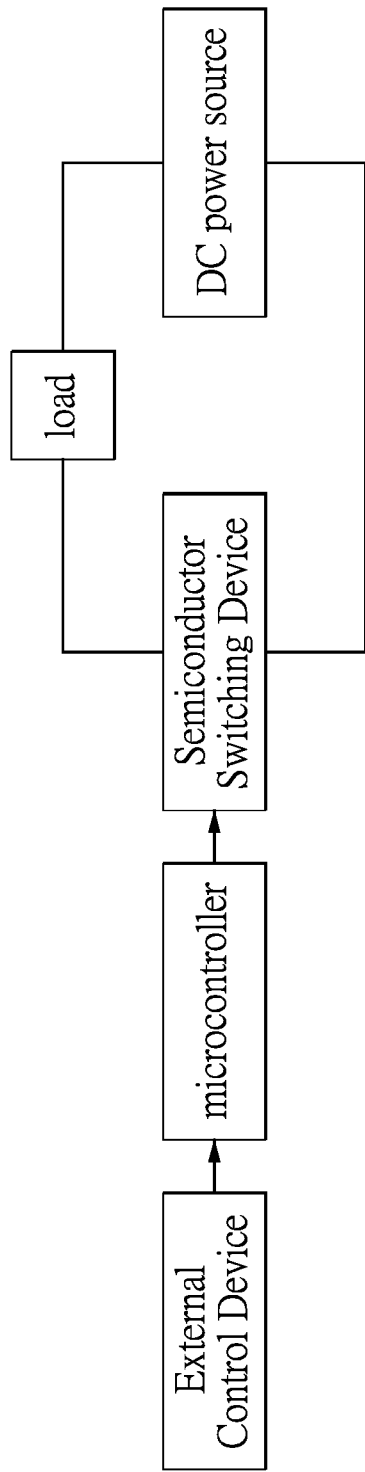
FIG. 15 is a block diagram of a power allocation circuitry configured with an electronic switch of a controllable semiconductor switching device working in conjunction with a microcontroller to control a conduction rate of the electronic switch for dimming a light intensity of the light-emitting unit.
Figure 18:
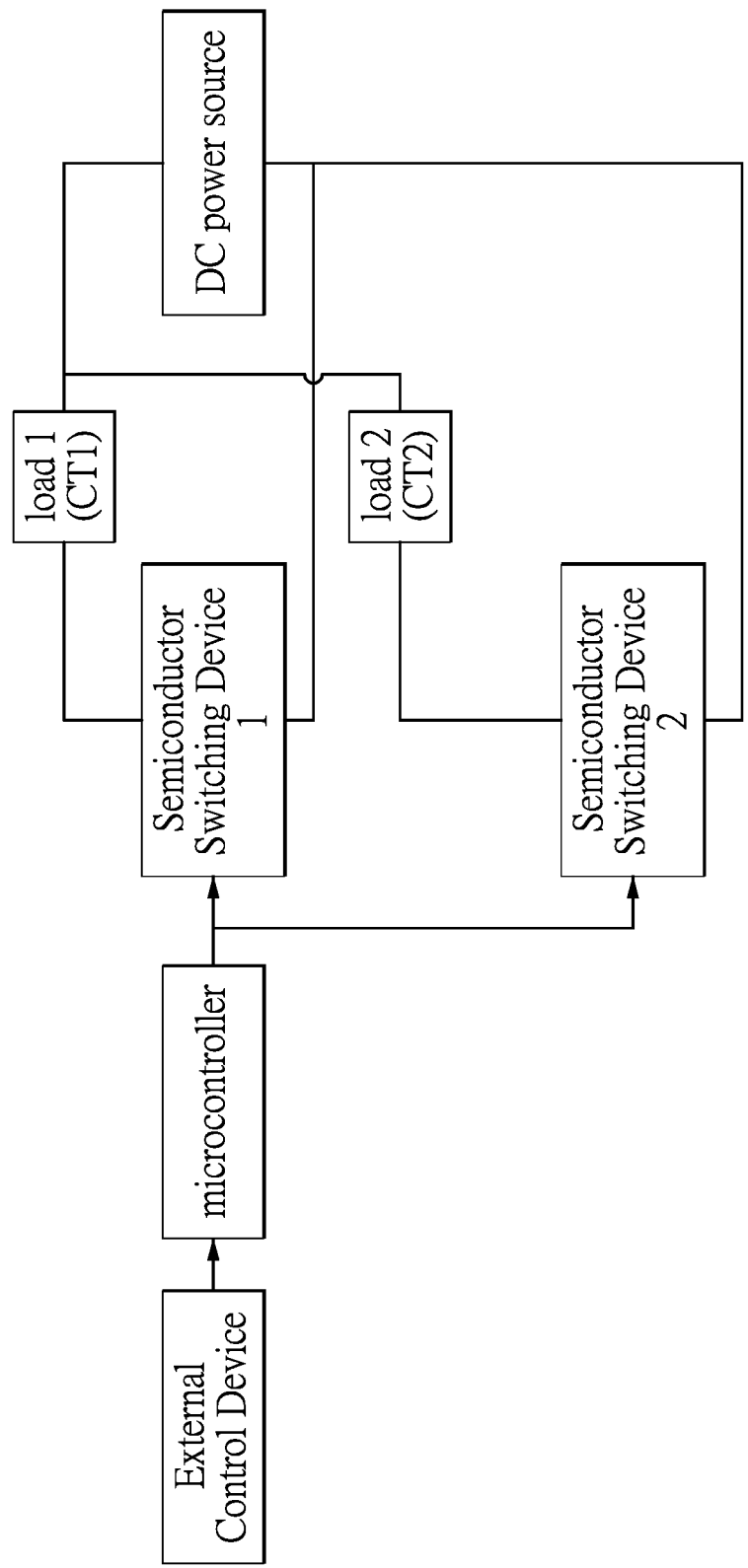

FIG. 18 is a block diagram of a color temperature tuning circuitry configured with two reversely operated dimming circuitries of FIG. 15 for operating a color temperature tuning scheme comprising a plurality of different diffused light color temperature performances.

DETAILED DESCRIPTION OF THE EXEMPLARY EMBODIMENTS

Referring to FIG. 1, FIG. 1 is a block diagram of a microcontroller based electronic switch using an infrared ray sensor as a detection device applied for two AC lighting loads with different color temperatures powered by an AC power source according to an exemplary embodiment of the present disclosure. A microcontroller based electronic switch 1 is connected in series to an AC power source 3, and is further connected to a first lighting load 2a (also indicated by "load a" shown in FIG. 1) and a second lighting load 2b (also indicated by "load b" shown in FIG. 1), so as to control AC power delivered to the first lighting load 2a and the second lighting load 2b. The microcontroller based electronic switch 1 comprises at least an infrared ray sensor 11, a microcontroller 12, a zero-crossing-point detector 13, and two bi-directional controllable semiconductor switching elements 14a, 14b. The bi-directional controllable semiconductor switching element 14a is a first controllable switching element. The bi-directional controllable semiconductor switching element 14b is a second controllable switching element. The infrared ray sensor 11 is connected to one pin of microcontroller 12 to transmit a low voltage sensing signal to the microcontroller 12, wherein the low voltage sensing signal represents a message carrying sensing signal of the infrared ray sensor 11. The zero-crossing-point detector 13 is connected to another pin of microcontroller 12 and is also electrically coupled to the AC power source 3 to produce AC power synchronized signals which are fed to the microcontroller 12. The microcontroller 12 through its one designated pin is electrically connected to the control electrode of the bi-directional controllable semiconductor switching element 14a so as using appropriate conduction phase (characterized by tD_a) to control the electrical conduction state of the bi-directional controllable semiconductor switching element 14a. Also, the microcontroller 12 through its another one designated pin is electrically connected to the control electrode of the bi-directional controllable semiconductor switching element 14b so as using appropriate conduction phase (characterized by tD_b) to control the electrical conduction state of the bi-directional controllable semiconductor switching element 14b.

The first lighting load 2a is for emitting light with low color temperature (first color temperature), and the second lighting load 2b is for emitting light with high color temperature (second color temperature). When the bi-directional controllable semiconductor switching elements 14a, 14b are in the conduction state, said microcontroller 12 further controls electric power levels transmitted from the AC power source 3 respectively to the first lighting load 2a and the second lighting load 2b according to the signal format of the message carrying sensing signal received from the infrared ray sensor 11. In this embodiment, the electric power level X allocated to the first lighting load 2a can vary from a minimum level to a maximum level, and at the same time the electric power level Y allocated to the second lighting load 2b can vary reversely and complementarily from the maximum level to the minimum level, such that the sum of X+Y is maintained at a constant value, but the present disclosure is not so restricted. An apparent color temperature generated by blending the lights emitted from the two lighting loads 2a, 2b may be controlled by the electric power levels X and Y according to $$CTapp=CT2a \cdot X/(X+Y)+CT2b \cdot Y/(X+Y),$$

where CTapp is said apparent color temperature, CT2a and CT2b are respectively the color temperatures of the first and the second lighting load 2a, 2b.

For example, the minimum level can be three watts and the maximum level can be nine watts, such that the electric power level X of the first lighting load 2a varies from three watts to nine watts, and simultaneously the electric power level Y of the second lighting load 2b varies from nine watts to three watts, wherein a total electric power of the first lighting load 2a and the second lighting load 2b can be fixed to twelve watts. When the color temperatures of the first lighting load 2a and the second lighting load 2b are respectively 3000K (CT2a) and 5700K (CT2b), the apparent color temperature (CTapp) of the blended or diffused light of the first lighting load 2a and the second lighting load 2b can vary nearly from 3700K (nine watts of the first lighting load 2a and three watts of the second lighting load 2b) to 5000K (three watts of the first lighting load 2a and nine watts of the second lighting load 2b) depending on the electric power levels fed to the first lighting load 2a and the second lighting load 2b controlled by the microcontroller 12. In another example, the minimum level can be zero watts and the maximum level can be twelve watts, such that the electric power level X of the first lighting load 2a varies from zero watts to twelve watts, and the electric power level Y of the second lighting load 2b varies from twelve watts to zero watts, wherein X+Y watt is fixed to twelve watts. When the color temperatures of the first lighting load 2a and the second lighting load 2b are respectively 3000K and 5700K, the apparent color temperature of the diffused light of the first lighting load 2a and the second lighting load 2b can vary from 3000K (twelve watts of the first lighting load 2a and no electric power of the second lighting load 2b) to 5700K (twelve watts of the second lighting load 2b and no electric power of the first lighting load 2a) depending on the electric power levels fed to the first lighting load 2a and the second lighting load 2b. Thus, a desired color temperature may be generated by controlling the electric power levels of the first lighting load 2a and the second lighting load 2b to create proper color blending effect under a fixed total electric power level with this type of microcontroller based electronic switch.

In still another embodiment, the electric power level X allocated to the first lighting load 2a can vary from a first minimum level to a first maximum level, and the electric power level Y allocated to the second lighting load 2b can vary from a second minimum level to a second maximum level, wherein the first minimum level, the first maximum level, the second minimum level and the second maximum level can be referred to different electric power levels. However, the present disclosure does not restrict the variation ranges of the power levels of the two loads 2a, 2b.

The infrared ray sensor 11 detects object motions coming from the user and converts the detected result into message carrying low voltage sensing signals readable to the microcontroller 12. The microcontroller 12 decodes the low voltage sensing signals (message carrying low voltage sensing signals) according to the program designed and written in its OTPROM (one-time programmable read only memory) memory. The microcontroller 12 is with program codes written and designed to read and interpret the message carrying sensing signal generated by the infrared ray sensor 11. The infrared ray sensor 11 is an exemplary embodiment for a detection device to detect the external motion signal played by the user and convert the external motion signal into a message carrying sensing signal. The microcontroller 12 recognizes the working mode that the user has chosen and proceeds to execute the corresponding loop of subroutine for performing the selected working mode. In view of implementing versatile controls of color temperature and illumination level of a lighting apparatus, at least two working modes are provided and defined in the software codes with corresponding loops of subroutine for execution.

One working mode is on/off switch control mode. In this working mode, according to the low voltage sensing signal from the infrared ray sensor 11, the microcontroller 12 operates the bi-directional controllable semiconductor switching element 14 in conduction state or cut-off state alternatively. More specifically, in this working mode, together with the zero-crossing-point detector 13, the microcontroller 12 generates phase delay voltage pulses synchronized with the AC power source 3 in each AC-half cycle to trigger the bi-directional controllable semiconductor switching elements 14a, 14b to be in proper conduction states to respectively transmit X-watt and Y-watt electric power to the first lighting load 2a and the second lighting load 2b, such that a fixed amount of total electric power (X+Y watts) is sent to the two lighting loads 2a, 2b; or the microcontroller 12 generates a zero voltage to set the bi-directional controllable semiconductor switching elements 14a, 14b to be in cut-off state, and thereby ceases to transmit the fixed electric power to the two lighting loads 2a, 2b.

Another working mode is switching between low color temperature and high color temperature. When the first switching element is in a full conduction state and the second switching element is in a full cutoff state, the light consequently demonstrates the low color temperature of illumination characteristic. When the first switching element is in the full cutoff state and the second switching element is in the full conduction state, the lighting apparatus consequently demonstrates the high color temperature of illumination characteristic.

Still another working mode is color temperature tuning mode about controlling different levels of electric power transmission to the two lighting loads 2a, 2b by controlling the conduction rate of the bi-directional controllable semiconductor switching elements 14a and 14b. Using the synchronized signals produced by the zero-crossing-point detector 13 as a reference, the microcontroller 12 generates phase delay voltage pulses synchronized with the AC power source 3 in each AC half-cycle to trigger the conduction of the bi-directional controllable semiconductor switching elements 14 to respectively transmit X-watt and Y-watt electric power to the first lighting load 2a and the second lighting load 2b. Responding to the low voltage sensing signals of specific format from the infrared ray sensor 11, the microcontroller 12 execute the corresponding loop of subroutine for performing the color temperature tuning mode, such that the phase delays of the triggering pulses are continuously changed during each half cycle period of the AC power source 3, to render the conduction rate of the bi-directional controllable semiconductor switching elements 14a gradually increasing and, at the same time, the conduction rate of the bi-directional controllable semiconductor switching elements 14b gradually decreasing, or vice versa. Consequently, the power level X of the lighting loads 2a is gradually increasing and the power level Y of the lighting loads 2b is gradually decreasing, or vice versa. The color temperature of the blended or diffused light of the two lighting load 2a, 2b may thus be adjusted in the color temperature tuning mode through controlling the conduction rate of the switching elements 14a, 14b to change the power levels of the two lighting loads 2a, 2b. At the end of the color temperature tuning mode, a desired apparent color temperature diffused from the two lighting loads 2a, 2b can be set and managed by the message carrying sensing signal from the infrared ray sensor 11 which is generated according to the user's intention.

For the color temperature tuning mode, additional sub-modes can be performed in detail. When the detection device generates the first voltage sensing signal, said microcontroller manages to output the control signal to the first controllable switching element and the second controllable switching element to alternately perform one of programmed combinations of conduction states between the first controllable switching element and the second controllable switching element, wherein the combinations include at least three combination modes; wherein the first combination mode is where the first controllable switching element is in a complete conduction state while the second controllable switching element is in a cutoff state with the lighting apparatus performing the low color temperature, wherein the second combination mode is where the first controllable switching element is in a cutoff state while the second controllable switching element is in a complete conduction state with the lighting apparatus performing the high color temperature, wherein the third combination mode is where both the first controllable switching element and the second controllable switching element are in cutoff state with the lighting apparatus being turned off.

Referring to FIG. 1 and FIG. 2, FIG. 2 is a circuit diagram of a microcontroller based electronic switch applied for an AC power source according to an exemplary embodiment of the present disclosure.

As FIG. 2 shows, the microcontroller based electronic switch 1 comprises an infrared ray sensor 11, a microcontroller 12, a zero-crossing-point detector 13, and two bi-directional controllable semiconductor switching elements 14a, 14b. The microcontroller based electronic switch 1 is connected respectively through the bi-directional controllable semiconductor switching elements 14a, 14b with the first lighting load 2a and the second lighting load 2b, both have different color temperatures, and then connected to the AC power source 3 in a serial fashion. A DC voltage VDD for the circuit system is derived by conventional voltage reduction and rectification from the AC power 3. The infrared ray sensor 11 is composed of a transmitting circuit and a receiving circuit, wherein the message carrying sensing signal is sent out by a transistor stage M2. The drain of the transistor M2 is connected to a pin pin_3 of the microcontroller 12 to deliver the message carrying sensing signals to the microcontroller 12.

The zero-crossing-point detector 13 is composed of a transistor Q1 and a diode D3. The collector of the transistor Q1 is connected to a pin pin_10 of the microcontroller 12, the base of the transistor Q1 is connected to a conducting wire of the AC power source 3 through the diode D3 and a resistor R3. In the positive half-cycle for AC power source 3, the transistor Q1 is saturated conducting, and the voltage at the collector of the transistor Q1 is close to zero. In the negative half-cycle for AC power source 3, the transistor Q1 is cut-off, and the voltage at the collector of the transistor Q1 is a high voltage of VDD. Corresponding to the sine wave of the AC power source 3, the zero-crossing-point detector 13 generates therefore signals of square wave alternatively with a low voltage and a high voltage through the collector of the transistor Q1. The square wave is synchronized with the AC power source 3 and sent to a pin pin_10 of the microcontroller 12 for the purpose of controlling conduction phase, and the details thereof are described later. In practice, the bi-directional controllable semiconductor switching element 14a can be a triac T1a, the pin pin_1 of the microcontroller 12 is connected to the gate of the triac T1a to control the conduction or cut-off state of the triac T1a, or to control the conduction rate of the triac T1a. Also, the bi-directional controllable semiconductor switching element 14b can be a triac T1b, the pin pin_2 of the microcontroller 12 is connected to the gate of the triac T1b to control the conduction or cut-off state of the triac T1b, or to control the conduction rate of the triac T1b. Thus, the first lighting load 2a and the second lighting load 2b are respectively driven by triac T1a and triac T1b with phase delay pulses characterized by time delays tD_a and tD_b with respect to the zero crossing point of AC power voltage in each AC half-cycle to respectively display X-watt (or Y-watt) lighting from the first lighting load 2a and Y-watt (or X-watt) power lighting from the second lighting load 2b controlled by infrared ray sensor 11. Thus, the color temperature of the diffused light of the two lighting load 2a, 2b may be adjusted by properly selecting tD_a and tD_b, such that the summation of tD_a and tD_b is a constant, and the total lighting power of the first lighting load 2a (X) and the second lighting load 2b (Y), X+Y, is a fixed value.

Still referring to FIG. 2, the infrared ray sensor 11 comprises a transmitting circuit and a receiving circuit. In the transmitting circuit, an infrared light-emitting diode IR_LED is connected to the drain of the transistor M1 in a serial fashion, and the gate of the transistor M1 is connected to an output of the timer 110. In practice, the timer 110 can be a 555 timer IC. The 555 timer IC generates a square-wave with a frequency of about 3 kHz to modulate the drain current of the transistor M1, such that the infrared light-emitting diode IR_LED provides an infrared light signal with a square wave form which is severed as the light source of the infrared ray sensor.

The receiving circuit is an infrared light detection circuit and comprises a photosensitive diode PD, two serially connected amplifiers 112, 114, and a transistor M2. The drain of the transistor M2 is connected to a pin pin_3 of the microcontroller 12. In practice, the amplifiers 112 and 114 can be LM324 operational amplifier. The combination of the amplifier 114 and resistors R7 through R10 is a Schmitt trigger circuit having a threshold voltage, and the threshold voltage is produced by the voltage divider composed by resistors R8 and R9. The Schmitt trigger circuit makes possible a high discrimination of a true detection to a false one.

The photosensitive diode PD is used to receive the infrared light signal from the transmitting circuit. If the output voltage of the amplifier 112 exceeds the threshold voltage, the amplifier 114 produces a high voltage applied to the gate of the transistor M2, such that the transistor M2 is turned on. Therefore, the drain of the transistor M2 provides a low voltage sensing signal which is close to zero voltage, and the time length of the low voltage sensing signal is related to the time period the infrared ray is detected.

In addition, if the photosensitive diode PD does not receive the infrared light signal, the output voltage of the amplifier 112 is lower than the threshold voltage, and then the amplifier 114 provides a low voltage to the gate of the transistor M2, such that the transistor M2 is turned off. Therefore, the drain of the transistor M2 provides a high voltage of VDD. In other words, the pin pin_3 of the microcontroller 12 receives either a low voltage sensing signal or a high voltage depending on whether the infrared ray sensor 11 detects the infrared light or not, wherein the time length of the low voltage sensing signal is about the time period within which the infrared light is detected.

In other words, the infrared ray sensor 11 generates a sensing signal which is characterized by a low voltage within a time length. The sensing signal with a specific time length of low voltage can be considered as a sensing signal format which carries message to make the microcontroller 12 to operate in one of at least two working modes accordingly, wherein one working mode is on/off switch control mode and the another one is color temperature tuning mode to control the conduction rate of the bi-directional controllable semiconductor switching elements 14a and 14b. Further, still another mode is dimming control mode. The color temperature tuning mode can give a color temperature tuning cycle to change the color temperature of the blended light, wherein the total power of the blended light is unchanged (X+Y watts is unchanged during the cycle). The dimming control mode provides dimming cycles to set the total power of the blended light (X+Y watts is changed during the cycle), wherein the color temperature of the blended light is unchanged during the dimming cycle.

Figure 3B:
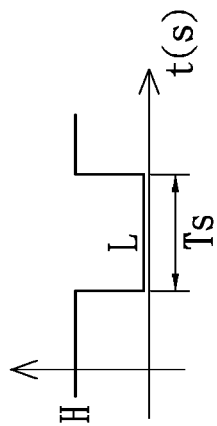
FIG. 3B is a waveform diagram showing a low voltage sensing signal according to an exemplary embodiment of the present disclosure.
Figure 3A:
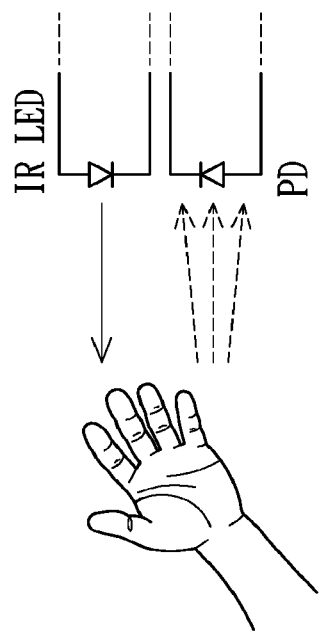
FIG. 3A is a schematic diagram showing a practical operation of an infrared ray sensor associated with a microcontroller based electronic switch according to an exemplary embodiment of the present disclosure.

Referring to FIG. 2, FIG. 3A and FIG. 3B, FIG. 3A is a schematic diagram showing a practical operation of an infrared ray sensor associated with a microcontroller based electronic switch according to an exemplary embodiment of the present disclosure, and FIG. 3B is a waveform diagram showing a low voltage sensing signal according to an exemplary embodiment of the present disclosure. In FIG. 3A, the infrared light-emitting diode IR_LED is parallel arranged to the photosensitive diode PD without accurate alignment. When an object, here is a human hand, moves in front of the infrared light-emitting diode IR_LED, the infrared light emitted from the infrared light-emitting diode IR_LED scatters from the object surface onto the photo sensing surface of the photosensitive diode PD.

FIG. 3B shows a waveform of the low voltage sensing signal provided from the infrared ray sensor 11. If the photosensitive diode PD does not receive the infrared light scattered from the target object surface, or the intensity of the infrared light received by the photosensitive diode PD is insufficient, the drain of the transistor M2 provides a high voltage H of VDD. Within an appropriate distance, the photosensitive diode PD receives the infrared light scattered from the object surface, and the intensity of the received infrared light is enough to cause the output voltage of the amplifier 112 exceeding the threshold voltage, the amplifier 114 produces a high voltage, such that the transistor M2 is turned on, and the drain of the transistor M2 provides a signal with a low voltage L of about zero volt. In other words, when the infrared ray sensor 11 detects an object, most commonly user's hand, purposefully entering the infrared ray detecting zone, the infrared ray sensor 11 generates a low voltage sensing signal, by contrast when an object is not within the infrared ray detecting zone, the infrared ray sensor 11 generates a high voltage. In brief, the infrared ray sensor 11 comprises a means for emitting infrared light to form the defined infrared ray detecting zone, and a means for detecting infrared light reflected from the object moving into the infrared ray detecting zone.

The appropriate distance or the infrared ray detecting zone is defined as an effective sensing range or area of the infrared ray sensor 11. In FIG. 3B, the time length Ts of the low voltage L is approximately equal to the time period that an object stays within the infrared ray detecting zone, wherein the time period is about a few tenths through a few seconds. When the object leaves the infrared ray detecting zone, the signal delivered from the infrared ray sensor 11 changes from a low voltage L to a high voltage H, as shown in FIG. 3B. Hence the sensing signal generated from the infrared ray sensor 11 is a binary signal readable to the program written in the OTPROM memory of the microcontroller 12. The microcontroller based electronic switch 1 utilizes specific sensing signal format characterized by the time length Ts of the low voltage sensing signal to implement at least two functions, namely, on/off switch control and dimming control. By introducing a preset time To, the microcontroller 12 can execute subroutine corresponding to the functions of the on/off switch control, the color temperature tuning control and the illumination power dimming control determined by a comparison scheme of the time length Ts with the preset time To. The user can therefore operates the microcontroller-based electronic switch 1 in a convenient manner simply by moving his hand into or out of the infrared ray detecting zone of the infrared ray sensor 11, and staying his hand there for a time period to select desired performance function.

Referring to FIG. 2, FIG. 3A, FIG. 3B and FIG. 4, FIG. 4 is a flow chart of a program executed in a microcontroller of a microcontroller based electronic switch according to an exemplary embodiment of the present disclosure. The program written in the OTPROM memory of the microcontroller 12 includes several subroutine loops. These loops are started from the loop of steps S1 through S6 of the on/off switch control mode, and may jump into the loop of steps S8 through S10 of the color temperature tuning mode (or the dimming control mode) according to the time length Ts of the low voltage sensing signal. The pin pin_3 of the microcontroller 12 receives a high voltage H or a low voltage L from the infrared ray sensor 11, wherein the time length Ts of the low voltage sensing signal is about the time length which the user's hand stays within the infrared ray detecting zone.

The program of the microcontroller 12 starts its execution from the loop of steps S1 and S2 in which the microcontroller based electronic switch 1 is off. The program of the microcontroller 12 scans the voltage at the pin pin_3 of the microcontroller 12. If the voltage at the pin pin_3 of the microcontroller 12 is high (bit 1), the program of the microcontroller 12 stays in the loop of steps S1 and S2 that the microcontroller based electronic switch 1 is off. On the contrary, if the voltage at the pin pin_3 is low (bit 0), the program of the microcontroller 12 jumps into the loop of steps S3 through S6 in which the microcontroller based electronic switch 1 is on. At step S4 when the microcontroller based electronic switch 1 is on, the program of the microcontroller 12 scans the voltage at the pin pin_3 of the microcontroller 12. If the voltage at the pin pin_3 of the microcontroller 12 is low (bit 0), the program of the microcontroller 12 jumps to step S5 to compare the time length Ts with a preset time To. In practice, the preset time To is between 1 through 3 seconds, but the present disclosure is not limited thereto.

At step S5, the program of the microcontroller 12 check the time length Ts, if Ts is shorter than the preset time To, step S5 proceeds to step S6 to detect whether the voltage at the pin pin_3 is momentary a high voltage H (bit 1). At step S6, if the voltage at the pin pin_3 is the voltage H, the program goes back to the loop of steps S1 and S2 in which the microcontroller based electronic switch 1 is off. At step S6, if the voltage at the pin pin_3 is low, the program remains in the loop of steps S3 through S6 in which the microcontroller based electronic switch 1 is on.

To sum up, the on/off switch control mode is described by the loops consisting of steps S1 through S6 that the microcontroller based electronic switch 1 is operated in off- and on-state rotationally. The microcontroller based electronic switch 1 is on or off according to whether the user moves his hand into and then pulls out the infrared ray detecting zone of the infrared ray sensor 11 within the preset time To.

At step S5, the program of the microcontroller 12 check the time length Ts, if the time length Ts is longer than the preset time To, the program jumps to step S7 to detect whether the time length Ts is longer than n times the preset time To (n≥2). At step S7, if the time length Ts is not longer than n times the preset time To, the program goes back to the loop of steps S3 through S6 that the microcontroller based electronic switch 1 remains on. At step S7, if the time length Ts is longer than n times the preset time To, the program jumps into a loop consisting of steps S8 through S10 to execute a subroutine for the color temperature tuning mode (or the dimming control mode) of microcontroller based electronic switch 1. FIG. 4 does not show the details of subroutine associated with the color temperature tuning mode (or the dimming control mode), but a process is described in short as follows. At step 9, the program of the microcontroller 12 scans the voltage at the pin pin_3 of the microcontroller 12. The program proceeds to step 10 from Step 9, if the voltage at the pin pin_3 is low. At step 10, the subroutine of the microcontroller 12 checks if Ts>nTo. If the voltage at the pin pin_3 is low for several times, and the time lengths denoted by Ts or Ts' are shorter than n times the preset time To, the subroutine remains in the rotation loop defined by step 8 through S10, and microcontroller 12 continuously increases or decreases the electric power transmission to the lighting loads 2a, 2b by controlling the conduction rates. If the electric power of the lighting load reaches the maximum or minimum electric power, the program of the microcontroller 12 responds no more to the low voltage sensing signal. At step 10, if the time length Ts is longer than n times the preset time To, the program of the microcontroller 12 jumps back to the loop of steps S1 and S2 in which the microcontroller based electronic switch 1 is off. Then, the program of the microcontroller 12 resumes itself from steps S1 and S2 in a rotational manner to execute the subroutines represented by the steps shown in FIG. 4.

In the exemplary embodiment of FIG. 2, the preset time To and the number n can be set 2 seconds and 2, respectively. Referring to the steps executed by the microcontroller 12 in FIG. 4, if the detected time length Ts of the low voltage sensing signal at the pin pin_3 is less than 2 seconds, that means the time period which the hand stays within the infrared ray detecting zone is less than 2 seconds, the microcontroller 12 remains in the current function mode. If the detected time length Ts at the pin pin_3 is longer than 4 seconds, that means the time length which the hand stays within the infrared ray detecting zone is longer than 4 seconds, the microcontroller 12 changes the current function mode to another one function mode. In other words, if the time length Ts of the low voltage sensing signal is shorter than the preset time To, the microcontroller 12 operates either in on/off switch control mode or in color temperature tuning mode (or dimming control mode). If the detected time length Ts of the low voltage sensing signal is longer than n times the preset time To, the microcontroller 12 changes its program execution from the on/off switch control mode into the color temperature tuning mode (or the dimming control mode) and vice versa.

In another embodiment, the concept of the present disclosure can be further extended to implement a multifunctional electronic switch having at least three functions built in one, which are on/off switch control, illumination dimming control and color temperature management. The program written in the OTPROM memory of the microcontroller can be modified in such a manner that the microcontroller responds not only to the low voltage sensing signal of the infrared ray sensor, but also to a specific sequence of the sensing signals. The microcontroller executes subroutines of working modes corresponding to the said three functions according to the detected time length Ts and special sequence of the low voltage sensing signals. The first working mode is on/off switch control mode used to control the conduction or cut-off state of the controllable semiconductor switching elements. The second working mode is dimming control mode used to control the conduction rates of the controllable semiconductor switching elements. The third working mode is color temperature management mode used to change alternatively from a high color temperature to a low one, or vice versa, or to tune the color temperature of the diffused light from two lighting loads. When the infrared ray sensor generates a low voltage sensing signal within the preset time To, the microcontroller operates in the on/off switch control mode by controlling the conduction or cut-off state of both the controllable semiconductor switching elements alternately. If the time length Ts of the low voltage sensing signal is longer than n times the preset time To, the microcontroller changes its operation from the on/off switch control mode to the color temperature tuning or dimming control mode. Once in the dimming (tuning) control mode, the microcontroller executes subroutine to gradually change the conduction rates of the controllable semiconductor switching elements from the maximum conduction rate to the minimum conduction rate, and then to gradually change the conduction rate from the minimum conduction rate to the maximum conduction rate for completing a dimming cycle wherein the process is a free run. In the dimming cycle with free run, the moment when the infrared ray sensor provides a high voltage is a dimming end point. According to the dimming control mode design, the microcontroller locks the conduction rates of the controllable semiconductor switching elements at the dimming end point. Thereafter, if the infrared ray sensor generates a plurality of low voltage sensing signals, for instance, a plural signal of two consecutive sensing signals, each within the preset time To, the microcontroller operates in the color temperature management mode by executing a subroutine to select a color temperature of the diffused light from two lighting loads through controlling different power levels delivered to the two lighting loads of different color temperatures. It is clear to see the advantage of the present disclosure to integrate various switch control functions in one without changing the hardware circuit design. All are simply done by defining the format of sensing signals and by modifying the program written in the OTPROM memory in the microcontroller.

As mentioned above, various switch control functions can be integrated in one without changing the hardware circuit design of the microcontroller and the two loads. There may be variations of detection device in using electronic switch of the present disclosure for touch and touchless applications. For example, (1) Dual detection device technology in which two detection device are integrated in one electronic switch, for instance, by connecting two infrared ray sensors respectively with two pins of the microcontroller 12 in FIG. 1, to control a lighting apparatus: one first detection device sending message carrying sensing signal to control the color temperature of illumination characteristic, one second detection device sending message carrying sensing signal to control the light intensity of illumination characteristic; (2) Single detection device technology in which one detection device is built in an electronic switch to generate message carrying sensing signal to control a lighting apparatus by using different types of signal formats: a first type sensing signal (for instance, a low voltage within a short preset time TO) to control the on/off performance, a second type sensing signal (for instance, a low voltage with a long time length Ts) for dimming the light intensity of illumination characteristics, and a third type sensing signal (for instance, a plural signals of two consecutive low voltages) for controlling the switching between a low color temperature mode and a high color temperature mode; (3) Single detection device technology using free running technique in response to a specific format sensing signal to offer selection of color temperature.

The free running subroutine can be designed to apply to an electronic switch installed on wall for managing the illumination characteristics of a remotely located lighting apparatus such as a ceiling light installed on the ceiling. Unless a wireless communication unit is employed, a typical wall switch is constrained by a single circuit to only perform one illumination characteristic, being either controlling the light intensity or controlling the color temperature. If both the color temperature and light intensity are required to manage, the only way is to use the free running technology to execute one of the two illumination characteristics. The free running subroutine can be so deigned such that whenever a power supply is on, the microcontroller with software subroutine will check the memory unit to see if a preset color temperature or light intensity is established to decide if the free running subroutine needs to be activated, in the absence of preset datum, a free running action will be activated to gradually change the lighting intensity from maximum intensity to minimum intensity and continuously from minimum intensity to maximum intensity for completing a tuning/dimming cycle on an automatic basis and at any moment during a tuning/dimming cycle the user can determine the light intensity by acting a motion signal to lock in the level of the light intensity. The automatic tuning/dimming only continues for a short duration and in the absence of selection by the user, the microcontroller with program codes will execute a predetermined lighting intensity. Similarly, the same mechanism can be applied for tuning the color temperature to allow the user to select the desired color temperature during a free tuning cycle by acting a motion signal with the detection device to lock in the desired level of color temperature. With the help of free running technology, the wall control unit can therefore be used solely for operating the remaining illumination characteristic.

The concept of free running technology can be further applied to develop a life style LED lighting solution where the color temperature is gradually changed according to time schedule programmed for performing different color temperature catering to the living style of human beings that people are more used to low color temperature with a warm atmosphere during the night time from 7 PM through 5 AM while during the day time people are more used to the high color temperature for working hours. A clock can be employed to provide the time information necessary for working with a program of scheduled color temperature pattern. A conduction rate r1 of a first controllable switching device can be varied in a reverse direction with respect to a conduction rate r2 of a second controllable switching device, the microcontroller with program codes executes to vary the conduction rate of the first controllable switching device according to a programmed pattern of color temperature changes in a subroutine; when r1 is equal to zero, the first controllable switching device is in a cutoff state while the second controllable switching device is in a full conduction state, the lighting apparatus performs a high color temperature, 5000K for instance, which may be the desired color temperature for the noon time, when r1 is maximum, the first controllable switching device is in a full conduction state while the second controllable switching device is in a cutoff state, the lighting apparatus performs a low color temperature, 3000K for instance, which may be the desired color temperature for the night time from 7 PM to 5 AM. A single color temperature may be assigned for night period from 7 PM through 5 AM for the sleeping time. For day time it can be programmed to gradually change the values of r1 and r2 from maximum to 0 between AM to 12 PM and from 0 to maximum between 12 PM to 7 PM. With such arrangement at any time when the power is turned on the lighting apparatus automatically performs a desired color temperature according to the programmed pattern of color temperature at scheduled time frame.

Figure 6:
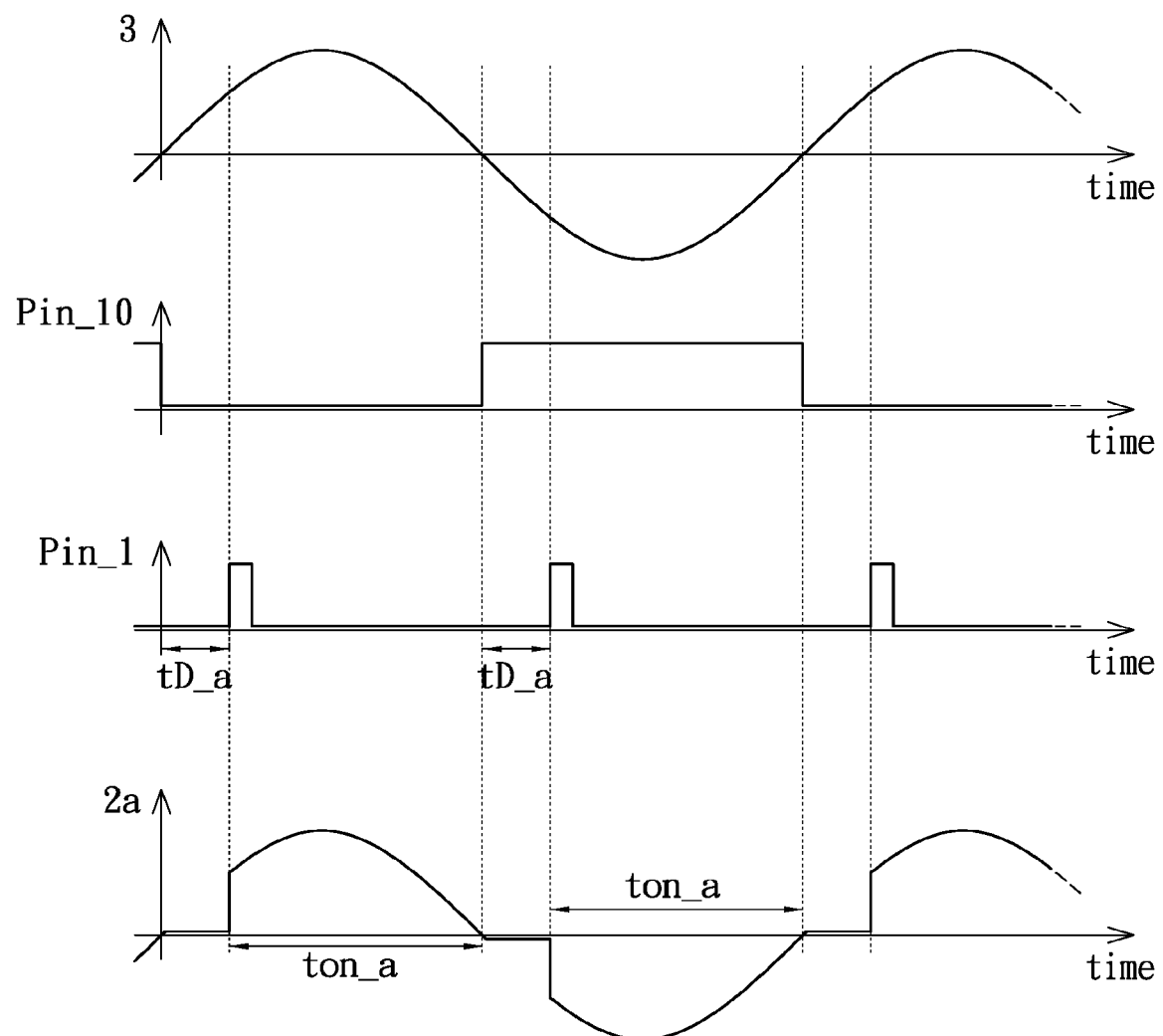
FIG. 6 is a voltage waveform diagram of a microcontroller based electronic switch when the electronic switch operating in the on/off switch control mode is in conduction state according to an exemplary embodiment of the present disclosure.
Figure 7:
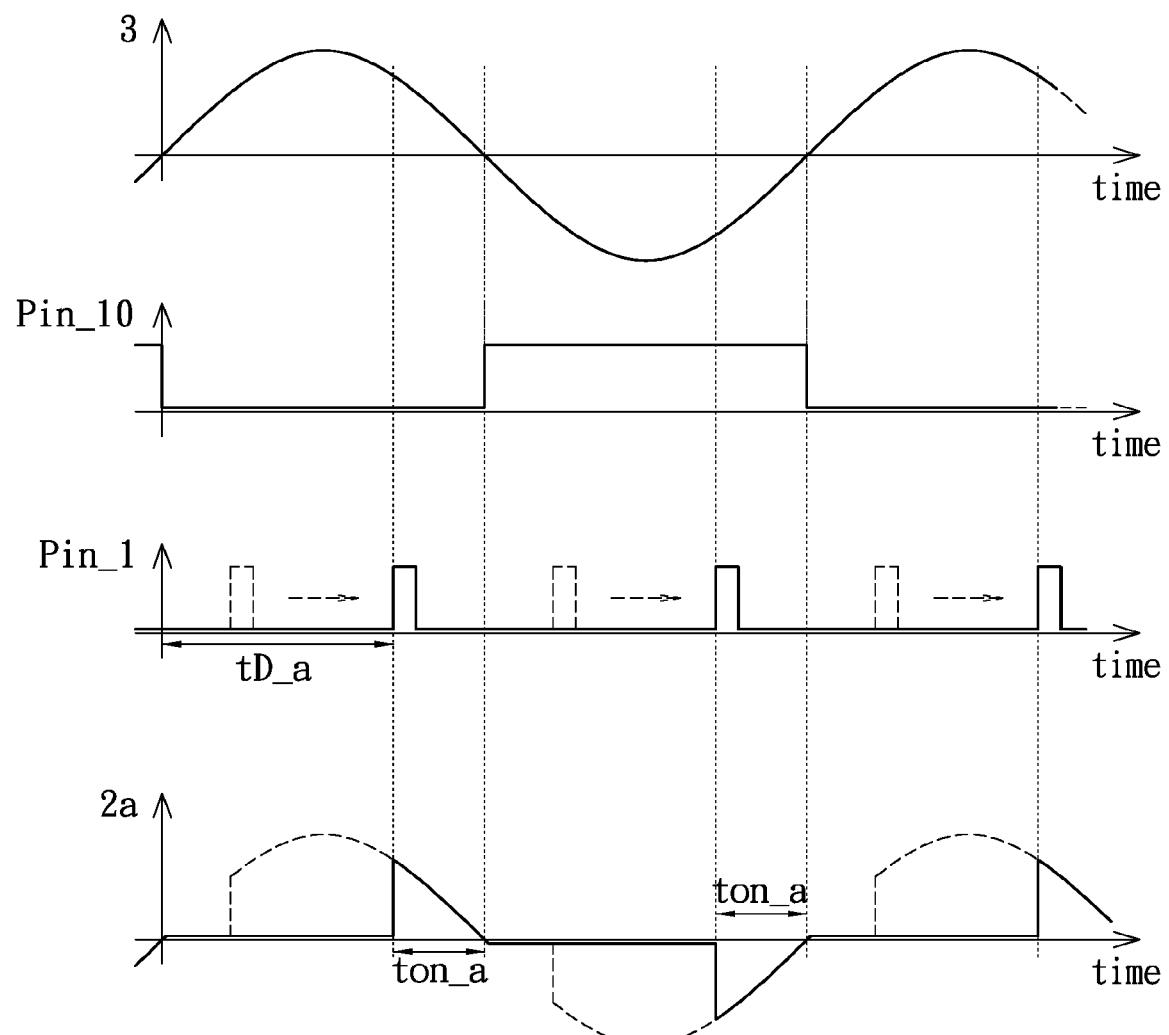
FIG. 7 is a voltage waveform diagram of a microcontroller based electronic switch operating in the dimming control mode according to an exemplary embodiment of the present disclosure.

Refer to FIG. 5, FIG. 6 and FIG. 7 in accompanying FIG. 2 and FIG. 4. According to an exemplary embodiment of the present disclosure, FIG. 5 is a voltage waveform diagram of a microcontroller based electronic switch in cut-off state when operating in on/off switch control mode, FIG. 6 is a voltage waveform diagram of a microcontroller based electronic switch in conduction state when operating in on/off switch control mode, and FIG. 7 is a voltage waveform diagram of a microcontroller based electronic switch when operating in dimming control mode. In FIG. 5, FIG. 6, and FIG. 7, the voltage waveforms as shown from the top are, respectively, a sine wave output from the AC power source 3, an output signal of the zero-crossing-point detector 13 that is fed to pin pin_10 of the microcontroller 12, an output signal from the pin pin_1 of the microcontroller 12, and a voltage waveform between the two ends of the load 2a. The voltage waveforms are used to describe the interactions related to the program of the microcontroller 12 and the microcontroller based electronic switch 1 in the above mentioned two working modes. As already described above, the voltage signal generated by the zero-crossing-point detector 13 is a square wave with a low and a high voltage, which is fed to the pin pin_10 of the microcontroller 12 and, to be explained later, served as an external interrupt trigger signal. The voltage signal from the pin pin_1 of the microcontroller 12 is sent to the gate of the triac T1a to control the conduction state of the triac T1a. In the same way, the similar voltage signal from the pin pin_2 of the microcontroller 12 is sent to the gate of the triac T1b to control the conduction state of the triac T1b.

In the program loops corresponding to the on/off switch control mode and the dimming control mode, the microcontroller 12 utilizes the external interrupt control technique to generate voltage pulses synchronized with AC power. To accomplish it, the program of the microcontroller 12 has a setup with the voltage level variations at the pin pin_10 as external interrupt trigger signals. Since the time point of high or low voltage level variation in the signal generated by the zero-crossing-point detector 13 is the zero crossing point of AC sine wave, the external interrupt process is automatically triggered at the zero crossing point of the AC power source 3, and the related meaning of the details are further described in FIG. 6 and FIG. 7.

Referring to FIG. 5 in accompanying FIG. 2 and FIG. 4, the program of the microcontroller 12 starts from the loop of steps S1 and S2 of on/off switch control mode, wherein the microcontroller based electronic switch 1 is off. The program of the microcontroller 12 scans the voltage at the pin pin_3. If the voltage at the pin pin_3 is a high voltage, the microcontroller 12 generates a zero voltage at the pin pin_1, which is fed to the gate of the triac T1a to turn it off. For no current flowing through the triac T1a, the voltage between the two ends of the load 2a is zero in each AC cycle. In the same way, if the voltage at the pin pin_3 is a high voltage, the microcontroller 12 generates a zero voltage at the pin pin_2, which is fed to the gate of the triac T1b to turn it off.

Refer to FIG. 6 in accompanying FIG. 2 and FIG. 4. If the program of the microcontroller 12 detects a low voltage at the pin pin_3, the program of microcontroller 12 jumps to steps S3 and S4 of on/off switch control mode, wherein the microcontroller based electronic switch 1 is on. The microcontroller 12 scans within a few microseconds the voltage at the pin pin_10. The external interrupt happens in each AC half cycle (of some milliseconds) at the time point of voltage level variation in the square wave signal. In the external interrupt process, no other program is executed, instead the program is commanded to go back to the main program instantly. The program of the microcontroller 12 is designed based on the time point when the external interrupt occurs, which is also the zero crossing point of the AC power source 3. After some delay times with respected to the time point of the external interrupt, the program of the microcontroller 12 generates a pulse signal at the pin pin_1 and a pulse signal at the pin pin_2. The signal provided from the pin pin_1 is a zero-crossing-point time-delay pulse having a delay time tD_a after the zero crossing point of AC power. The signal provided from the pin pin_2 is a zero-crossing-point time-delay pulse tD_b having a delay time tD_b after the zero crossing point of AC power. The zero-crossing-point time-delay pulse tD a (or tD_b) is generated both in the positive and negative half-cycle of the AC power source 3, and used to trigger in synchronization with AC power source 3 the triac T1a (or triac T1b) into conduction, such that the AC power source 3 delivers in each half AC cycle electric power to the first lighting load 2a (or the second lighting load 2b) which is in proportion to a conduction time ton_a of the triac T1a (or ton_b of triac T1b). In contrast with the AC power source 3 and the zero crossing point delay pulses, the voltage waveform on the first lighting load 2a is depicted in FIG. 6, and the conduction time ton_a is designated. The voltage waveform on the second lighting load 2b can be similar to the voltage waveform on the first lighting load 2a, wherein the conduction time ton_b of triac T1b can be different from the conduction time ton_a of the triac T1a which are respectively resulted from different delay time tD_b and delay time tD_a of the zero-crossing-point time-delay pulses.

In the loop of steps S3 and S4 of the microcontroller based electronic switch 1 being on, the delay times tD_a and tD_b of the zero-crossing delay voltage pulses are both predetermined values to make a constant average electric power delivered to the loads 2a, 2b. The color temperature of the diffused light of the two lighting load 2a, 2b may be controlled by properly selecting tD_a and tD_b, such that the summation of tD_a and tD_b is a constant, and the total lighting power of the first lighting load 2a (X) and the second lighting load 2b (Y), X+Y, is a fixed value. However, it is not to limit thereto in the present disclosure. By designing a minimum time delay, summation of the conduction time ton_a and ton_b of the triac T1a and the triac T1b can reach the maximum to make the maximum electric power transmission to the loads 2a, 2b. In practice, the loads 2a, 2b can be fluorescent lamps, AC LEDs (light emitting diode) screwed-in LED bulbs or incandescent bulbs, wherein said light-emitting diode module comprises a full-wave rectifier bridge and a plurality of light-emitting diodes in series connected between the two terminals of the rectifier bridge output port. Alternatively, the two loads 2a, 2b can be DC LED modules power by a DC source.

Refer to FIG. 7 in accompanying FIG. 2 and FIG. 4. In the loop of steps S3 through S6, the microcontroller based electronic switch 1 is on, the program of the microcontroller 12 scans the voltage at the pin pin_3. If the sensing signal fed to the pin pin_3 is a low voltage with the time length Ts longer than nTo (n≥2), the program of the microcontroller 12 jumps to the loop of steps S8 through S10 for executing the color temperature tuning mode. When the microcontroller based electronic switch 1 is in the color temperature tuning mode, the program of the microcontroller 12 scans the voltage at the pin pin_10, so as to generate a zero-crossing-point time-delay pulse with a delay time tD_a at the pin pin_1 and to generate a zero-crossing-point time-delay pulse with a delay time tD_b at the pin pin_2. Simultaneously, the program of the microcontroller 12 scans the voltage at the pin pin_3. If the detected sensing voltage at the pin pin_3 is a low voltage with different time length Ts, the program continuously increases the delay time tD_a and decreases the delay time tD_b, or vice versa, of the zero-crossing-point time-delay pulses generated respectively at the pin pin land pin pin_2, wherein the varying time length tD_a and tD_b are in proportion to the time length Ts. It should be noted that both delay times tD_a and tD_b vary in an appropriate range from "to" to "1/(2f)–to", wherein to=($\frac{1}{2\pi f}$)sin−1(Vt/Vm), f is the AC frequency, Vt is the threshold voltage or cut-in voltage of the lighting loads 2a, 2b and Vm is the voltage amplitude of the AC power source 3. This constraint on tD_a and tD_b is required to ensure in each AC half-cycle to stably trigger the triac T1a and triac T1b into conduction when the threshold voltage Vm of the lighting loads 2a, 2b are taken into consideration. FIG. 7 shows for one case the waveforms in the color temperature tuning mode wherein the delay time tD_a of the time delay pulse at the pin pin_1 is gradually increased along the time axis. The delay time tD_a decides the time length of the conduction time ton_a of triac T1a. The average electric power delivered to the first lighting load 2a, which is in proportion to the time length ton_a, is accordingly decreased. At the same time for the same case, not shown in FIG. 7, the delay time tD_b of the time delay pulse at the pin pin_2 is gradually decreased in the reverse direction, the conduction time ton_b of triac T1b and the average electric power delivered to the second lighting load 2b are thus accordingly increased. Consequently, the color temperature of the diffused light of the two lighting load 2a, 2b may vary gradually from a high temperature to a low one, or vice versa, due to alternatively changing the power levels of the two lighting load 2a, 2b controlled by the trigger pulses with delay times tD_a and tD_b. When the voltage at the pin pin_3 becomes high to terminate the color temperature tuning mode, the final values of the delay times tD_a and tD_b are then stored in the memory of the microcontroller 12 as new predetermined values to perform illumination with a desired color temperature and power level.

Figure 8A:
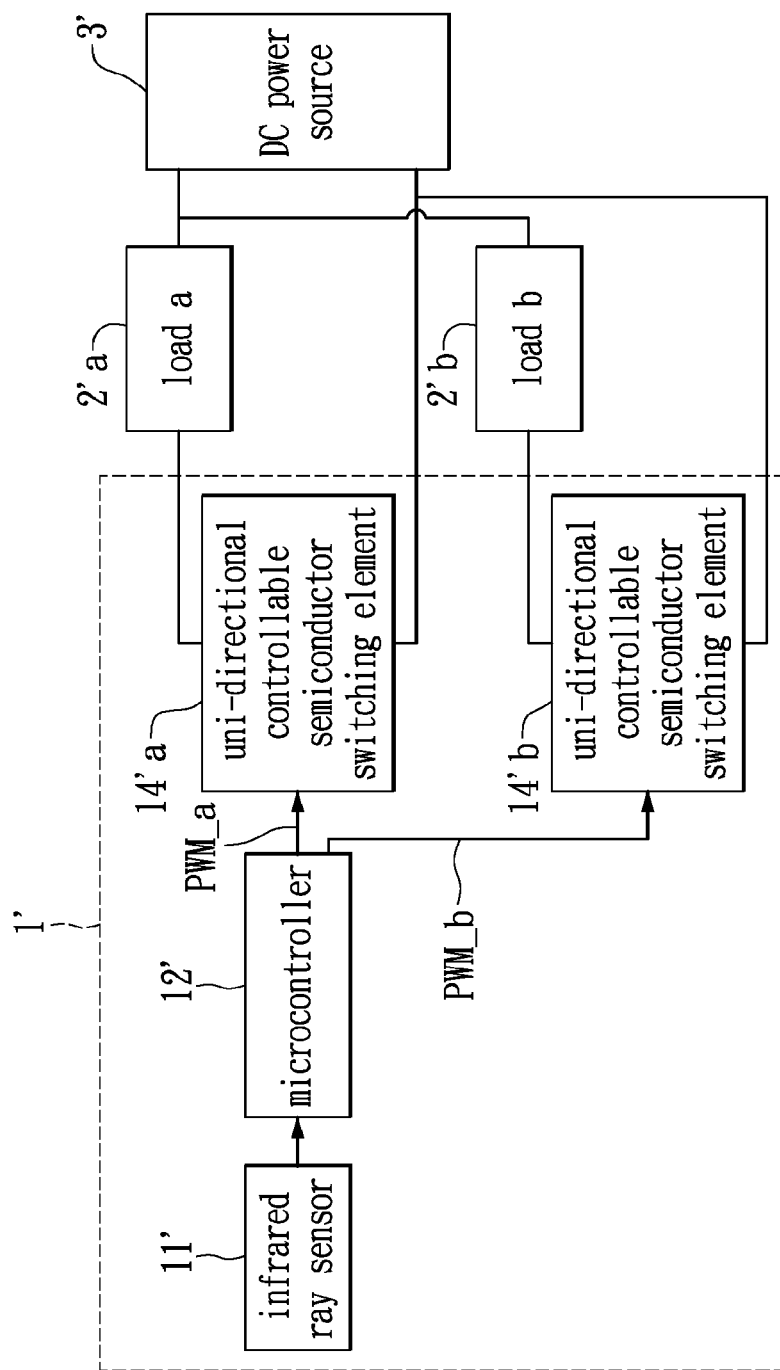
FIG. 8A is a block diagram of a microcontroller based electronic switch for a DC power source according to an exemplary embodiment of the present disclosure.

In addition, the concept of the present disclosure can also be applied to the DC power source, wherein the controllable semiconductor switching element and the program of the microcontroller 12 should be modified slightly, and the zero-crossing-point detector should be removed. Referring to FIG. 8A, FIG. 8A is a block diagram of a microcontroller based electronic switch 1' using an infrared ray sensor as a detection device for a DC power source according to an exemplary embodiment of the present disclosure. The microcontroller based electronic switch 1' is connected to a DC power source 3' and a first lighting load 2'a in a serial fashion, so as to control the electric power of the DC power source 3' delivered to the first lighting load 2'a. Also, the microcontroller based electronic switch 1' is connected to the DC power source 3' and a second lighting load 2'b in a serial fashion, so as to control the electric power of the DC power source 3' delivered to the second lighting load 2'b. Compared to FIG. 1, the microcontroller based electronic switch 1' in FIG. 8A comprises an infrared ray sensor 11', a microcontroller 12', and uni-directional controllable semiconductor switching elements 14'a, 14'b. In practice, the uni-directional controllable semiconductor switching elements 14'a, 14'b can be bipolar junction transistors (BJTs) or metal-oxide-semiconductor field-effect transistors (MOSFETs). The loads 2'a and 2'b can respectively emit low color temperature light and high color temperature light. The load 2'a and 2'b can be light-emitting diodes or incandescent bulbs, but present disclosure is not limited thereto.

Figure 8B:
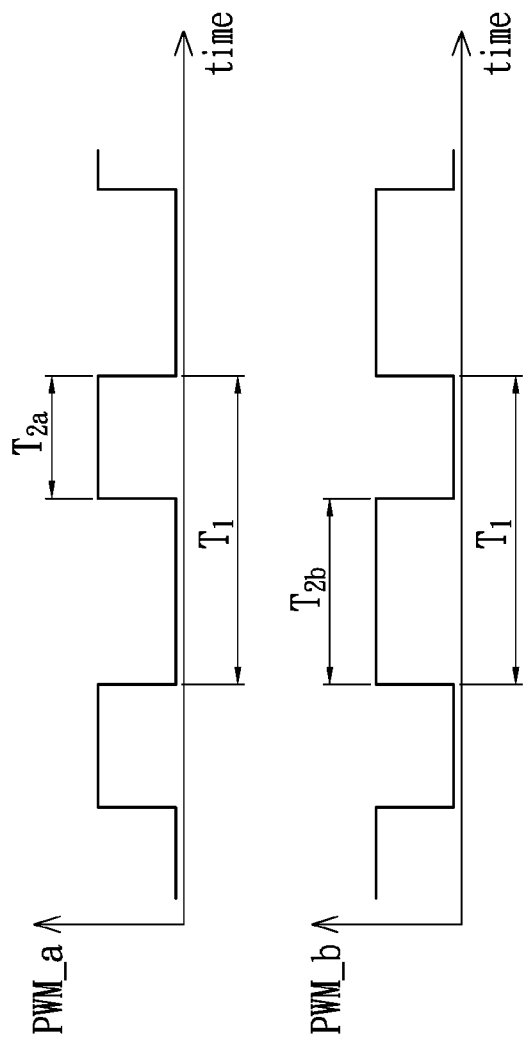
FIG. 8B is a voltage waveform diagram of the pulse width modulation voltage signals associated with FIG. 8A according to an exemplary embodiment of the present disclosure.

Referring to FIG. 3A, FIG. 3B and FIG. 8B, the infrared ray sensor 11' detects a user's hand, for instance, and converts the outcome into message carrying low voltage sensing signals readable to the microcontroller 12'. The microcontroller 12' decodes the low voltage sensing signal according to the program designed and written in its OTPROM, so as to make the microcontroller based electronic switch 1' operate in on/off switch control mode and color temperature tuning mode (or dimming control mode) accordingly. In the on/off switch control mode when the microcontroller based electronic switch 1' is off, the program of the microcontroller 12' generates a zero voltage fed to the gate of the uni-directional controllable semiconductor switching element 14'a (or 14'b) so as to turn off the switching element 14'a (or 14'b). In the on/off switch control mode when the microcontroller based electronic switch 1' is on, the program of the microcontroller 12' generates PWM_a (pulse-width-modulation) (or PWM_b) signal fed to the gate of the uni-directional controllable semiconductor switching element 14'a (or 14'b) so as to turn on the switching element 14'a (or 14'b) such that a fixed electric power is transmitted from the DC power source 3' to the load 2'a (or 2'b).

FIG. 8B is a voltage waveform diagram of the PWM signals according to an exemplary embodiment of the present disclosure. The PWM voltage signal is a square wave signal comprising a zero voltage (or low-voltage) and a high voltage, wherein the high voltage drives the uni-directional controllable semiconductor switching element 14'a (or 14'b) into conduction. If the time length of the high voltage is T2a (or T2b) and the period of the PWM voltage signal is T1, the average electric power delivered to the load 2'a (or 2'b) through the uni-directional controllable semiconductor switching element 14'a (or 14'b) is proportional to the ratio T2a/T1 (or T2b/T1), which is by definition the duty cycle of the PWM voltage signal and is denoted as δ=T2a/T1 (or δ=T2b/T1).

More specifically, the electronic switch 1' controls on/off and dimming of the first lighting load 2'a and the second lighting load 2'b in response to the operation of the infrared ray sensor 11'. When the switch 1' is turned on, the microcontroller 12' sends PWM voltage signals PWM_a and PWM_b for FIG. 8A controlled by the infrared ray sensor 11': as shown, it is always to generates voltage signals PWM_a and PWM_b with two predetermined time lengths of T2a and T2b, wherein T2a+T2b=T1 for respectively controlling the load 2a to generate X watts power illumination and the load 2b to generate Y watts power illumination, where the summation X+Y is a fixed value. It may be T2a<T2b or T2a>T2b in response to the control signal generated by infrared ray sensor 11'. In a free running mode for color temperature tuning in response to the control signal generated by infrared ray sensor 11', T2a may be varied gradually from a large value to a small one while T2b varied gradually from a small value to a large one, and vice versa, wherein T2a+T2b=T1. A color temperature generated by blending the lights emitted from the lighting load 2'a and 2'b can thus be selected when the free running mode for color temperature tuning is terminated by moving object (for example, the user's hand) out of the detecting zone of the infrared ray sensor 11', and then the final values of T2a and T2b would be stored in the memory of the microcontroller 11'.

The present disclosure is not limited by the PWM waveforms as depicted in FIG. 8B. In a practical design scheme, the parameters T2a and T2b of the PWM voltage signals can have a relation T2a+T2b=A, wherein "A" is a predetermined constant. Since the average electric powers delivered to the lighting loads 2'a and 2'b are respectively proportional to the duty cycles T2a/T1 and T2b/T1, both are smaller than one, the total average lighting power is in proportion to the summation of T2a/T1 and T2b/T1. When the voltage signals PWM_a and PWM_b are designed with A>T1, the color temperature of the diffused light of the two lighting load 2a, 2b can be generated under a total average lighting power larger than the one when A=T1. With A<T1, the total average lighting power is smaller than the one when A=T1. Thus, besides the color temperature tuning, the illumination power level may be controlled through varying the parameter A in a predetermined range by the microcontroller based electronic switch 1' of the present disclosure.

Figure 9A:
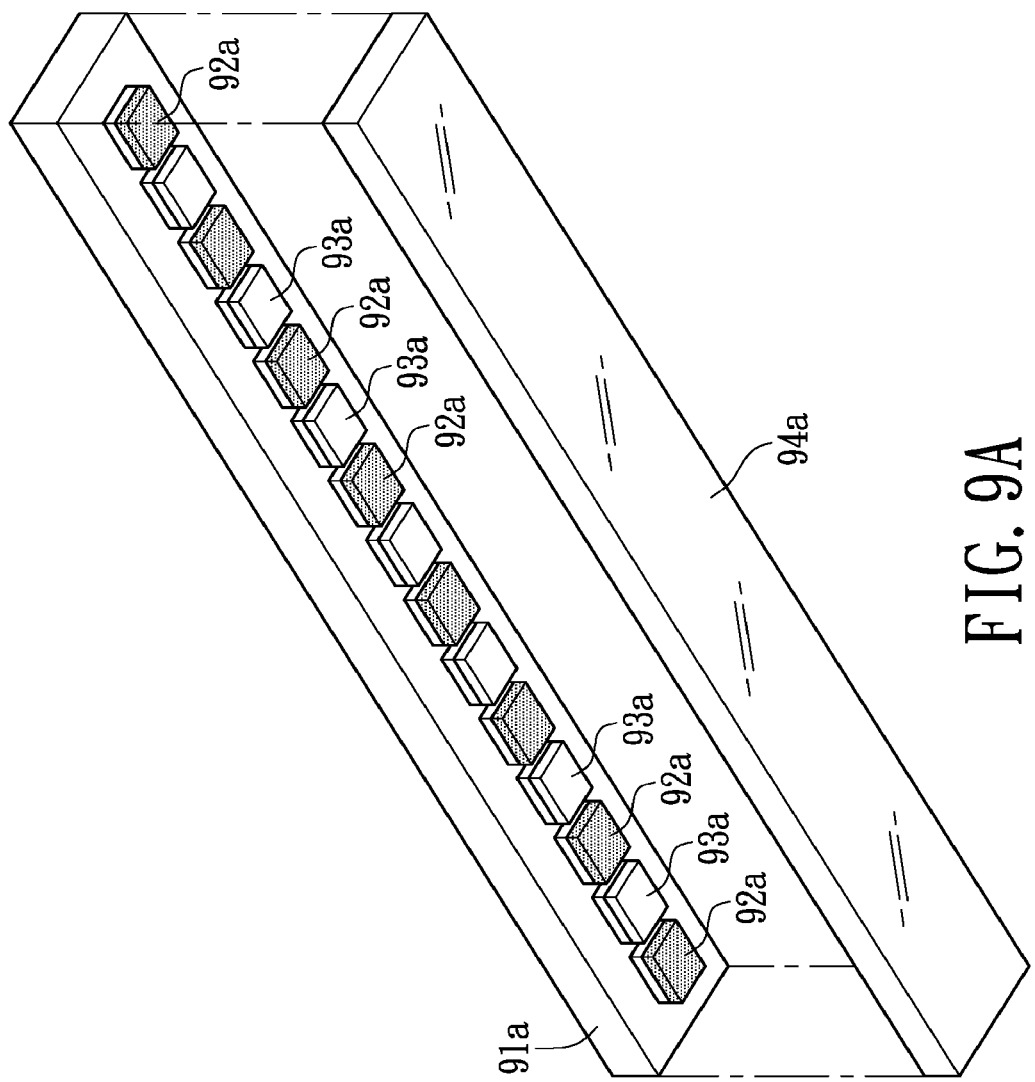
FIG. 9A is an application diagram of an exemplary embodiment of the present disclosure for a lighting apparatus.
Figure 9B:
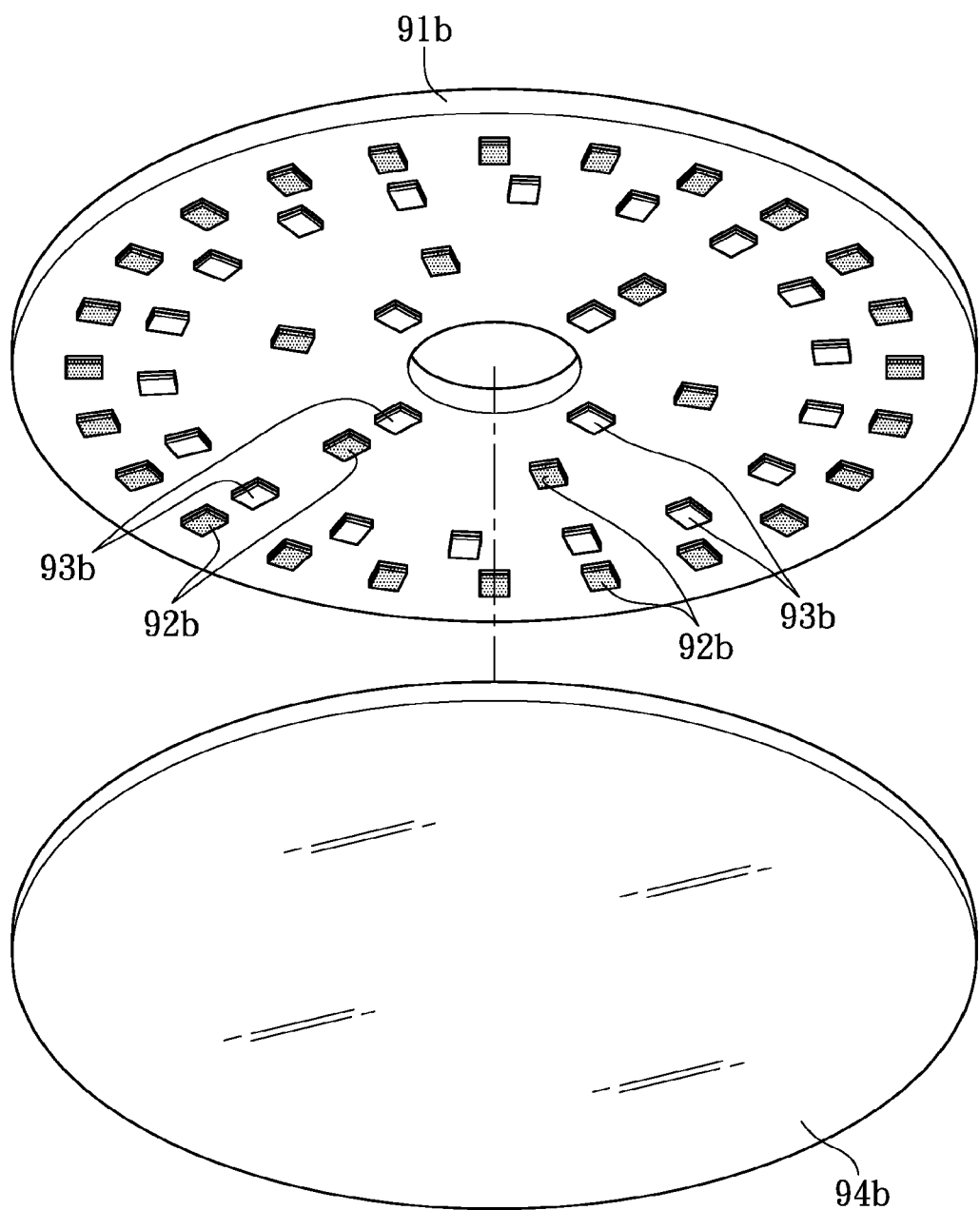
FIG. 9B is an application diagram of an exemplary embodiment of the present disclosure for a lighting apparatus.

The aforementioned microcontroller-based electronic switch can have many functions, such as on/off switch control, dimming control and color temperature tuning or management control, that are integrated in one without additional hardware complexity. This multifunctional electronic switch can be applied to a lighting apparatus. Please refer to FIG. 9A, a lighting apparatus having the microcontroller-based multifunctional electronic switch is provided. The lighting apparatus comprises a base 91a, a first lighting load 92a, a second lighting load 93a, a diffuser 94a and a microcontroller based electronic switch (not shown in the figure). The base 91a is for disposing the first lighting load 92a, the second lighting load 93a and the microcontroller based electronic switch which has been described in previous embodiments. The operation of the microcontroller based electronic switch related to lighting characteristic control of the first lighting load 92a and the second lighting load 93a can be referred to previous embodiments, thus the redundant information is not repeated. For diffusing or spreading out or scattering the different color temperature light emitted by the first lighting load 91a and the second lighting load 92a, a diffuser 94a is provided to cover the first lighting load 92a and the second lighting load 93a. Further, the first lighting load 92a and the second lighting load 93a can be alternatively disposed on the base 91a. As shown in FIG. 9B, the first lighting load 92a comprises a plurality of lighting elements, and the second lighting load 93a comprises a plurality of lighting elements, wherein a lighting element of the second lighting load 93a is inserted between the two adjacent lighting elements of the first lighting load 92a for obtaining uniform color temperature of the diffused light, but present disclosure is not limited thereto.

Another embodiment of the lighting apparatus can be referred to FIG. 9B. Due to the difference for the appearance of the lighting apparatus, the arrangement of the lighting elements of the first lighting load 92a and the lighting elements of the second lighting load 93a shown in FIG. 9B is different from that shown in FIG. 9A. As shown in FIG. 9B, the lighting elements of the first lighting load 92a and the lighting elements of the second lighting load 93a are both disposed in a circular arrangement. The lighting elements of the first lighting load 92a and the lighting elements of the second lighting load 93a constitute a plurality of concentric circles. The concentric circles of the first lighting load 92a and the concentric circles of the second lighting load 93a are interlaced for obtaining uniform color temperature of the diffused or blended light. However, the present disclosure is not restricted thereto. An artisan of ordinary skill in the art will appreciate how to arrange the first lighting load and the second lighting load covered by the diffuser to obtain the result of uniform color temperature of light.

Furthermore, although the above description of the exemplary embodiments takes infrared ray sensor as a means for detecting user's motion and generating sensing signal, the technology of the present disclosure has no restriction on the types of detection method used. There are quite a few detection methods including touch or touchless means that can be applied to the present invention of the multifunctional electronic switch such as an infrared ray sensor (touchless interface), an electrostatic induction sensor (also touchless interface), a conduction based touch sensor (direct touch interface), or a push button sensor (direct touch interface). Each detection method may require different motion signals to be played by the user but the core technology remains using the time length and format of the binary sensing signals as the message carrier for transmitting the user's choice of working mode. The microcontroller thereby decodes or interprets the received message carrying sensing signals according to the software program written in the OTPROM, recognizes the working mode selected by the user and activates the corresponding loop of subroutine for performance execution.

Similar to the infrared ray sensor, the electrostatic induction sensor can also create a touchless interface. The electrostatic induction sensor generally comprises a copper sheet sensing unit with adequately design shape and packaged with non-conductive material. Such copper sheet sensing unit is further electrically connected to a signal generating circuit similar to the infrared detection sensor unit. The copper sensing unit serves as an anode pole and the human body (normally refers to finger or hand) serves as a cathode pole to form a configuration of a capacitor. When the user's hand is approaching the copper sensing unit, the electric charges are being gradually induced and built up on the surface of the copper sensing unit with increasing density. Consequently, the copper sensing unit changes its electric state from zero voltage state to a growing voltage state. Such voltage level will continue to grow as the user's hand moving closer and closer to the copper sensing unit till reaching a designed threshold point which will trigger the detection circuit to generate a low voltage sensing signal. The distance between the copper sensing unit and the space point where the threshold voltage incurs is defined as the effective detecting zone. Similarly but reversely when the user's hand is moving out from an operative point of the detecting zone of the copper sensing unit, the voltage level will continue to decline till passing the designed threshold point which will trigger the cutoff of the low voltage sensing signal. The time length of the low voltage sensing signal so generated or in other words the time period between moving in and moving out the effective detecting zone can be designed to represent the selection of different working modes. If the time length is shorter than a preset time interval, it means the user's selection is to perform the on/off switch control mode; if the time length is longer than a preset time interval, it means the user's selection is to perform the diming or power level control mode; if two or more low voltage sensing signals are consecutively generated within a preset time interval, in other words the user's hand moving in and out the detecting zone twice or swing across the detecting zone back and forth, it means the user's selection is to perform the color temperature management mode.

For direct touch detection sensors, such as a touch sensor (for example a touch pad) or a push button detection sensor, one touch on the conductive base or one instant press on the control button within a preset time interval will trigger the generation of a single sensing signal which will cause the microcontroller to execute the subroutine of the on/off switch control mode; a long touch on a conductive base or a long press on a control button longer than the preset time interval will trigger the generation of a single sensing signal with time length longer than the preset time interval and the microcontroller responsively will execute the subprogram of dimming control mode. Double instant touches on the conductive base or double instant press on the control button within a preset time interval will trigger the generation of two consecutive sensing signals which will cause the microcontroller to execute the subroutine of color temperature management mode.

Figure 10A:
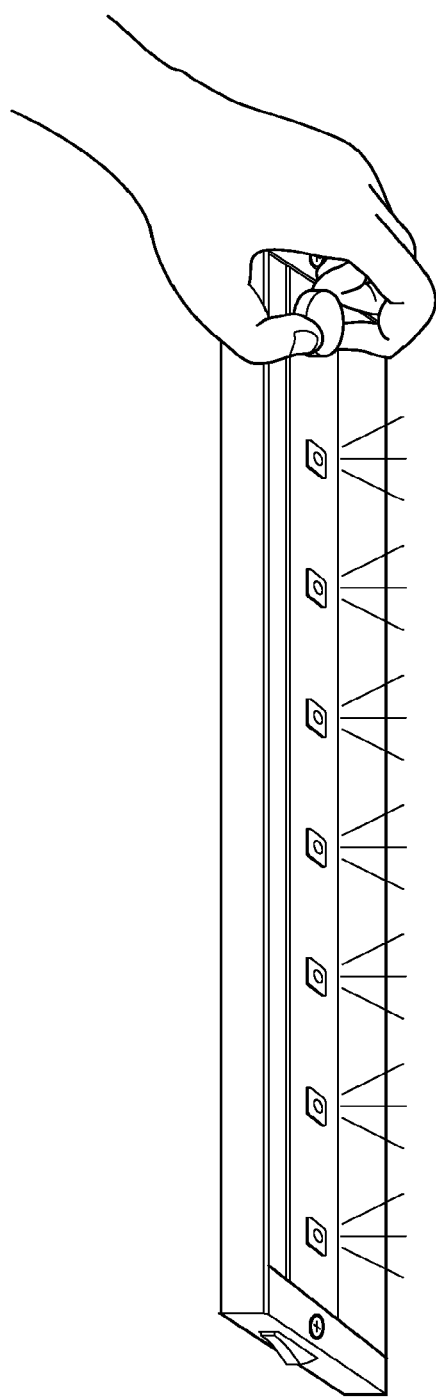
FIG. 10A is an application diagram of a traditional popular piece of under cabinet light with LED as light source.
Figure 10B:
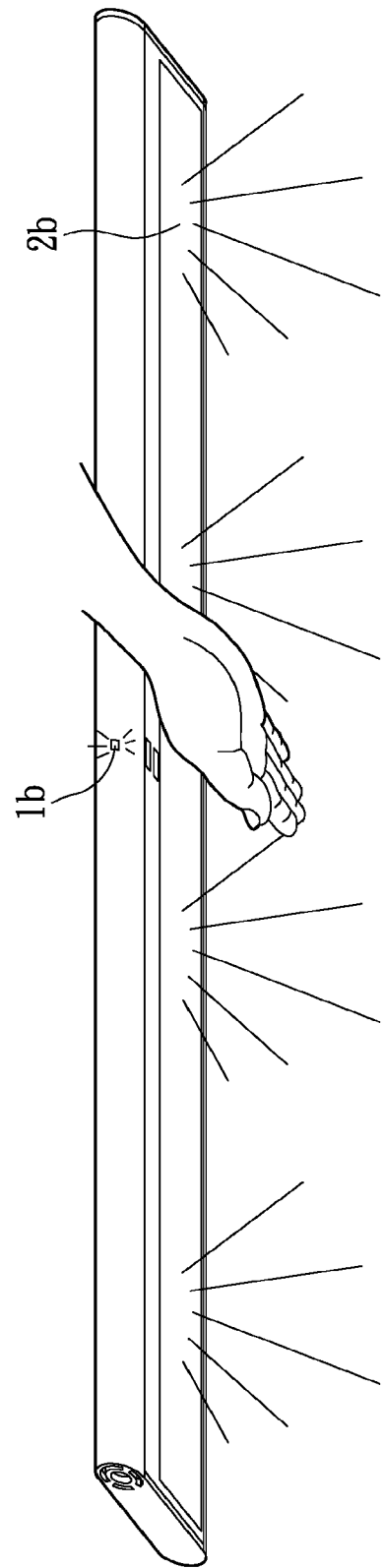
FIG. 10B is an application diagram of an exemplary embodiment of the present disclosure for a LED under cabinet light featured with a touch-less interface between the user and the under cabinet light.

FIG. 10A and FIG. 10B together provide a good show case to prove the value of the user friendly concept of the present invention. Picture shown in FIG. 10A is a popular piece of under cabinet light with LED as light source. A manual on/off control switch is built on the right hand side of the rectangular housing and a dimming knob is built on the front panel facing downward. Under cabinet lights are always installed underneath the kitchen cabinets to provide sufficient indirect illumination to the user to do the kitchen work. The under cabinet lights and the kitchen cabinet are always installed at approximately the breast level of the users for the convenience of doing kitchen work so that the users can comfortably do the kitchen work without bending their body and having to work in a glaring environments. The current market piece as shown in FIG. 10A is not an user friendly device; the user has to either use his or her hand to blindly search the locations of the on/off switch and the dimming knob or to bend his or her body to find the exact locations of the two control units for operation. Additionally, the direct touch to control the on/off switch and dimmer also brings up concerns of contagion and contamination in preparing food in kitchen area and the housewives may have to wash their hands more frequently than necessary.

FIG. 10B is an application of the present invention for a LED under cabinet light featured with a touchless interface between the user and the under cabinet light. A motion of single swing of user's hand across the detecting zone of the microcontroller based electronic switch 1b will activate the on/off switch mode alternately turning on and turning off the under cabinet light 2b. A motion of placing user's hand in the detecting zone exceeding a preset time interval will activate the dimming mode to allow selection of brightness or power level. And a motion of double swings of user's hand across the detecting zone within a preset time interval will activate the color temperature tuning mode to provide the user a possibility to select a desired illumination color temperature. The three basic working modes can be easily managed with simple motions played by the user without the hassles of having to blindly search the control switch and dimming knob, or to bend body to find the location of the control elements or to frequently wash hands to avoid concerns of contagion and contamination in preparing food. This is truly a very user friendly exemplary embodiment of the present disclosure compared with what are currently being sold in the market as shown in FIG. 10A.

Figure 10C:
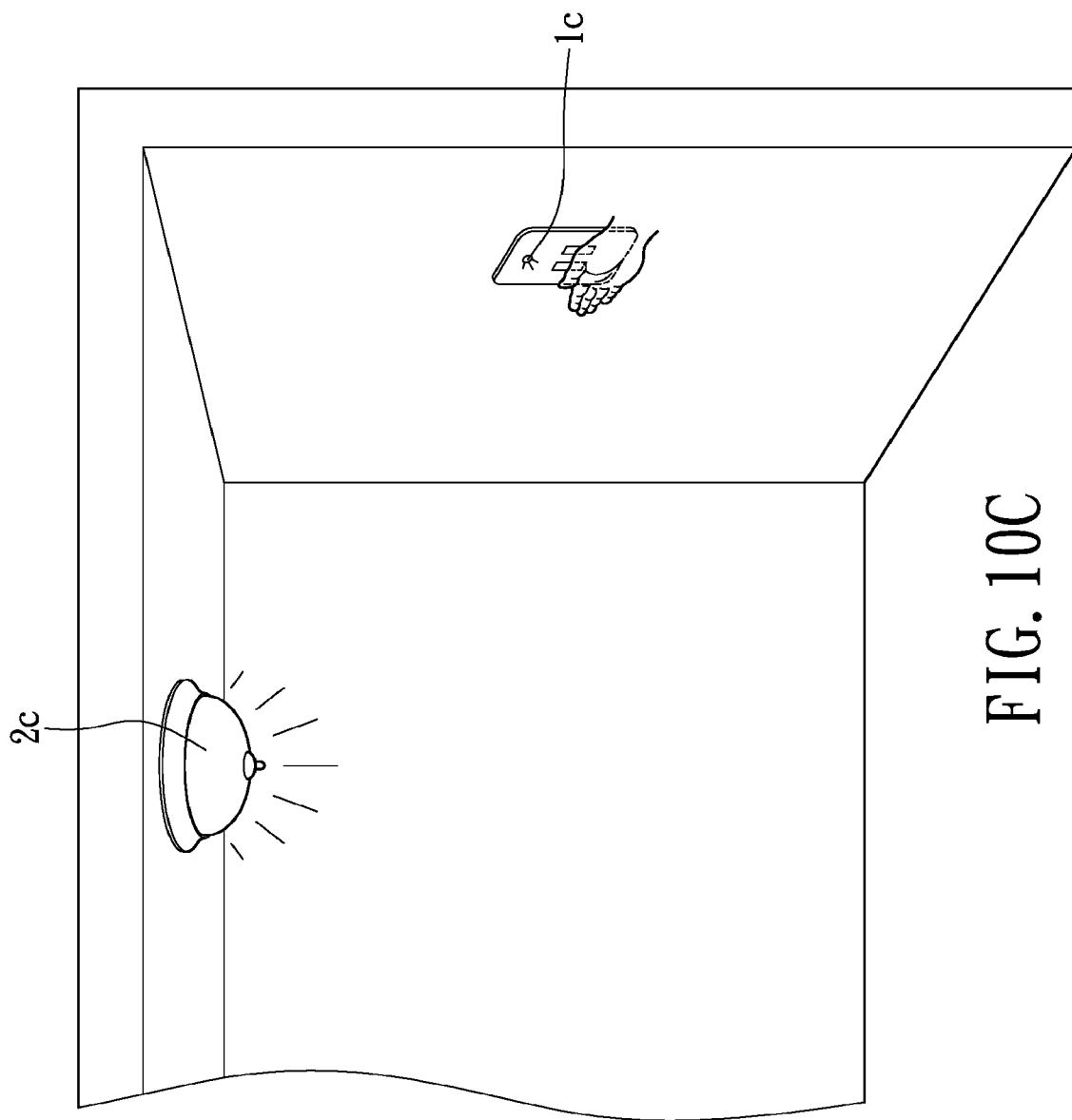
FIG. 10C is an application diagram of an exemplary embodiment of the present disclosure for a wall switch construction electrically connected to a ceiling light for the performance of three working modes.

FIG. 10C is another application of the present invention for a wall switch construction electrically connected to a ceiling light for the performance of three working modes. A motion of single swing across the detecting zone in front of the wall switch 1c by user's hand within a preset time interval will activate the on/off switch control mode alternately turning on and turning off the ceiling light 2c. A motion of placing user's hand in front of the wall switch 1c and stay in the detecting zone for a time period longer than a preset time interval will activate the dimming mode to allow the user to select the desired brightness. And a motion of double swings across the detecting zone within a preset time interval will activate the performance of the color temperature management mode to provide the user a convenient way to select a desired illumination color temperature. This new wall switch when compared with conventional switch represents a very user friendly innovation from the easy operation point of view. The conventional touch based wall switch is also a virus gathering spot because of use by many users and the issue of contagion and contamination is always a valid concern even outside the surgical space.

Figure 10D:
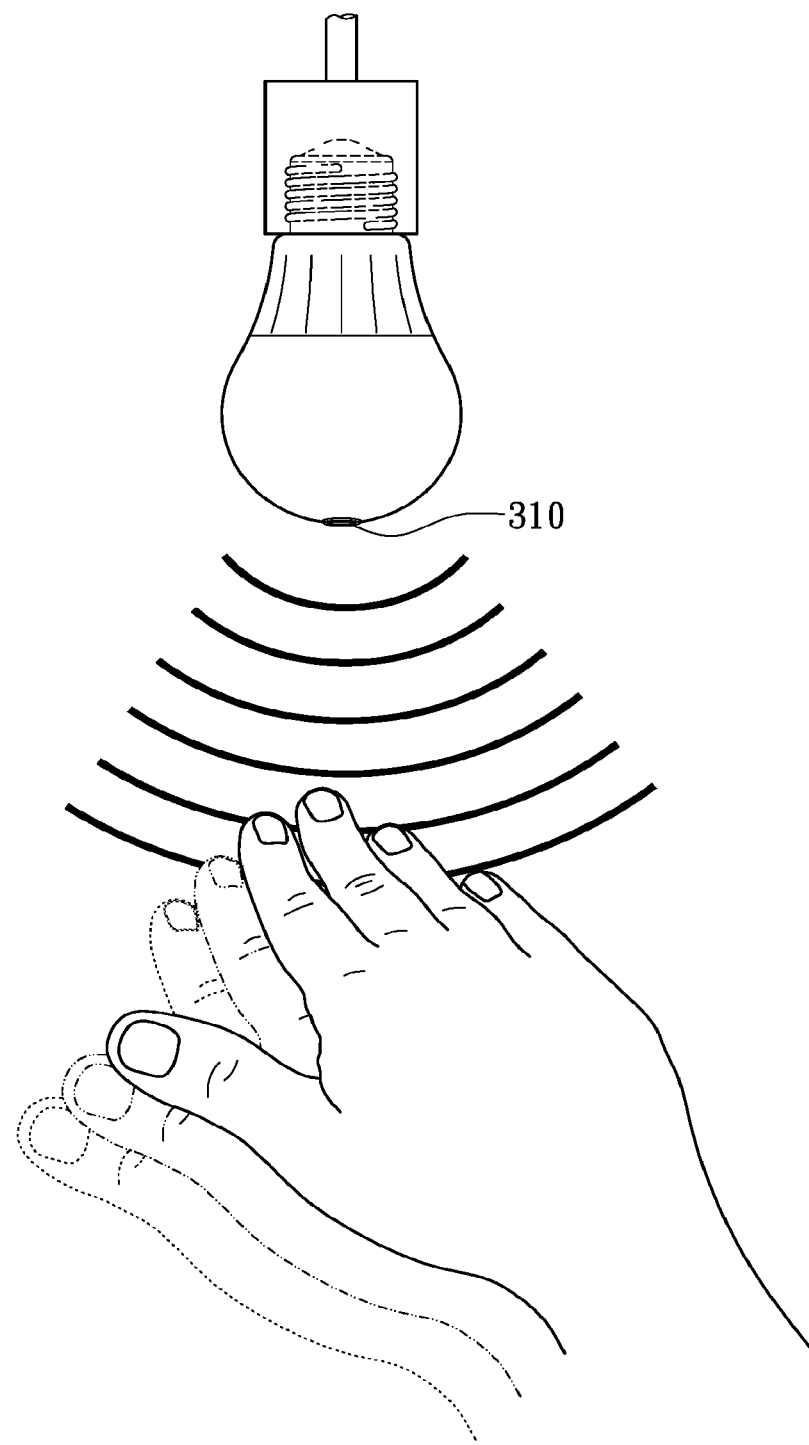
FIG. 10D is another application diagram of an exemplary embodiment of the present disclosure for a lighting apparatus with a diffuser of hollow body accommodating the lighting loads and the microcontroller based electronic switch.
Figure 10E:
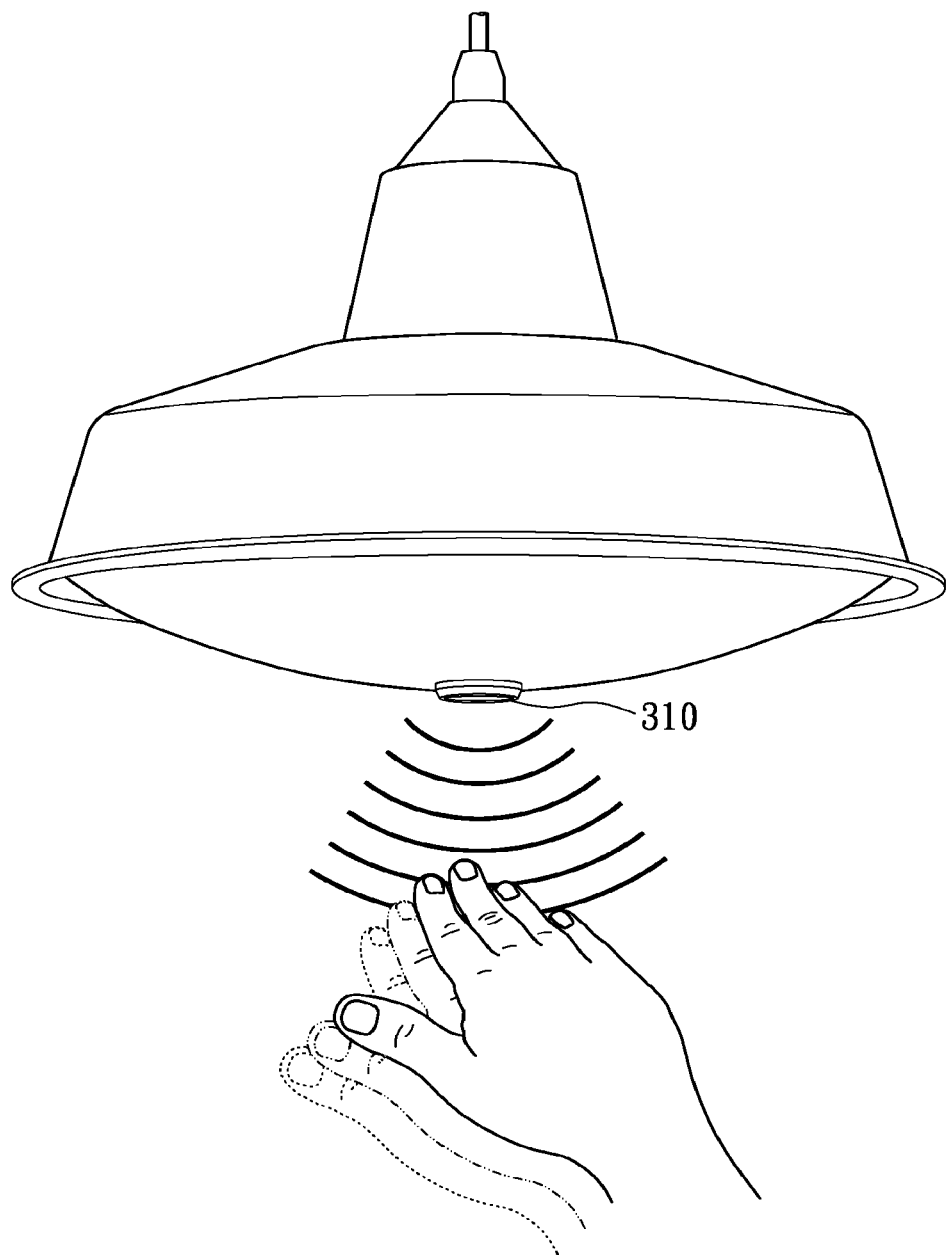
FIG. 10E is another application diagram of an exemplary embodiment of the present disclosure for a lighting apparatus with a diffuser of hollow body accommodating the lighting loads and the microcontroller based electronic switch.

FIG. 10D is another application of the present invention for a lighting apparatus with a diffuser of hollow body accommodating the lighting loads and the microcontroller based electronic switch. The diffuser is furthered bonded with a metallic threaded cap with bipolar construction for connecting with a power socket. FIG. 10E is a similar art with a flat diffuser bonded with a metal shade to accommodate the lighting loads and the microcontroller based electronic switch. Both have an infrared ray sensor 310 positioned at the bottom of the diffuser to form a short detection zone for an user to play motion signals for performing the multi functions of controlling on/off mode, dimming mode, color temperature tuning mode or delay shutoff mode.

Figure 11A:
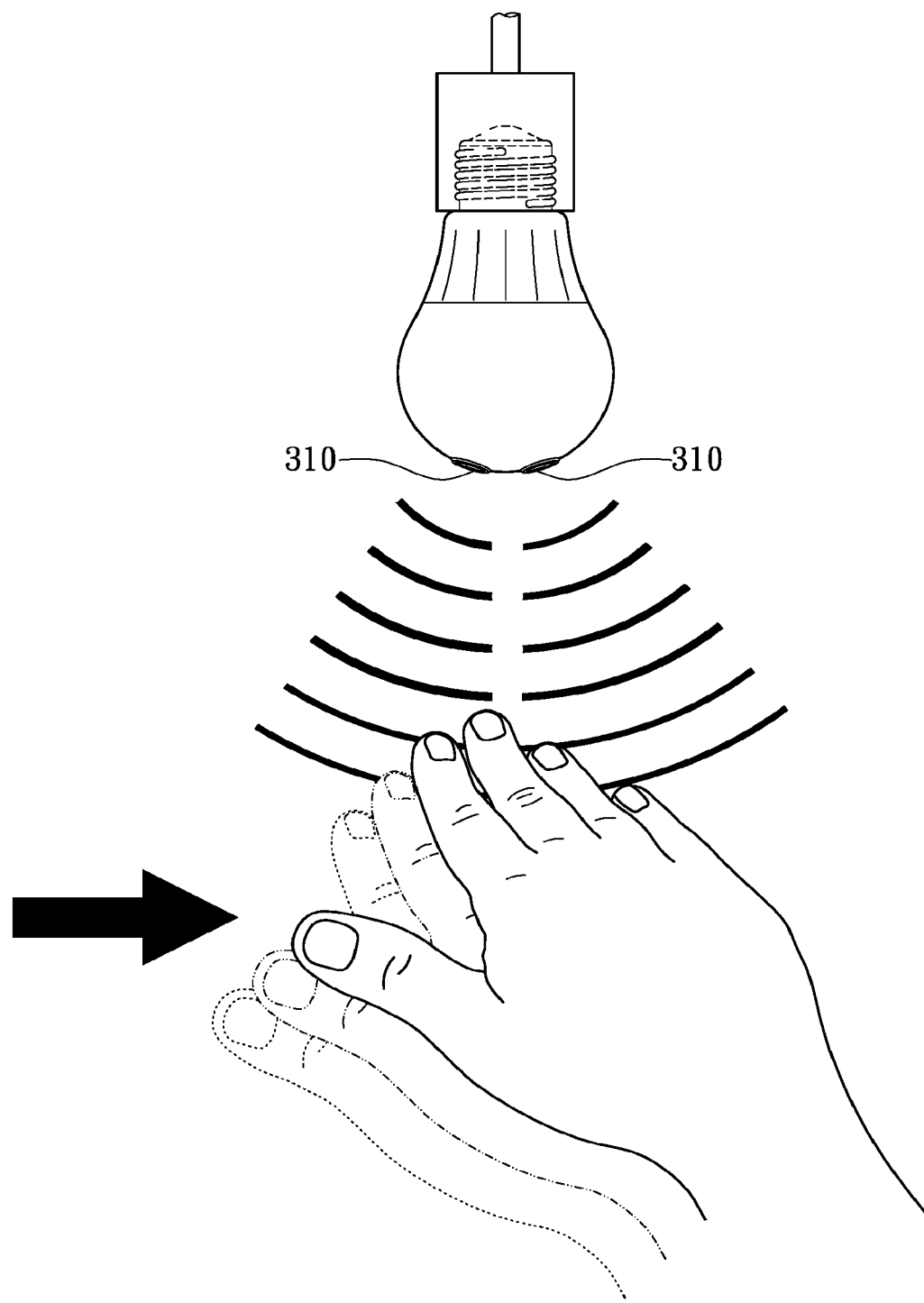
FIG. 11A is another application diagram of an exemplary embodiment of the present disclosure for the direction of motion path detected by an infrared ray sensor.
Figure 11B:
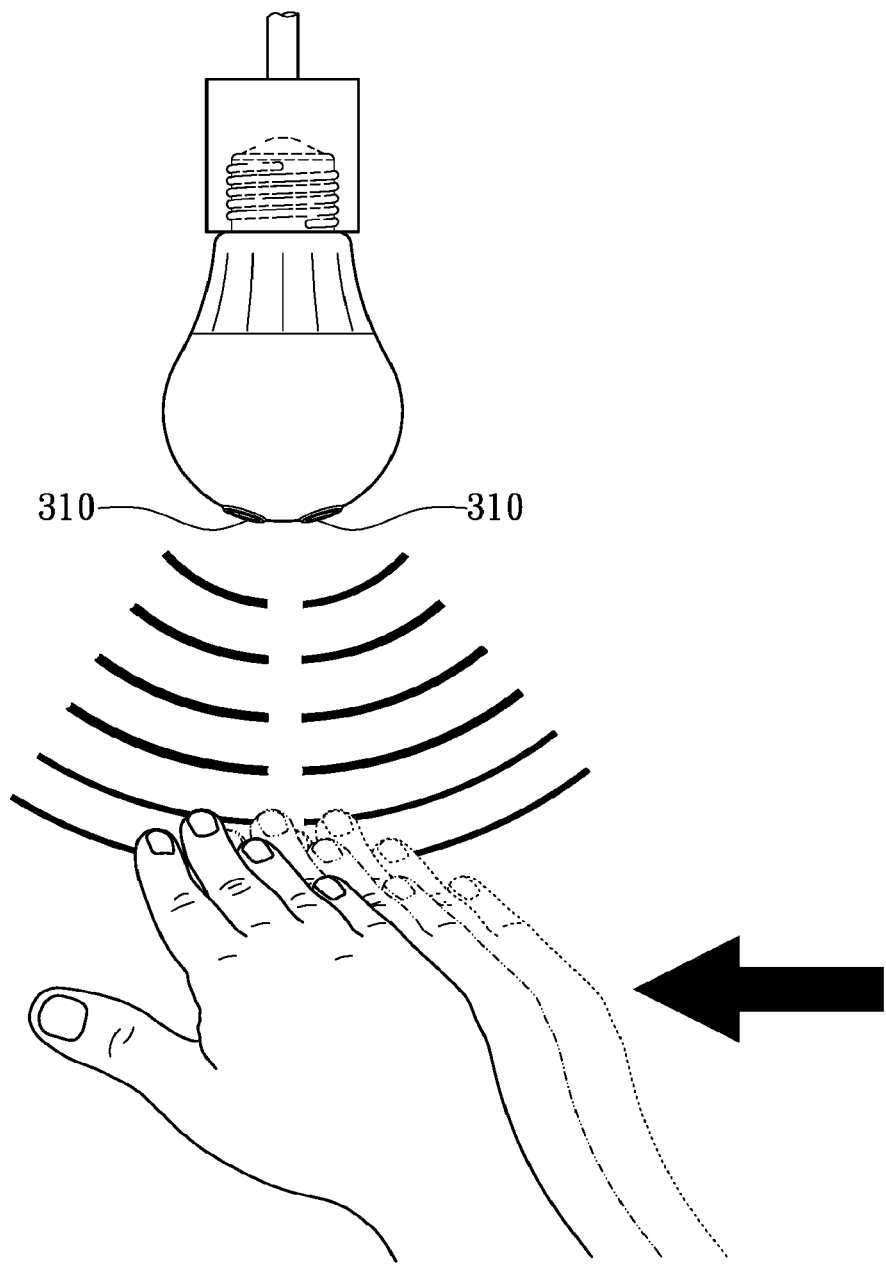
FIG. 11B is another application diagram of an exemplary embodiment of the present disclosure for the direction of motion path detected by an infrared ray sensor.
Figure 11C:
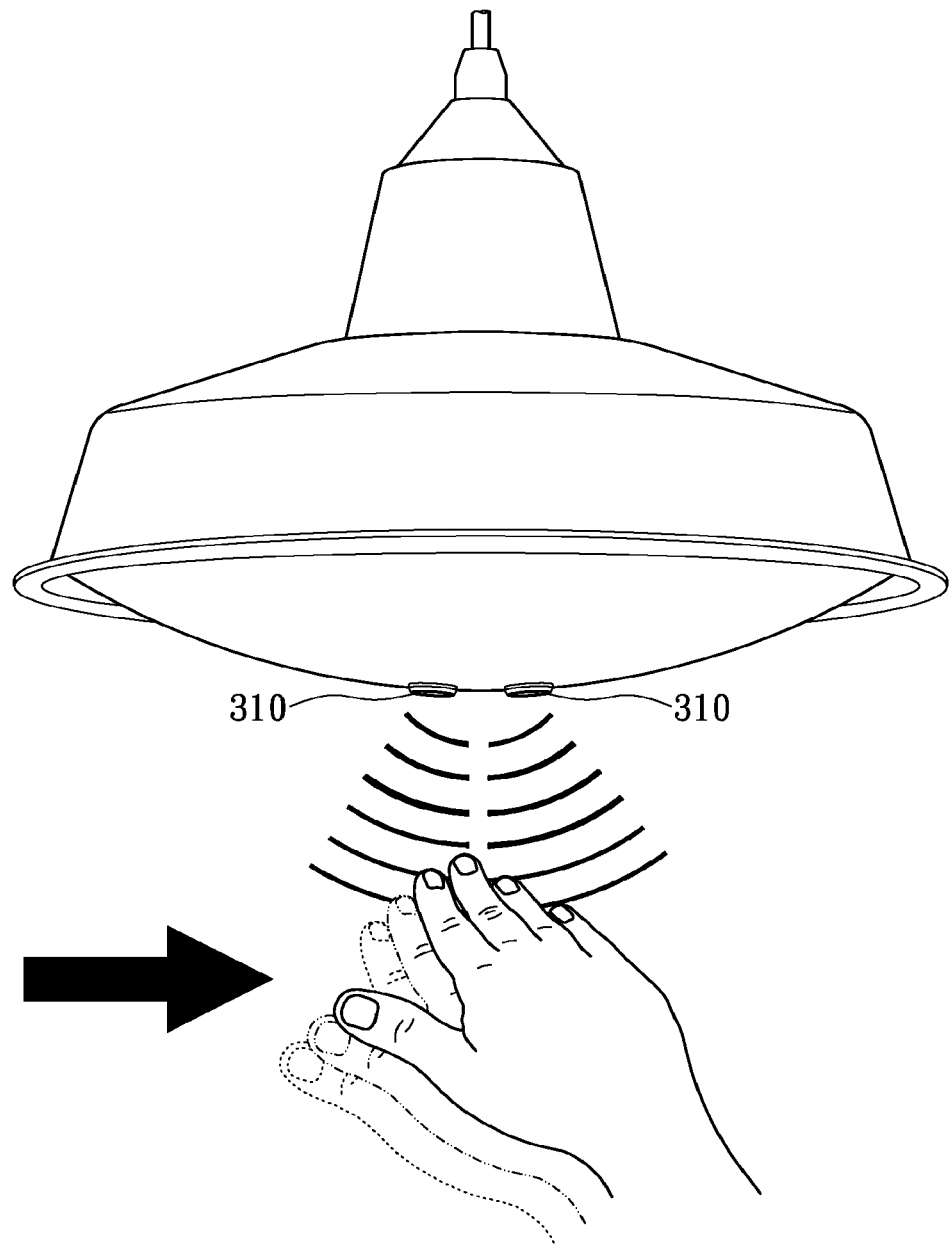
FIG. 11C is another application diagram of an exemplary embodiment of the present disclosure for the direction of motion path detected by an infrared ray sensor.
Figure 11D:
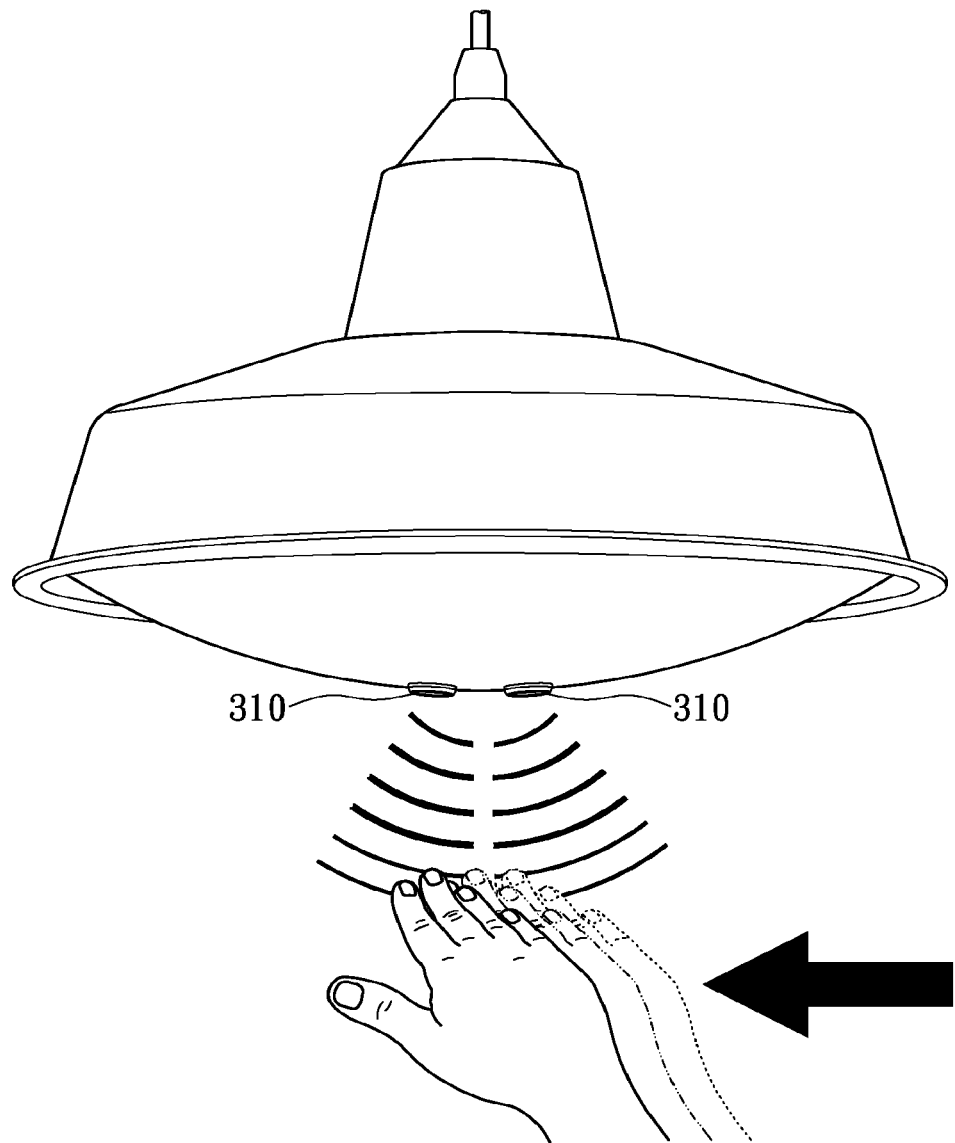
FIG. 11D is another application diagram of an exemplary embodiment of the present disclosure for the direction of motion path detected by an infrared ray sensor.

FIGS. 11A-D are another exemplary embodiments of the present invention using the aforementioned dual detection device technology for generating message carrying sensing signal to control a lighting apparatus. The dual detection device technology is based on two detection device which are respectively connected with two pins of a microcontroller in an electronic switch to control a lighting apparatus, such as, one first detection device generating message carrying sensing signal to control the color temperature of illumination and one second detection device generating message carrying sensing signal to control the light intensity of illumination. The dual detection device technology can be constructed in two arrangements: the first arrangement is to install the first detection device on one side (left side for instance) of the lighting apparatus and install the second detection device on the other side (right side) of the lighting apparatus. For instance, in FIG. 10B, the detection device 1b being an infrared ray sensor in the center can be relocated to the left side near the end cap as the first detection device to operate the light intensity control subroutine of microcontroller, a second infrared ray sensor as the second detection device is added and installed on the other end of the light apparatus to operate the color temperature control subroutine. The second arrangement is to have two detection device, here, two infrared ray sensors 310, aligned next to each other along the direction of motion path as shown in FIG. 11A and FIG. 11B, or in FIG. 11C and FIG. 11D. A hand swing from left side to enter the detecting zones formed by the two infrared ray sensors 310, as shown in FIG. 11A and FIG. 11C, will cause the first infrared ray sensor of the electronic switch to first detect the motion signal before the second infrared ray sensor can detect the same motion signal, the first infrared ray sensor will thereby generate a voltage sensing signal, the microcontroller with a pin connected with the first infrared ray sensor accordingly interprets such voltage sensing signal to activate a subroutine to operate the light intensity control mode. Thus, a first hand-swing from the left side to swing across the detecting zones will turn on the light, a second left side started hand swing will alternately change the light to perform a different state of light intensity including off mode, a left side started hand swing to enter the detecting zones and stay for a time length longer than a preset time interval will activate a free running dimming cycle for the user to select the desired light intensity. Similarly but contrarily in terms of direction for playing motion signal, a right side started hand swing to swing across the detecting zones formed by the two infrared ray sensors, as shown in FIG. 11B and FIG. 11D, will cause the second infrared ray sensor to first detect the motion signal before the first infrared ray sensor can detect such motion signal, the second infrared ray sensor thereby will generate another voltage sensing signal sending to the microcontroller of the electronic switch, the microcontroller with another pin connected to the second infrared ray sensor accordingly operates to activate a different subroutine of the microcontroller to operate the color temperature tuning mode. Thus, a right side started motion signal to swing across the detecting zones formed by the two infrared ray sensors will turn on the light to perform the highest color temperature mode, a second right side started motion signal to swing across the detecting zones will alternately change the light to perform a different state of programmed color temperatures including the lowest color temperature mode, a right hand started motion signal to enter and stay in the detecting zone for a time length longer than a preset time interval will activate a free running color temperature tuning cycle for the user to select a desired color temperature for the light. Also, when the hand (or an object) leaves the infrared ray detecting zones, the infrared ray sensors deliver a second voltage sensing signal to terminate the corresponding subroutine.

The present invention of the microcontroller based electronic switch can be extensively used in the control of lighting performance for many applications can be simply grouped into three main categories of application based on the installation location of the present invention in relation with the lighting devices used as follows:

1) The microcontroller based electronic switch is installed inside a wall electric outlet for controlling a remotely located lighting apparatus which users are unable to reach to play motion control. FIG. 10C is a representative example.
2) The microcontroller based electronic switch is installed inside the housing of a lighting apparatus which users are able to reach and play motion control. FIG. 10B of a under cabinet light is a representative example.
3) The microcontroller based electronic switch is directly installed inside a light emitting device with a detecting sensor hiding behind a diffuser and a detecting zone is formed outside nearby the diffuser. FIG. 10D is a light bulb application with a microcontroller electronic switch built inside the bulb and an infrared ray detecting sensor installed at bottom of the bulb to form an infrared detecting zone near by the bottom of the light bulb. FIG. 10E is a pendant application with an infrared ray detection sensor built inside and an infrared ray detecting sensor installed at the bottom of a flat diffuser. Both are representative examples classified as detecting sensor installed at bottom of diffuser to form a detecting zone near by the diffuser.

An external control device is an interface between a user and a power loading and control circuit of any electrical apparatus to enable the user to access to the designed functional performance. An external control device is also a crucial and necessary component designed to enable a user to play various functional performances of an electrical apparatus such as a lighting device for controlling lighting performances including on/off, dimming or color temperature tuning. In other words, an external control device is an inherent function and property of any lighting device. In this application, the term of detection devices including infrared sensor, push button, touch pad, remote control device, etc. can be collectively rephrased as external control devices because they are also designed to serve as interfaces between the user and the power loading and control circuitry of the lighting device to enable the user to control the lighting performances of the lighting device. The terminology of detection device while being a trivial terminology is practically identical to the terminology of external control device based on their respective functional descriptions serving as an interface between a user and a power loading and control circuitry of a lighting device yet the term of external control device is more universal and simple terminology commonly used in the electrical industry. Accordingly the message carrying sensing signal can also be reworded as the external control signal for purpose of simplification.

A key technology of the present invention involves an electronic switch using a microcontroller with program codes to receive, interpret and execute an external control signal outputted by an external control device to control performances of lighting characteristics including at least a light color temperature of an LED lamp. The LED lamp comprises a first LED lighting load emitting light with a low light color temperature electrically connected to a first controllable switching device and a second LED lighting load emitting light with a high light color temperature electrically connected to a second controllable switching device, wherein the low color temperature can be designed with any value or within any subrange in a range between 2000K and 3000K, and the high color temperature can be designed with any value or within any subrange in a range between 4000K and 6500K. The first controllable switching device and the second controllable switching device are respectively coupled with the microcontroller. The microcontroller upon receiving the external control signal accordingly activates a corresponding subroutine to output a first control signal and a second control signal to respectively control a conduction rate of the first controllable switching device and a conduction rate of the second controllable switching device to respectively transmit electric powers to the first LED lighting load and the second LED lighting load such that a mingled light colour temperature thru a light diffuser of the LED lamp is thereby determined according to a programmed combination of conduction rates of the first controllable switching device and the second controllable switching device. The external control device serves as an interface between human and the electronic switch to output the external control signal readable and interpretable to the microcontroller. The external control device may be configured as a touchless interface or as a direct touch interface. The touchless interface may be implemented by a wireless method to receive a wireless external control signal and convert the wireless external control signal into the external control signal readable and interpretable to the microcontroller. The wireless external control signal can be transformed from a motion signal generated with an infrared ray motion sensor, or it can be an electromagnetic wireless signal generated with a wireless transmitter, or it can be transformed from a voice signal generated with an A.I. (artificial intelligence) based device. The direct touch interface on the other hand uses a wired method to generate the external control signal set by a user, wherein the external control signal can be generated from a push button, a touch pad, a voltage divider, a power interruption switch or a conduction rate of a phase controller set by the user, wherein, if the external control signal is an analogue signal, a conversion circuitry may be included in the external control device or programmed and embedded in the microcontroller to convert the analogue signal into a digital signal readable and interpretable to the microcontroller.

As a summary, the present invention teaches a method of performing a diffused light color temperature tuning process for an LED lighting device. The method includes using at least two sets of LED loads emitting lights with different light color temperatures to be covered by a light diffuser to form a light-emitting unit to generate a diffused light with a diffused light color temperature, using a power allocation circuitry to execute a power allocation algorithm to manage a power allocation between the two LED lighting loads or between any selected pairs of multiple LED lighting loads of a light-emitting unit to configure a diffused light color temperature switching scheme and using an external control device to operate a pick and play process for selecting a diffused light color temperature performance in the diffused light color temperature switching scheme.

A diffused light color temperature tuning formula for determining the diffused light color temperature CTapp, wherein CTapp is originally named as the apparent color temperature of diffused lights of two lighting loads thru the light diffuser, as depicted in the present invention and recited below represents a common platform for configuring any diffused light color temperature tuning scheme using at least two LED lighting loads emitting lights with at least two different light color temperatures respectively expressed by CT2$a$ and CT2$b$:

$$CTapp = CT2a \cdot X/(X+Y) + CT2b \cdot Y/(X+Y)$$
$$= CT2a \cdot R1 + CT2b \cdot R2,$$
$$\text{with } 0 \leq R1 \leq 1, 0 \leq R2 \leq 1 \text{ and } R1 + R2 = 1$$

wherein R1=X/(X+Y) represents a ratio of a total electric power allocated to the first LED lighting load and R2=Y/(X+Y) represents the ratio of the total electric power allocated to the second LED lighting load. If we further combine the formula R1+R2=1 with the formula CTapp=R1·CT2$a$+R2·CT2$b$ and operate a couple steps of calculations, a different algorithm respectively for calculating R1 and R2 can be derived in relation to CT2$a$, CT2$b$ and CTapp as follows;

$$R1=(CT2b-CTapp)/(CT2b-CT2a),$$

with R2=1−R1 or $$R2=(CTapp-CT2a)/(CT2b-CT2a),$$

with R1=1−R2.

While the original formula CTapp=R1·CT2$a$+R2·CT2$b$ may serve to demonstrate and prove an effect of the diffused light color temperature of CTapp with given R1, R2, CT2$a$ and CT2$b$, it would require a circuit engineer to use a try and error approach to ultimately identify adequate values of R1 and R2 for achieving a desired diffused light color temperature CTapp.

The above two algorithms respectively for calculating R1 and R2 provide a quick estimation of different power allocation ratios to be used for designing and organizing a diffused light color temperature switching scheme with given CT2$a$, CT2$b$ and different desired values of CTapp. For instances, when CT2$a$=3000 K (Kelvins) and CT2$b$=5000 K (Kelvins) are respectively used for constructing the first LED lighting load and the second LED lighting load, wherein if a diffused light color temperature CTapp at 3750 K is desired, then R1=(CT2$b$−CT app)/(CT2$b$−CT2$a$)= (5000K−3750 K)/(5000K−3000 K)=0.625 and consequently R2=1−R1=1−0.625=0.375, wherein if a diffused light color temperature CTapp at 3000 K is desired, then R1=(CT2$b$−CT2$a$)/(CT2$b$−CT2$a$)=1 and R2=0, wherein if a diffused light color temperature at 5000 K is desired, then R1=0 and R2=1 according to the two algorithms.

The core value of the present invention is the above depicted common platform for configuring and performing any diffused light color temperature switching scheme. Although there are many different embodiments for designing a power allocation circuitry for executing the power allocation algorithm, the present invention is not restricted or limited to any specific power allocation circuitry for operating any diffused light color temperature tuning scheme.

When the power allocation circuitry is configured with a microcontroller, the power allocation ratios R1 and R2 respectively represent a first conduction rate of a first semiconductor switching device electrically connected between a switching circuitry and a first LED lighting load and a second conduction rate of a second semiconductor switching device electrically connected between the switching circuitry and a second LED lighting load, wherein the microcontroller outputs a first control signal to control the first conduction rate of the first semiconductor switching device for delivering a first electric power to the first LED lighting load to emit a light with a low light color temperature and a second control signal to control the second conduction rate of the second semiconductor switching device for delivering a second electric power to the second LED load to emit a light with a high light color temperature such that a diffused light with a diffused light color temperature is generated thru a diffuser covering the first LED lighting load and the second LED lighting load, wherein for tuning the diffused light color temperature to a lower diffused light color temperature, the microcontroller upon receiving an external control signal from an external control device operates to increase the first conduction rate of the first semiconductor switching device to increase the first electric power delivered to the first LED lighting load and at the same time operates to decrease the second conduction rate of the second semiconductor switching device to decrease the second electric power delivered to the second LED lighting load with the same pace such that a total electric power T delivered to the light-emitting unit or a total light intensity of the light-emitting unit thru the diffuser remains essentially unchanged; wherein for tuning the diffused light color temperature to a higher diffused light color temperature, the microcontroller upon receiving the external control signal from the external control device operates to decrease the first conduction rate of the first semiconductor switching device to decrease the first electric power delivered to the first LED lighting load and at the same time operates to increase the second conduction rate of the second semiconductor switching device to increase the second electric power delivered to the second LED lighting load with the same pace such that the total electric power T delivered to the light-emitting unit or a total light intensity of the light-emitting unit thru the diffuser remains essentially unchanged. The first semiconductor switching device, the second semiconductor switching device and the microcontroller may be further integrated in an ASIC (application specific integrated circuit) as an LED driver, a constant current control circuit may also be integrated to serve a constant current driver.

The power allocation circuitry may not need a microcontroller to execute the power allocation algorithm. Instead a selection switch may serve similar functions as the microcontroller for executing the power allocation algorithm though a microcontroller has more advantages than a selection switch in terms of energy saving, color temperature tuning variety and operation safety. The power allocation circuitry in such case is often configured to operate with a plurality of loading options respectively corresponding to different combinations of a plurality of LED lighting loads to be connected with the switching circuitry controlled by the selection switch. For instance, when the light emitting unit is composed of at least two LED lighting loads including a first LED lighting load with a first light color temperature and a second LED lighting load with a second light color temperature, wherein the second light color temperature is higher than the first light color temperature, the power allocation circuitry for operating the at least two LED lighting loads can be designed to optionally perform a diffused light color temperature switching scheme with two different diffused light color temperature performances or a diffused light color temperature switching scheme with three different diffused light color temperature performances. For configuring the diffused light color temperature switching scheme with two diffused light color temperature performances, the loading options include a first loading option with only the first LED lighting load being connected to the switching circuitry, namely R1=1 and R2=0, to perform a first diffused light color temperature and a second loading option with only the second LED lighting load being connected to the switching circuitry, namely R1=0 and R2=1, to perform a second diffused light color temperature, wherein the second diffused light color temperature is higher than the first diffused light color temperature. For configuring the diffused light color temperature switching scheme with three diffused light color temperature switching performances, a third loading option is added with both the first LED lighting load and the second LED lighting load being jointly connected to the switching circuitry to share the total electric power from the switching circuitry, namely R1+R2=1, to perform a medium diffused light color temperature in a range between the first diffused light color temperature and the second diffused light color temperature, namely CT1<CTapp<CT2.

Similarly, when a light emitting unit is composed of three LED lighting loads including a first LED lighting load emitting light with a first light color temperature or a low light color temperature, a second LED lighting load emitting light with a second light color temperature or a medium light color temperature and a third LED lighting load emitting light with a third light color temperature or a high light color temperature, wherein the third light color temperature is higher than the second light color temperature and the second light color temperature is higher than the first light color temperature, the diffused light color temperature tuning formula can be configured as follows:

$$CTapp=CT2a \cdot X/(X+Y+Z)+CT2b \cdot Y/(X+Y+Z)+CT2c \cdot Z/(X+Y+Z)$$

wherein CTapp is the diffused light color temperature of an illumination of the light-emitting unit thru the light diffuser, $CT2a$ is the first light color temperature of the first LED lighting load powered by an electric power X, $CT2b$ is the second light color temperature of the second LED lighting load powered by an electric power Y and $CT2c$ is the third light color temperature of the third LED lighting load powered by an electric power Z, wherein $CT2a$, $CT2b$ and $CT2c$ are also respectively represented as CT1, CT2 and CT3, wherein (X+Y+Z) represents a total electric power T delivered to the light-emitting unit; wherein X/(X+Y+Z)= R1 represents a power allocation ratio of the total electric power T allocated to the first LED lighting load, Y/(X+Y+Z)=R2 represents the power allocation ratio of the total electric power T allocated to the second LED lighting load and $Z/(X+Y+Z)=R3$ represents the power allocation ratio of the total electric power T allocated to the third LED lighting load, the diffused light color temperature tuning formula is therefore identically expressed as $$CTapp=CT1 \cdot R1+CT2 \cdot R2+CT3 \cdot R3$$

with $0 \leq R1 \leq 1$, $0 \leq R2 \leq 1$, $0 \leq R3 \leq 1$ and $R1+R2+R3=1$;

The power allocation circuitry for operating the three LED lighting loads can be designed to optionally perform a diffused light color temperature switching scheme with three different diffused light color temperature performances or a diffused light color temperature switching scheme with five different diffused light color temperature performances. For configuring the diffused light color temperature switching scheme with three different diffused light color temperature performances, the loading options include a first loading option with only the first LED lighting load being connected to the switching circuitry thru operating the selection switch, namely $R1=1$ and $R2=R3=0$ to generate a low diffused light color temperature with $CTapp=CT1$, a second loading option with only the second LED lighting load being connected to the switching circuitry thru operating the selection switch, namely $R2=1$ and $R1=R3=0$ to generate a medium diffused light color temperature with $CTapp=CT2$, and a third loading option with only the third LED lighting load being connected to the switching circuitry thru operating the selection switch, namely $R3=1$ and $R1=R2=0$ to generate a high diffused light color temperature with $CTapp=CT3$. For configuring the diffused light color temperature switching scheme with five diffused light color temperature performances the loading options include a first loading option with only the first LED lighting load being connected to the switching circuitry thru operating the selection switch, namely $R1=1$ and $R2=R3=0$, to generate the low diffused light color temperature with $CTapp=CT1$, a second loading option with both the first LED lighting load and the second LED lighting load being jointly connected to the switching circuitry thru opening the selection switch, namely $R1+R2=1$, and $R3=0$ to generate a low-medium diffused light color temperature with $CT1<CTapp<CT2$, a third loading option with only the second LED lighting load being connected to the switching circuitry thru operating the selection switch, namely $R2=1$ and $R1=R3=0$, to generate a medium diffused light color temperature with $CTapp=CT2$, a fourth loading option with both the second LED lighting load and the third LED lighting load being jointly connected to the switching circuitry thru operating the selection switch, namely $R1=0$ and $R2+R3=1$, to generate a high-medium diffused light color temperature with $CT2<CTapp<CT3$, and a fifth loading option with only the third LED lighting load being connected to the switching circuitry thru operating the selection switch, namely $R3=1$ and $R1=R2=0$, to generate a high diffused light color temperature with $CTapp=CT3$.

Furthermore, the power allocation circuitry may be configured with at least one resistor being electrically connected to at least one of the first LED lighting load emitting light with a low light color temperature and the second LED lighting load emitting light with a high light color temperature, wherein the at least one resistor is designed to control a distribution of a constant current electric power from the switching circuitry, wherein if the first LED lighting load is connected with the at least one resistor, the electric power allocated to the first LED lighting load will be less than the electric power allocated to the second LED lighting load such that a diffused light color temperature with such configuration will generate a high-medium diffused light color temperature in a range between the high diffused light color temperature and the medium diffused light color temperature, wherein if the at least one resistor is electrically connected to the second LED lighting load, the electric power allocated to the first LED lighting load will be higher than the electric power allocated to the second LED lighting load with an effect that the diffused light color temperature so configured will generate a low-medium diffused light color temperature in a range between the low diffused light color temperature and the medium diffused light color temperature. With such arrangement the light-emitting unit with three LED lighting loads with different light color temperatures can be configured to perform at least five different diffused light color temperatures including the low diffused light color temperature, the low-medium diffused light color temperature, the medium diffused light color temperature, the high-medium diffused light color temperature and the high diffused light color temperature.

Lastly the above disclosed diffused light color temperature tuning formulas for calculating a blended effect of light color temperature with two or three LED lighting loads with different light color temperatures to form a light-emitting unit are invented on an optical foundation of using a weighted average of brightness contribution ratio from each of the two or three member LED lighting loads with different light color temperatures in the total lumens outputted by the light-emitting unit thru a diffuser and the brightness contribution ratio is measured by the lumens output from a member LED lighting load divided by the total lumens outputted by all member LED loads. Specifically, if the lumens per watt for the first LED load is $L1$, for the second LED load is $L2$ and for the third LED load is $L3$, the brightness contribution ratio for the first LED lighting load is equal to $B1=L1 \cdot X/(L1 \cdot X+L2 \cdot Y)$ and the brightness contribution ratio for the second LED lighting load is $B2=L2 \cdot Y/(L1 \cdot X+L2 \cdot Y)$. Now, if we define a lumens efficiency ratio $K1$ being equal to $L1/L2=K1$ meaning the lumens per watt of the low light color temperature LED divided by the lumens per watt of the high light color temperature LED, the two brightness contribution ratios can be rewritten as $B1=K1 \cdot X/(K1 \cdot X+Y)$ and $B2=Y/(K1 \cdot X+Y)$, then consequently an adjusted diffused light color temperature tuning formula can be expressed as $CTaapp=CT2a \cdot B1+CT2b \cdot B2$ or equivalently $$CTaapp=CT2a \cdot K1 \cdot X/(K1 \cdot X+Y)+CT2b \cdot Y/(K1 \cdot X+Y)$$

wherein CTaapp is the adjusted diffused light color temperature using weighted brightness contribution ratios to come out a blended light color temperature thru the diffuser, wherein if $K1=1$ meaning the lumens per watt of the first LED load is equal to the lumens per watt of the second LED load, then $B1=R1$, $B2=R2$ and $CTaapp=CTapp=CT2a \cdot R1+CT2b \cdot R2=CT2a \cdot X/(X+Y)+CT2b \cdot Y/(X+Y)$.

If the lumens per watt of the first LED load is different from the lumens per watt of the second LED lighting load, the power allocation ratio is not equal to the brightness ratio, then the diffused light color temperature is required to be calculated according the adjusted diffused light color temperature tuning formula. Presently, the lumens per watt for 5000 K LED is universally at 100 lumens per watt from all LED manufacturers and the lumens per watt for 3000K LED varies from 90 lumens to 95 lumens from different manufacturers with an average at 92.5 watt. To reflect such difference of brightness per watt between the low light color temperature 3000K and the high light color temperature 5000 K, the lumens efficiency ratio $K1$, defined as lumens per watt of the low light color temperature divided by the lumens per watt of the high light color temperature, is applied to the first wattage X in the above described formulas, wherein K1 ranges between 0.9 and 1, namely 0.9≤K1≤1, wherein B1 which represents an adjusted power allocation ratio R1 or a brightness contribution ratio is then modified as R1a=B1=X·K1/(X·K1+Y), R2a which represents an adjusted power allocation ratio R2 or the brightness contribution ratio is then rewritten as R2a=B2=Y/(X·K1+Y), consequently an adjusted diffused light color temperature is rewritten as CT aapp=CT1·R1a+CT2·R2a=CT1·(X·K1)/(X·K1+Y)+CT2·Y/(X·K1+Y).

By the same principles for a light-emitting unit comprising three LED loads respectively emitting light with a low light color temperature (3000K), a medium light color temperature (4000K) and a high light color temperature (5000K), an adjusted power allocation ratio due to descriptions of lumens per watt of the low light color temperature LED is provided as follows:

$R1a=X·K1/(X·K1+Y·K2+Z)$ $R2a=Y·K2/(X·K1+Y·K2+Z)$ $R3a=Z/(X·K1+Y·K2+Z)$

Accordingly, CT aapp=CT1·R1a+CT2·R2a+CT3·R3a, wherein K2, defined as lumens per watt of the medium light color temperature LED divided by the lumens per watt of the high light color temperature LED, is applied to the second electric power Y in the above described formulas, wherein K2 ranges between 0.9 and 1, namely 0.9≤K2≤1.

Although the above complicated formulas represent what a precise value of a diffused light color temperature needs to be calculated, in reality there is no practical need to go with such more complicated calculations because a deviation between using CTapp formula and the CT aapp formula for calculating a diffused light color temperature is negligibly small being under 1% difference for which the human eyes can't really sense the difference.

The following table shows calculated values of CTapp and CTaapp for ten combinations of power allocations for a 10 watt LED light comprising a first LED lighting load with a 3000 K light color temperature and a second LED lighting load with a 5000 K light color temperature. According to the below table the deviations for ten combinations of different power allocations are all within 1% variation ranging 0%~0.96%. Based on the calculated data, it appears a more simple diffused light color temperature tuning formula CT app=CT2a·X/(X+Y)+CT2b·Y/(X+Y) serves a practical need better than a complicated adjusted diffused light color temperature tuning formula CTaapp=CT2a·(X·K1)/(X·K1+Y)+CT2b·Y/(X·K1+Y) does as the light color temperature differences are all below 1% which is not sensible by human eyes. In conclusion, the formula CTaapp provides a technical foundation for the present disclosure while the formula CTapp can better satisfy a practical need as the ending diffused light color temperatures from are essentially of no difference. Both CTapp formula and CTaapp are good for serving as a diffused light color temperature tuning algorithm.

| POWER ALLOCATION | | VALUE/ CTapp | VALUE/ CTaapp | |
|---|---|---|---|---|
| 3000K | 5000K | K1 = 1 | K1 = 0.925 | DEVIATION |
| 0 watt. | 10 Watt | 5000K | 5000K | 0 % |
| 1 watt. | 9 Watt | 4800K | 4814K | 0.29% |
| 2 watt. | 8 Watt | 4600K | 4624K | 0.52% |
| 3 watt. | 7 Watt | 4400K | 4432K | 0.72% |
| 4 watt. | 6 Watt | 4200K | 4237K | 0.88% |
| 5 watt. | 5 Watt | 4000K | 4038K | 0.94% |
| 6 watt. | 4 Watt | 3800K | 3837K | 0.96% |
| 7 watt. | 3 Watt | 3600K | 3633K | 0.91% |
| 8 watt. | 2 Watt | 3400K | 3425K | 0.73% |
| 9 watt. | 1 Watt | 3200K | 3214K | 0.44% |
| 0 watt. | 10 Watt | 3000K | 3000K | 0% |

It is to be noticed that when the lumens per watt of the 3000 K LED load is lower than the lumens per watt of the 5000 K LED load, the weighted brightness of the LED light can actually be different from an expected lumens level, though such deviations may not be quite sensible by human eyes. For example, when only the 3000 K LED load is connected to the switching circuitry, a total lumens outputted by the light-emitting unit thru the diffuser is actually 925 lumens while when only the 5000 K LED load is connected to the switching circuitry, the total lumens outputted by the light-emitting unit thru the diffuser is 1000 lumens. When both the 3000 K LED load and the 5000 K LED load are connected, the weighted brightness may also be deviated from an expected lumens level in view of the lumens per watt being slightly different between the 3000 K LED load and the 5000 K LED load and the nonlinear V-I curve of an LED chip may also impact the power distribution between the 3000 K LED load and the 5000 K LED load within a small range which is not sensible by human eyes. It is therefore more appropriate when describing the light color temperature tuning process to use that a total light intensity remains essentially unchanged while the light color temperature is adjusted by the algorithm of power allocation process.

Figure 12:
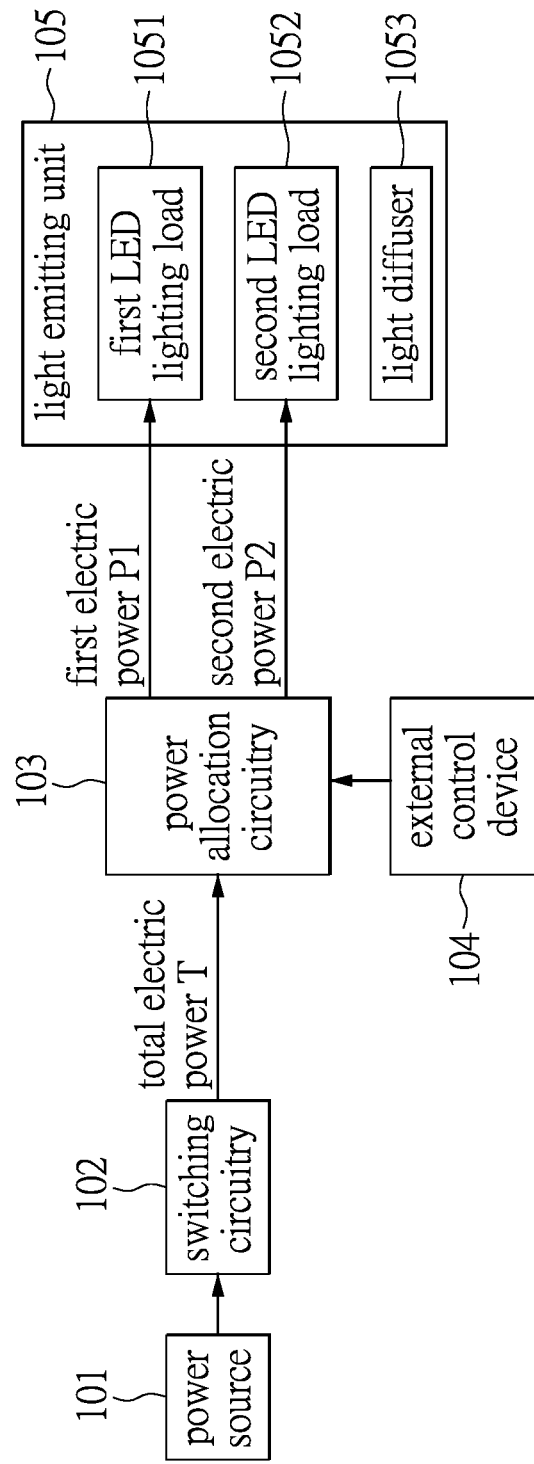
FIG. 12 is a schematic block diagram showing a technical platform for configuring and operating a light color temperature tuning and switching scheme of an LED lighting device using at least two LED lighting loads emitting lights with different light color temperatures.

Shown in FIG. 12 is a schematic block diagram of the method disclosed in the present invention, which provides a common platform for designing and configuring any light color temperature switching scheme for an LED lighting device, wherein a switching circuitry 102 outputs a DC power T to a power allocation circuitry 103, wherein the power allocation circuitry 103 working in conjunction with a diffused light color temperature tuning algorithm and an external control device 104 operates to execute the diffused light color temperature switching scheme.

Also shown in FIG. 12-1 is an embodiment of FIG. 12, wherein the power allocation circuitry 103 comprises three loading options 1031, 1032, 1033 to be optionally connected to the switching circuitry 102 for receiving a constant current power T for generating different diffused light color temperature performances according to the diffused light color temperature switching scheme.

Also shown in FIG. 12-2 is another embodiment of FIG. 12, wherein the power allocation circuitry 103 comprises a controller 1035, a first semiconductor conductor switching device 1034 and a second semiconductor switching device 1036, wherein the controller 1035 outputs control signals to control a first conduction rate of the first semiconductor switching device 1034 and a second conduction rate of the second semiconductor switching device 1036 to execute a reverse yet complementary power adjustment process between a first electric power P1 delivered to the first LED load 1051 emitting light with the low color temperature and a second electric power P2 delivered to the second LED load 1052 emitting light with the high color temperature such that a total light intensity remains essentially unchanged while a diffused light color temperature thru a light diffuser 1053 of the light-emitting unit 105 can be adjusted according to the diffused light color temperature tuning algorithm and operated by an external control device.

The power dimming circuitry, the power loading circuitry or the power allocation circuitry, whichever name is selected to use, has the same technical meaning when the electric load is a lighting load. However, if the electric load is an electric motor, then the term of dimming circuitry may not be as adequate as the term of power loading circuitry and the term of power allocation circuitry because it sounds confusing to dim an electric motor. Also, when there is only one electric load installed in a lighting circuitry the term of power loading circuitry and the term of power allocation circuitry are adequate to use; in the old days some 120 years ago when there were no electronic switches available an electric engineer could only use electric switches either configured with an adjustable resistor or with an adjustable load to control and divide the input power between a power delivered to the electric load and a power consumed by the adjustable resistor, in such situations the term of power allocation circuitry appears to be more adequate than the power loading circuitry; however, when there are two electric loads electrically connected to share a power input such that the total power consumption of the system remains unchanged, the term of power allocation circuitry is best qualified name for describing the function of dividing and delivering an input power respectively to at least two loads. With the above being said, the term of power allocation circuitry is a more universal name to use regardless the electric load being a light bulb or an electric motor, regardless the electric circuitry being a single load circuit or a multiple load circuit or regardless the switching device being an electric switch or an electronic switch.

The power allocation circuitry is the most important technology in the lighting industry. Two hundred years ago when there were no electric lamps available on the earth and people had to use gas lights, oil lamps or candle lamps for night time illumination. Over the past 200 years the lighting industry has rapidly evolved from a crude and primitive industry to a highly sophisticated industry thanks to the various lighting technologies invented and developed during such period including electric bulbs and various lighting control devices. To avoid any misunderstanding of some long invented devices and technologies being misinterpreted as lack of support, it is necessary to provide an introduction of the evolution history of the power allocation technologies.

The evolution history of the dimming technology, the power loading technology or the power allocation technology, whichever name is to be called, for the past 120 years can be divided into three time stages with a first time stage being a first time period going backward to year 1907 before the vacuum tube was invented, during such first time period "electric switches" such as using an adjustable resistor (FIG. 13-1) as a switching element to operate a resistor divided process for configuring the dimming or the power allocation circuitry, or using a dividable electric load (FIGS. 13-2, 13-3, 13-4 and 13-5) as a switching element to operate a load divided process for configuring the dimming or the power allocation circuitry were the main stream technologies for managing the power allocation or dimming performance; a second time stage is a second time period from year 1907 thru year 1960 with the vacuum tube being invented to become a main stream switching element working in conjunction with a control circuit to form an "electronic switch" for managing the power allocation or dimming performance and then a third time stage is a third time period from year 1961 up to the present with the semiconductor transistor being invented to replace the vacuum tube to be a much more power efficient switching element, during such third time period the semiconductor transistor has unbelievably evolved into a highly sophisticated electronic device thru continuous breakthrough of micro miniature technologies. Currently with the same size of the originally invented semiconductor chip containing only one semiconductor transistor it can now contain millions of semiconductor transistors. With the above being said, both the electric switches and the electronic switches are very long established ordinary skills with the electric switches being at least 120 years old and the electronic switches being at least 60 years.

During the first time stage the switching elements used were the adjustable resistor or the dividable load to create a multi-way switching element for performing different power loading options. The switching element using the adjustable resistor and the switching element using the dividable load are collectively referred as "electric switches" (as shown in FIG. 13-1, FIG. 13-2, FIG. 13-3, FIG. 13-4 and FIG. 13-5) which use basic technologies taught in school including an external control device configured with a selection switch comprising a plurality of switching positions to be operated by a user to activate different power loading options thru different corresponding electrical contact point. Such basic technologies are long established conventional arts having been invented and used by the electrical industry for at least 120 years; during the second time stage the switching element used was the vacuum tube electrically coupled with a control circuit to form a power allocation circuitry and during the third time stage the vacuum tube was replaced by the semiconductor transistor to become the main stream switching element for configuring the dimming, the power loading or the power allocation circuitry, both the vacuum tube with the control circuit and the semiconductor transistor with the control circuit are collectively referred as "electronic switches".

Both the electric switches and the electronic switches are long established conventional arts having been used in the industry for a long history with the electric switches being at least 120 years old technologies and the electronic switches being at least 60 years old technologies. To prove the electric switches as described are 120-year old conventional arts please refer to Wikipedia.com for information and definitions of three-way two-circuit switches, three-way lamp, three-way bulb and three-way socket, wherein all necessary implementing skills including the power allocation circuitry, the external control device configured with a selection switch comprising a plurality of switching positions electrically connected to different contact points of the switching element are employed to configure the three-way lamp. Additionally, please also refer to the disclosures of both the electric switch and electronic switch recited in the specification from line 24 thru line 48 under column 1 of the prior granted patent '503 describing the structural comparisons between the electric switch and the electronic switch. Therefore, the electric switch, the electronic switch and their respective applications are adequately supported by the disclosure recited under the Background section in the specification.

With the above being said, the electric switches, the electronic switches and their respective implementing components and methods are conventional arts well known to people skilled in the art, therefore they do not need to be disclosed in detail.

Please refer to FIG. 13-1, FIG. 13-2, FIG. 13-3, FIG. 13-4 and FIG. 13-5, which represent various power allocation circuitries configured with different electric switches for controlling a power loading or power allocation to an electric load; wherein FIG. 13-1 is a schematic diagram of a power allocation circuitry comprising a three-way electric switch configured with an adjustable resistor as switching element for operating three power loading options to a light-emitting unit; wherein FIG. 13-2 is a schematic diagram of another power allocation circuitry comprising a two-way electric switch configured with two divided loads and a switching element for operating two power loading options to a light-emitting unit; wherein FIG. 13-3 is a schematic diagram of another power allocation circuitry comprising a three-way electric switch configured with two divided loads and a switching element for operating three power loading options to a light-emitting unit; wherein FIG. 13-4 is a schematic diagram of another power allocation circuitry comprising a three-way electric switch configured with three divided loads and a switching element for operating three power loading options to a light-emitting unit; and wherein FIG. 13-5 is a schematic diagram of another power allocation circuitry comprising a five-way electric switch configured with three divided loads and a switching element for operating five power loading options to a light-emitting unit.

FIG. 13-1 is an electric switch based dimming, power loading circuitry or power allocation circuitry configured with an electric load L which could be a lighting load or an electric motor, a switching element comprising an adjustable resistor Ra (the dimmer) designed with a plurality of contact points for selecting different lengths of the resistor Ra to respectively control different power loading options to the electric load L, and an external control device being a selection switch designed with a plurality of switching positions respectively connected to each of the contact points of the switching element (the adjustable resistor Ra) to enable a user to select a power loading option by operating a switching position to connect a power source VT to a corresponding contact point for delivering a power allocation to the electric load L. This multilevel switching technology operated with a single circuit was the main stream skill popularly used in the electrical industry before the invention of the electronic device vacuum tube in year 1907. Light dimming using an adjustable resistor has existed for at least 120 years and is a very old conventional art well known to people skilled in the art.

FIG. 13-2 is another electric switch based dimming circuitry configured with a dividable electric load L being composed of a first load L1 and a second load L2 electrically connected in parallel; a two-way switching element electrically installed between a power source VT and the electric load L to operate two power loading options; and an external control device being a selection switch configured with at least two switching positions respectively and electrically connected to at least two electrical contact points to respectively activate a corresponding power loading option of the switching device; wherein when a first switching position is operated by the user, the power source VT is electrically connected to only the first load L1 thru a first contact point to activate the first power loading option delivered to the electric load L, wherein when a second switching position is operated by the user, the power source VT is electrically connected to the second load L2 thru a second contact point to activate the second power loading option delivered to the electric load L. The selection switch is often designed with one extra switching position being a third switching position, wherein when the third switching position is operated the power source VT is disconnected from the electric load L to turn off the light.

FIG. 13-3 is another electric switch based dimming circuitry configured with a dividable electric load L being composed of a first load L1 and a second load L2 electrically connected in parallel; a three-way switching element electrically installed between a power source VT and the electric load L to operate three power loading options; and an external control device being a selection switch configured with at least three switching positions respectively and electrically connected to at least three electrical contact points to respectively activate a corresponding power loading option of the switching device; wherein when a first switching position is operated by the user, the power source VT is electrically connected to only the first load L1 thru a first contact point to activate the first power loading option delivered to the electric load L, wherein when a second switching position is operated by the user, the power source VT is electrically connected to both the first load L1 and the second load L2 thru a second contact point to activate the second power loading option delivered to the electric load L and wherein when a third switching position is operated by the user, the power source VT is electrically connected to the second load L2 thru a third contact point to activate the third power loading option to the electric load L. The selection switch is often designed with one extra switching position being a fourth switching position, wherein when the fourth switching position is operated the power source VT is disconnected from the electric load L to turn off the light.

FIG. 13-4 is another electric-switch based dimming circuitry configured with a dividable electric load L being composed of three divided loads including a first load L1, a second load L2 and a third load L3 electrically connected in parallel, a three-way switching element electrically installed between a power source VT and the electric load L to operate three power loading options including a first power loading option to connect the power source VT to the first load L1, a second power loading option to connect the power source VT to the second load L2 and a third power loading option to connect the power source VT to the third load L3, and an external control device being a selection switch configured with at least three switching positions respectively and electrically connected to at least three electrical contact points to respectively activate a corresponding power loading option of the switching element; wherein when a first switching position is operated by the user, the power source VT is electrically connected to only the first load L1 thru a first contact point to activate the first power loading option delivered to the electric load L, wherein when a second switching position is operated by the user, the power source VT is electrically connected to the second load L2 thru a second contact point to activate the second power loading option delivered to the electric load L and wherein when a third switching position is operated by the user, the power source VT is electrically connected to the third load L3 thru a third contact point to activate the third power loading option to the electric load L. The selection switch is often designed with one extra switching position being a fourth switching position, wherein when the fourth switching position is operated the power source VT is disconnected from the electric load L to turn off the light.

FIG. 13-5 is configured with a dividable electric load L being composed of three divided loads including a first load L1, a second load L2 and a third load L3 electrically connected in parallel, a five-way switching element electrically installed between a power source VT and the electric load L to operate five power loading options including a first power loading option to connect the power source VT to the first load L1, a second power loading option to connect the power source VT to both the first load L1 and the second load L2, a third power loading option to connect the power source VT to the second load L2, a fourth power loading option to connect the power source VT to both the second load L2 and the third load L3 and a fifth power loading option to connect the power source VT to the third load L3, and an external control device being a selection switch configured with at least five switching positions respectively and electrically connected to at least five electrical contact points to respectively activate a corresponding power loading option of the switching element; wherein when a first switching position is operated by the user, the power source VT is electrically connected to only the first load L1 thru a first contact point to activate the first power loading option, wherein when a second switching position is operated by the user, the power source VT is electrically connected to both the first load L1 and the second load L2 thru a second contact point to activate the second power loading option, wherein when a third switching position is operated by the user, the power source VT is electrically connected to the second load L2 thru a third contact point to activate the third power loading option, wherein when a fourth switching position is operated by the user, the power source VT is electrically connected to both the second load L2 and the third load L3 thru a fourth contact point to activate the fourth power loading option, wherein when a fifth switching position is operated by the user, the power source VT is electrically connected to the third load L3 thru a fifth contact point to activate the fifth power loading option. The selection switch is often designed with one extra switching position being a sixth switching position, wherein when the sixth switching position is operated the power source VT is disconnected from the electric load L to turn off the light.

Such dimming or power allocation circuitries configured with a multi way electric switch to operate a single load (FIG. 13-1), twin loads (FIG. 13-2, FIG. 13-3) or triple loads (FIG. 13-4, FIG. 13-5) to activate different power loading options for performing a dimming or a power allocation function for an electrical apparatus are more than 120-year old conventional arts; the composing elements including external control device, selection switch, switching positions, electrical contact points, switching element, multi-way switching device are conventional arts well known to people skilled in the art, therefore they do not need to be disclosed in detail.

The color temperature tuning technology of the present invention is built on a technical foundation of blending two LED light color temperatures respectively generated from two reversely operated dimming or power allocation circuitries comprising two LED loads emitting light with different light color temperatures thru a light diffuser according to a software algorithm including a color temperature tuning formula and a total power control formula; wherein when a first power allocated to a first LED load emitting light with a first color temperature is increased, a second power allocated to a second LED load is correspondingly and proportionally decreased, or vice versa, such that the total light intensity in terms of lumens remains unchanged while the blended color temperature of the lighting device can be successfully tuned. With the above being said, a color temperature tuning circuitry needs to be configured with at least two LED loads emitting lights with different light color temperatures and it is impossible to configure a color temperature tuning circuitry with only one LED load. Other than that, the circuit structure of a color temperature tuning circuitry configured with two LED loads with different color temperatures is identical to the circuit structure of the three-way lamp configured with two LED loads with same color temperature for performing three different light intensities.

Please refer to FIG. 16-1, FIG. 16-2, FIG. 16-3, FIG. 16-4 and FIG. 16-5 in light of FIG. 13-1, FIG. 13-2, FIG. 13-3, FIG. 13-4 and FIG. 13-5, which represent 5 different embodiments of the color temperature tuning technology;

FIG. 16-1 is built on a technical foundation of using two reversely operated dimming circuitries of FIG. 13-1 electrically connected in parallel to a constant current power source VT, at least one of the two reversely operated dimming circuitries is designed with an adjustable resistor Ra installed between the constant current power source VT and an electric load L1 or L2 emitting lights with different light color temperatures, by adjusting the at least one adjustable resistor Ra, the power levels respectively allocated to the two load L1 and L2 can be varied to create different blended light color temperatures thru a diffuser. In this color temperature tuning embodiment of FIG. 16-1, the resistor based dimming circuitry and its composing elements are conventional arts of the long established electric switches configured with ordinary skills having been used for more than 120 years as shown in the FIG. 13-1.

FIG. 16-2 is identical to FIG. 13-2 in term of circuit structure except the two LEDs are specifically designed with two different light color temperatures CT1 and CT2 for forming a color temperature tuning circuitry; wherein the power allocation circuitry is configured with a two way electric switch to operate at least two loading options, wherein the selection switch of the external control device is designed with two switching positions connecting to two contact points of the two way electric switch and the two way electric switch is designed to operate two loading options thru connecting the two contact points respectively; wherein when the first switching position is operated by the user, the constant current power source VT is delivered to only the first load L1 thru the first contact point to activate the first power loading option and a first diffused light color temperature CTapp=CT1 is therefore generated according to the color temperature tuning formula CTapp=X/(X+Y)CT1+Y/(X+Y)CT2=X/(X+0)CT1+0/(X+0)CT2=CT1; and wherein when the second switching position is operated by the user, the power source VT is electrically connected only to the second load L2 thru the second contact point to activate the second power loading option to generate a second diffused light color temperature, namely CTapp=CT2 according to the color temperature tuning formula CTapp=X/(X+Y)CT1+Y/(X+Y)CT2=0/(0+Y)CT1+Y/(0+Y)CT2=CT2.

FIG. 16-3 is identical to FIG. 13-3 in terms of circuit structure except the two LED loads are specifically designed with two different light color temperatures namely CT1 and CT2 for forming a color temperature tuning circuitry; wherein the power allocation circuitry is configured with a three-way electric switch to operate at least three loading options, wherein the selection switch of the external control device is designed with three switching positions respectively and electrically connected to three contact points of the three-way electric switch; wherein when the first switching position is operated by the user, the constant current power source VT is electrically connected to only the first load L1 thru the first contact point to activate the first power loading option delivered to the electric load L1 and a first diffused light color temperature CTapp=CT1 is therefore generated according to the color temperature tuning formula CTapp=X/(X+Y)CT1+Y/(X+Y)CT2=X/(X+0)CT1+0/(X+0)CT2=CT1; wherein when the second switching position is operated by the user, the power source VT is electrically connected to both the first LED load L1 and the second LED load L2 thru the second contact point to activate the second power loading option, wherein if the first load L1 and the second load L2 are designed with equal wattage, namely X=Y a second diffused light color temperature CTapp=X/(X+Y)CT1+Y/(X+Y)CT2=(CT1+CT2)/2 is thereby generated; and wherein when the third switching position is operated by the user, the power source VT is electrically connected only to the second load L2 thru the third contact point to activate the third power loading option to generate a third diffused light color temperature, namely CTapp=CT2, according to the color temperature tuning formula CTapp=X/(X+Y)CT1+Y/(X+Y)CT2=0/(0+Y)CT1+Y/(0+Y)CT2=CT2. In this embodiment of FIG. 16-3, the circuitry of the three-way lamp and its composing elements are conventional arts configured with ordinary skills having been used for more than 120 years as described in the description of FIG. 13-3.

FIG. 16-4 is identical to FIG. 13-4 in terms of circuit structure except the three LED loads are specifically designed with three different color temperatures respectively being a low light color temperature CT1, a medium light color temperature CT2 and a high light color temperature CT3 for forming the color temperature tuning circuitry, wherein the selection switch of the external control device is designed with three switching positions; wherein when the first switching position is operated by the user, the constant current power source VT is electrically connected to only the first load L1 thru the first contact point to activate the first power loading option delivered to the electric load L1 and a first diffused light color temperature CTapp=CT1 is thereby generated; wherein when the second switching position is operated by the user, the constant current power source VT is electrically connected to only the second LED load thru the second contact point to activate the second power loading option and the constant current power VT being delivered only to the electric load L2 to generate a second diffused light CTapp=CT2 is thereby generated; and wherein when the third switching position is operated by the user, the constant current power source VT is electrically connected to only the electric load L3 thru the third contact point to activate the third power loading option and the constant current power Vt is delivered only to the electric load L3 to generate a third diffused light CTapp=CT3.

FIG. 16-5 is identical to FIG. 13-5 in terms of circuitry structure except the three electric loads are specifically designed with three different color temperatures, namely CT1, CT2 and CT3 for forming the color temperature tuning circuitry; wherein the power allocation circuitry is configured with a five way selection switch to operate at least five loading options; wherein when the first switching position is operated to activate the first power loading option, a first diffused light color temperature CTapp=CT1 is therefore generated according to the color temperature tuning formula; wherein when the second switching position is operated to activate the second power loading option, a second diffused light color temperature CTapp=(CT1+CT2)/2 is therefore generated according to the color temperature tuning formula; wherein when the third switching position is operated to activate the third power loading option, a third diffused light color temperature CTapp=CT2 is thereby generated according to the color temperature tuning formula; wherein when the fourth switching position is operated to activate the fourth power loading option, a fourth diffused light color temperature CTapp=(CT2+CT3)/2 is thereby generated according to the color temperature tuning formula; and wherein when the fifth switching position is operated to activate the fifth power loading option, a fifth diffused light color temperature CTapp=CT3 is thereby generated according to the color temperature tuning formula.

The color temperature tuning technology of the present invention is composed of a software technology and a hardware technology to jointly perform a color temperature switching scheme: the software technology is configured with the color temperature tuning algorithm or the power allocation algorithm comprising the color temperature tuning formula CTapp=X/(X+Y) CT1+Y/(X+Y) CT2 and the total power control formula X+Y=Constant as disclosed in the specification of the prior granted patent U.S. Pat. No. 10,136,503 of the U.S. Pat. No. 10,470,276; the hardware technology is configured with a pair of reversely operated dimming circuitries working in conjunction with a switching device to activate different power loading options to generate different blended light color temperatures thru a diffuser. For the above five embodiments FIG. 16-1, FIG. 16-2, FIG. 16-3, FIG. 16-4 and FIG. 16-5, the switching devices are made with electric switches which are long established conventional arts having been used in the electrical industry for at least 120 years. The dimming circuitries or power allocation circuitries using electric switches as described are well known to people skilled in the art, therefore they do not need to be disclosed in detail. With the above being clarified, the embodiments FIG. 16-1, FIG. 16-2, FIG. 16-3, FIG. 16-4 and FIG. 16-5 are fully supported.

Please refer to FIG. 17 which represents a color temperature tuning circuitry configured with a pair of two dimming circuitries of FIG. 14 installed with two vacuum tube being electronic switches for respectively and reversely controlling power levels delivered to the two LED loads emitting lights with different color temperatures in order to generate a blended light color temperature. The technology of using the electronic switch of vacuum tube is no longer used in the industry due to obsoleteness.

Please refer to FIG. 18, which represents a color temperature tuning circuitry configured with a pair of two dimming circuitries of FIG. 15 installed with two semiconductor switching elements being electronic switches for respectively and reversely controlling the power levels delivered to the two LED loads emitting lights with different light color temperatures to generate a blended light color temperature.

With the above being explained and justified, the electric switches and electronic switches installed for operating at least one dimming circuitry are conventional arts having been practiced for at least half a century. Therefore, they do not need to be disclosed in detail. Please also notice FIG. 18 is identical to FIG. 8A disclosed in the prior granted patent U.S. Pat. No. 10,136,503.

Please refer to FIG. 12 which is block diagram drawn to illustrate a general platform for configuring a color temperature tuning circuitry comprising an external control device which can be the infrared ray sensor, the push button switch, the electrostatic sensor, the wireless remote control device, the push button, the voltage divider, the power interruption switch and etc. (cited from line 24 thru line 48 in column 25 of the patent '503), a switching circuitry 102 which is to convert a power source 101 to a total electric power T adaptable to LED loads 1051 and 1052, a power allocation circuitry 103 which can be the electric switch or the electronic switch to divide the total electric power T into a first electric power P1 for driving the first LED load 1051 and a second power P2 for driving the second LED load 1052, and the two LED loads 1051, 1052 emitting lights with different light color temperatures. FIG. 12 shows that the external control device 104 is supported by the infrared sensor 11' in FIG. 8A which is obviously or at least implicitly recognized as an embodiment of external control device to people skilled in the art, the power allocation circuitry 103 is supported by a power loading module formed by the microcontroller 12', the first unidirectional semiconductor switching element 14'*a* and the second unidirectional semiconductor switching element 14'*b* in FIG. 8A, which is obviously or at least implicitly recognized as an embodiment of power allocation circuitry to people skilled in the art."

Figures 1A, 12:
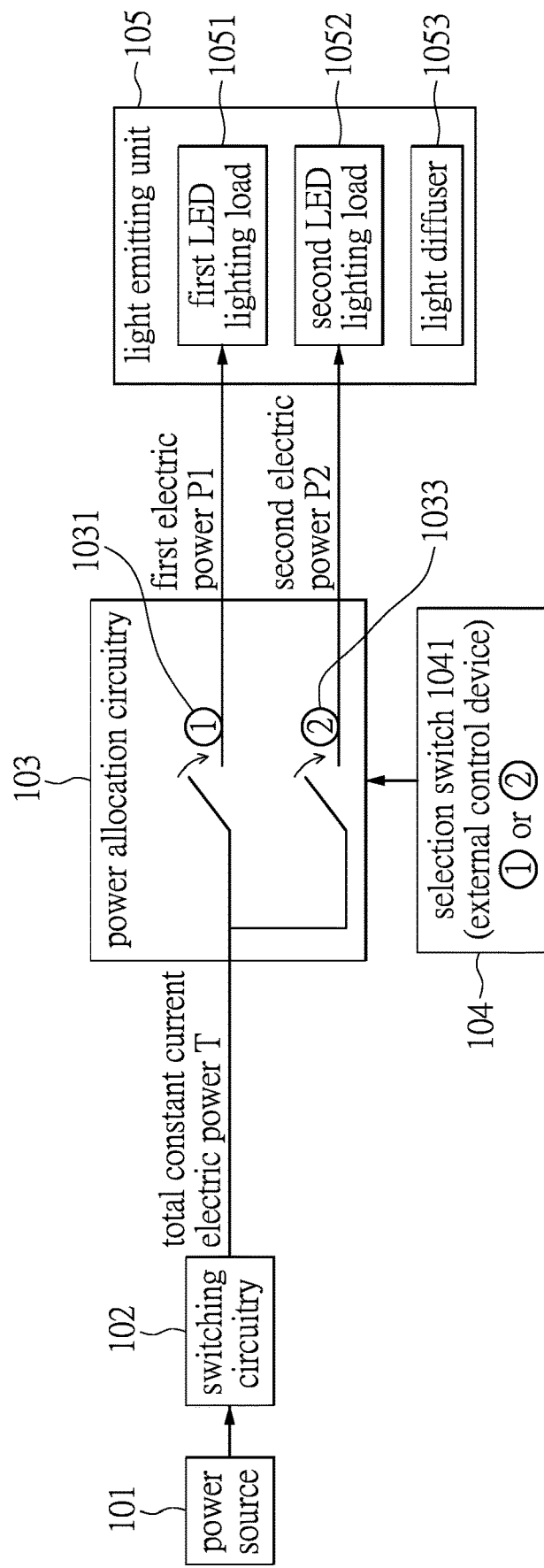

Please refer to FIG. 12-1A which is a schematic block diagram under the general platform FIG. 12, drawn to illustrate a color temperature tuning circuitry with the power allocation circuitry 103 being configured with a two way electric switch to operate two loading options 1031 and 1033, the external control device 104 being a selection switch 1041 is configured with two switching positions respectively connectable to the two loading options 1031 and 1033; wherein when the selection switch 1041 is connected to the first switching position for operating the first loading option 1031, the total electric power T is therefore delivered to the first LED lighting load 1051 to generate the illumination with the low diffused light color temperature, wherein when the selection switch 1041 is connected to the second switching position for operating the second loading option 1033, the total electric power T is therefore delivered to second LED lighting load 1052 to generate the illumination with the high diffused light color temperature.

Figures 1B, 12:
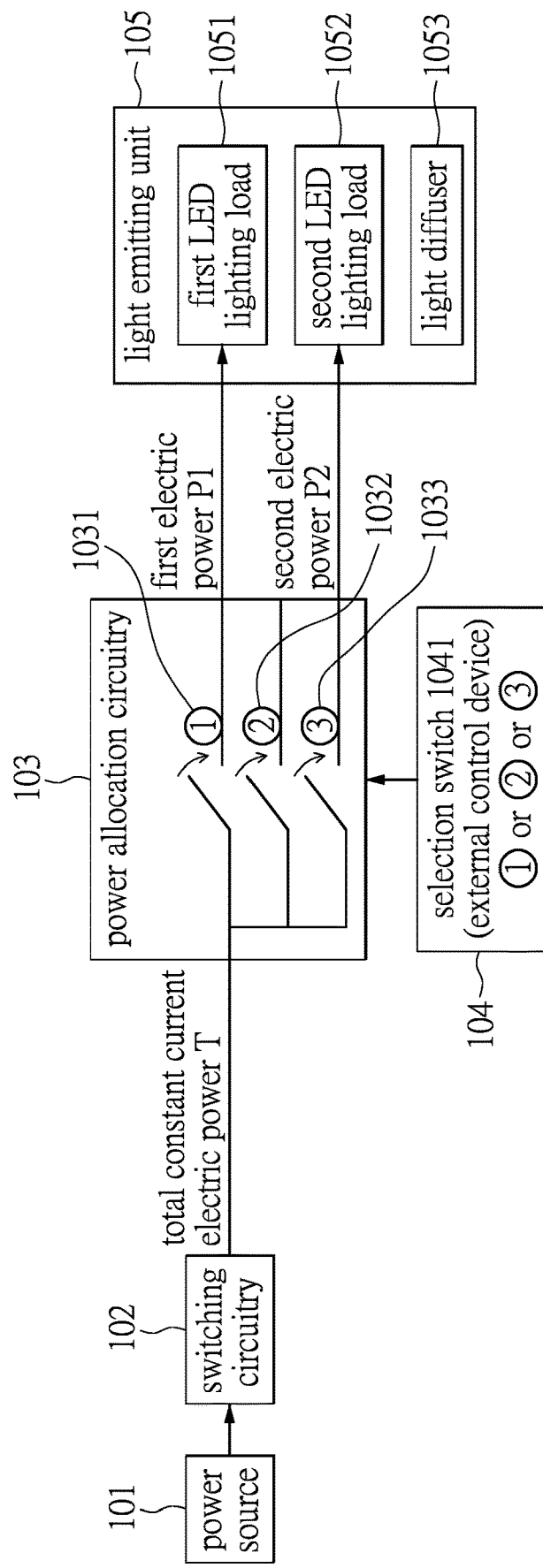
Figures 2, 12:
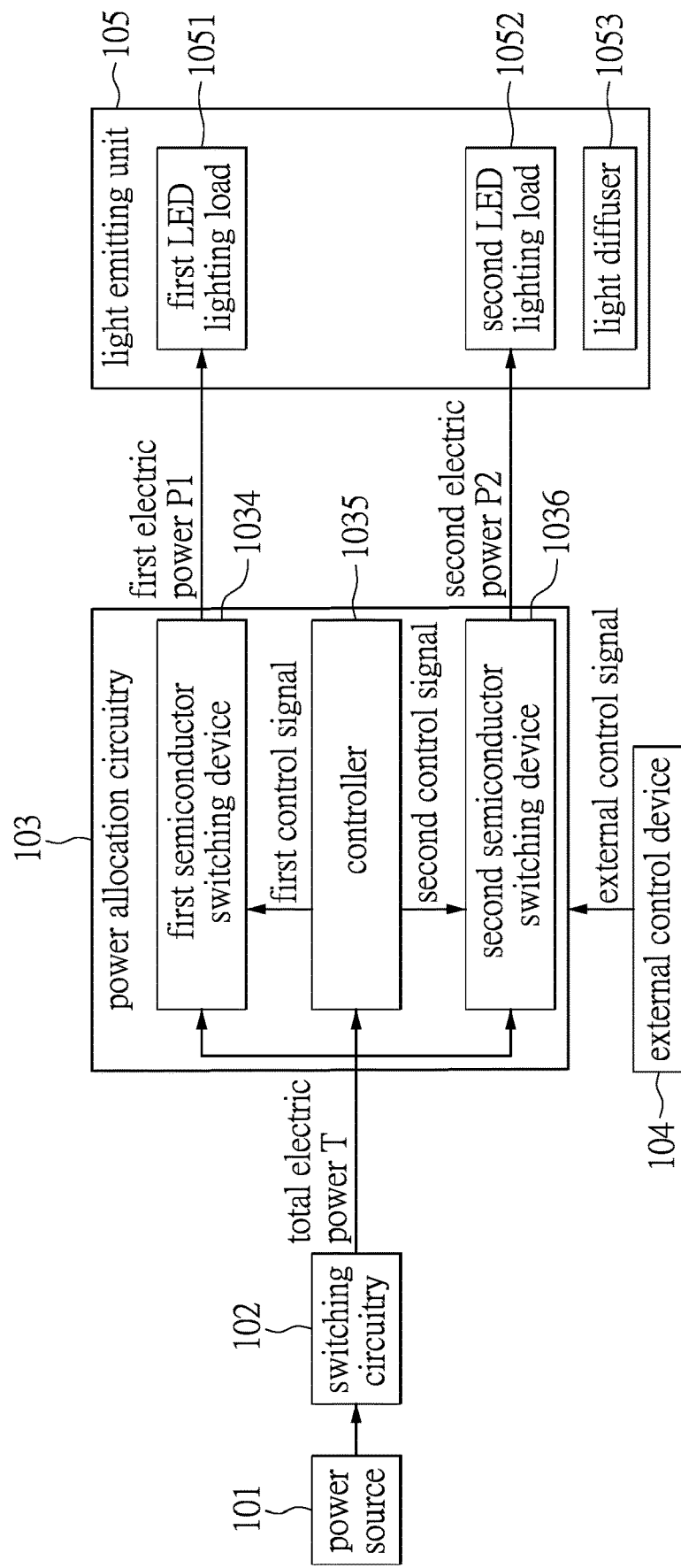

Please refer to FIG. 12-1B which is a schematic block diagram drawn to illustrate a color temperature tuning circuitry under the general platform of FIG. 12 with the power allocation circuitry 103 being configured with a three-way electric switch to operate three loading options 1031, 1032 and 1033, the external control device 104 being a selection switch 1041 is configured with three switching positions respectively connectable to the three loading options 1031, 1032 and 1033; wherein when the selection switch 1041 is connected to the first switching position for operating the first loading option 1031, the total electric power T is therefore delivered to the first LED lighting load 1051 to generate the illumination with the low diffused light color temperature, wherein when the selection switch 1041 is connected to the second switching position for operating the second loading option 1032, the total electric power T is therefore delivered to both the first LED lighting load 1051 and second LED lighting load 1052 to generate the illumination with the medium diffused light color temperature; wherein when the selection switch 1041 is connected to the third switching position for operating the third loading option 1033, the total electric power T is therefore delivered to second LED lighting load 1052 to generate the illumination with the high diffused light color temperature.

Please refer to FIG. 12-2 which is a schematic block diagram drawn to illustrate a color temperature tuning circuitry under the general platform of FIG. 12 with the power allocation circuitry 103 being configured with an electronic switch comprising a microcontroller 1035 electrically coupled with a first semiconductor switching device 1034 and a second semiconductor switching device 1036 to respectively output the first electric power P1 delivered to the first LED lighting load and the second electric power P2 delivered to the second LED lighting load 1052. With such configuration FIG. 12-2 is obviously supported by FIG. 8A; wherein the DC power source 3' in FIG. 8A is obviously an embodiment of the power source 101 in FIG. 12-2; wherein the infrared ray sensor 11' in FIG. 8A is obviously an embodiment of the external control device 104 in FIG. 12-2; wherein the microcontroller 12', the first unidirectional semiconductor switching element 14'*a* and the second unidirectional semiconductor switching element 14'*b* in FIG. 8A jointly form a power allocation circuitry configured with an electronic switch is obviously an embodiment of the power allocation circuitry 103 in FIG. 12-2, wherein the microcontroller 12' in FIG. 8A corresponds to the controller 1035 in FIG. 12-2, wherein the first unidirectional semiconductor switching element 14'*a* and the second unidirectional semiconductor switching element 14'*b* respectively correspond to the first semiconductor switching device 1034 and the second semiconductor switching device 1036 in FIG. 12-2; wherein the load 2'*a* and the load 2'*b* in FIG. 8A respectively correspond to the first LED lighting load 1051 and the second LED lighting load 1052 in FIG. 12-2.

As a summary of the present disclosure, the present invention teaches a theory and a technical foundation for building a technical framework of a colour temperature tuning technology composing a power allocation algorithm and a power allocation circuitry; wherein the power allocation algorithm is a software for managing a process of dividing a total electric power between at least a first LED load emitting light with a first colour temperature CT1 and a second LED load emitting light with a second colour temperature CT2 to generate a plurality of paired combinations of a first electric power X or P1 allocated to the first LED load and a second electric power Y or P2 allocated to the second LED load to generate a plurality of mingled light colour temperatures CTapp thru a light diffuser according to a colour temperature tuning formula $CTapp = CT1 \cdot X/(X+Y) + CT2 \cdot Y/(X+Y)$ and $X+Y = Constant$, wherein the second colour temperature CT2 is higher than the first colour temperature CT1; and the power allocation circuitry is a hardware circuit structure configured with an electronic switch or an electric switch electrically connected in series with a DC power and the two LED loads emitting light with different color temperatures for allocating the DC power between the first LED load and the second LED load according to the power allocation algorithm The above-mentioned descriptions represent merely the exemplary embodiment of the present disclosure, without any intention to limit the scope of the present disclosure thereto. Various equivalent changes, alterations or modifications based on the claims of present disclosure are all consequently viewed as being embraced by the scope of the present disclosure.

What is claimed is:

1. A two-level LED security light, comprising:
   at least one first light-emitting unit configured with at least two LED circuits electrically connected in parallel including at least a first LED circuit comprising a first LED load emitting a first white light with a first color temperature and at least a second LED circuit comprising a second LED load emitting a second white light with a second color temperature for generating a first illumination characterized by a first light intensity and a first mingled light color temperature, wherein the first illumination of the at least one first light-emitting unit is designed to brighten up an outdoor living space, wherein the second color temperature is higher than the first color temperature, namely $CT_2>CT_1$;

at least one first light diffuser covering the at least one first light-emitting unit to serve as a light mixer capable of blending the first white light and the second white light to generate the first illumination of the at least one first light-emitting unit with the first mingled light color temperature, wherein the at least one first light-emitting unit is installed inside a lamp housing covered by the at least one first light diffuser;

a second light-emitting unit configured with at least a third LED circuit comprising a third LED load emitting a third white light with a third color temperature for generating a second illumination characterized by a second light intensity and the third color temperature, wherein the second illumination of the second light-emitting unit is an edge lighting for performing a surface-wash illumination designed to brighten up at least a first side surface of a mounting surface behind the two-level LED security light, wherein the second light-emitting unit is installed inside a back plate housing which mounts the two-level LED security light to the mounting surface and covers an electric outlet of the mounting surface, wherein at least the first side surface of the back plate housing is designed with a first opening covered by a second light diffuser to enable the third LED load to outwardly emit and diffuse the third white light along at least the first side surface to perform the surface-wash illumination thru the first opening;

a switching circuitry electrically coupled with a power source from a power supply unit and the two light-emitting units to output at least one DC power with a constant current for energizing the at least one first light-emitting unit and the second light-emitting unit;

a first power allocation circuitry installed with the switching circuitry and the at least one first light-emitting unit to allocate a first electric power X delivered to the first LED circuit and a second electric power Y delivered to the second LED circuit to perform a selection of the first mingled light color temperature of the first illumination generated by the at least one first light-emitting unit thru the at least one first light diffuser when the at least one first light-emitting unit is energized;

a second power allocation circuitry installed with the switching circuitry and the second light-emitting unit to control a third electric power delivered to the third LED circuit to emit the third white light with the third color temperature for generating the second illumination of the second light-emitting unit;

a power allocation algorithm, working in conjunction with the first power allocation circuitry to operate a power allocation scheme comprising a plurality of power loading options configured with different paired combinations of the first electric power X delivered to the first LED circuit and the second electric power Y delivered to the second LED circuit by implementing a reverse yet complementary power adjustment process between the first electric power X and the second electric power Y such that a total light intensity generated by the first LED load and the second LED load remains unchanged while the first mingled light color temperature of the first illumination of the at least one first light-emitting unit thru the at least one first light diffuser is being adjusted;

wherein the first LED load, the second LED load and the third LED load are configured with phosphor based white LEDs produced by coating different phosphor compounds on the surface of LEDs to respectively generate the white light LEDs with the first color temperature, the second color temperature and the third color temperature;

wherein the units of the first mingled light color temperature of the first illumination, the first color temperature generated by the first LED load, the second color temperature generated by the second LED load and the third color temperature generated by the third LED load are Kelvin (K), and the units of the first electric power X, the second electric power Y and the third electric power are Watt (W);

at least one first external control device, configured with a selection switch comprising a plurality of switching positions to operate the first power allocation circuitry for selecting and activating a corresponding power loading option in the power allocation scheme for performing a corresponding mingled light color temperature;

a light sensing control unit;

a motion sensing unit; and a controller, electrically coupled with the first power allocation circuitry, the second power allocation circuitry, the light sensing control unit, the motion sensing unit and the at least one first external control device;

wherein the first power allocation circuitry is configured with a first semiconductor switching device electrically connected with the switching circuitry and the first LED circuit, and a second semiconductor switching device electrically connected with the switching circuitry and the second LED circuit;

wherein the second power allocation circuitry is configured with a third semiconductor switching device electrically connected with the switching circuitry and the third LED circuit;

wherein the controller is electrically coupled with the first semiconductor switching device, the second semiconductor switching device, the third semiconductor switching device and the at least one first external control device; wherein for activating the first power allocation circuitry, the controller outputs a first control signal to control a first conduction rate of the first semiconductor switching device to deliver the first electric power to the first LED circuit and a second control signal to control a second conduction rate of the second semiconductor switching device to deliver the second electric power to the second LED circuit for controlling the first light intensity and the first mingled light color temperature of the first illumination generated by the at least one first light-emitting unit, wherein for activating the second power allocation circuitry, the controller outputs a third control signal to control a third conduction rate of the third semiconductor switching device to deliver the third electric power to the third LED circuit for controlling the second light intensity of the second light-emitting unit such that the two-level LED security light respectively generates illuminations of different light intensities and different color temperatures according to control signals respectively received from at least the light sensing control unit, the motion sensing unit and the at least one first external control device;

wherein when an ambient light detected by the light sensing control unit is lower than a first predetermined value, the controller operates to activate the second power allocation circuitry to energize the second light-emitting unit to deliver the third electric power to the third LED circuit to perform the second illumination characterized by the second light intensity and the third color temperature for a first predetermined time duration with the motion sensing unit being activated; wherein when a motion signal is detected by the motion sensing unit, the controller operates to activate the first power allocation circuitry to energize the at least one first light-emitting unit, wherein the controller outputs the first control signal to control the first conduction rate of the first semiconductor switching device and the second control signal to control the second conduction rate of the second semiconductor switching device according to a setting of the selection switch of the at least one first external control device to perform the first illumination characterized by the first light intensity and the first mingled light color temperature for a second predetermined time duration before being turned off to continue the second illumination characterized by the second light intensity and the third color temperature; wherein the first light intensity of the first illumination is higher than the second light intensity of the second illumination; and wherein when the ambient light detected by the light sensing control unit is higher than a second predetermined value, the controller operates to switch off the two-level LED security light.

2. The two-level LED security light according to claim 1, wherein the first mingled light color temperature of the first illumination generated by the at least one first light-emitting unit is higher than or equal to the third color temperature of the second illumination generated by the second light-emitting unit.

3. The two-level LED security light according to claim 1, wherein when the first illumination is generated upon detecting the motion signal, the controller operates to continue the surface-wash illumination of the second illumination.

4. The two-level LED security light according to claim 1, wherein when the first illumination is generated upon detecting the motion signal, the controller operates to turn off the surface-wash illumination of the second illumination.

5. The two-level LED security light according to claim 1, wherein the first color temperature is a low color temperature in a range between 1500K and 3500K, wherein the second color temperature is a high color temperature in a range between 3000K and 7500K; wherein the second color temperature selected is always higher than the first color temperature selected.

6. The two-level LED security light according to claim 1, wherein the first mingled light color temperature of the first illumination is the first color temperature, wherein the first color temperature is a low color temperature, wherein the second semiconductor switching device is in a cutoff state and the controller outputs only the first control signal to control the first conduction rate of the first semiconductor switching device to deliver the first electric power to the first LED circuit to perform the first illumination with the low color temperature.

7. The two-level LED security light according to claim 1, wherein the second mingled light color temperature of the second illumination is the second color temperature, wherein the second color temperature is a high color temperature, wherein the first semiconductor switching device is in a cutoff state, and the controller outputs only the second control signal to control the second conduction rate of the second semiconductor switching device to deliver the second electric power to the second LED circuit to perform the third illumination with the high color temperature.

8. The two-level LED security light according to claim 1, wherein when the at least one first light-emitting unit is in a conduction state, the light intensity of the first LED load and the light intensity of the second LED load are respectively adjustable, wherein the controller in response to at least one first external control signal received respectively outputs a first PWM signal to control the first conduction rate of the first semiconductor switching device and a second PWM signal to control the second conduction rate of the second semiconductor switching device with an arrangement that the first conduction rate of the first semiconductor switching device and the second conduction rate of the second semiconductor switching device are reversely and complementarily adjusted such that a sum of the first electric power delivered to the first LED load and a sum of the second electric power delivered to the second LED load is maintained at a constant level while the first mingled light color temperature of the first white light emitted by the first LED load and the second white light emitted by the second LED load thru the at least one first light diffuser is proportionately adjusted according to the at least one first external control signal to perform a color temperature tuning of the first illumination or the third illumination.

9. The two-level LED security light according to claim 8, wherein the at least one first external control device includes a voltage divider, wherein the voltage divider is configured to output at least one voltage signal with a voltage value, wherein the at least one voltage signal with the voltage value is the at least one first external control signal, wherein upon receiving the at least one first external control signal, the controller operates to perform a corresponding mingled light color temperature according to the voltage value of the at least one voltage signal generated by the voltage divider.

10. The two-level LED security light according to claim 8, wherein the controller is programmed to operate with at least one color temperature switching scheme comprising a plurality of different mingled light color temperature tuning processes for tuning and selecting the first mingle light color temperature of the first illumination generated by the at least one first light-emitting unit, wherein paired combinations of the first conduction rate of the first semiconductor switching device and the second conduction rate of the second semiconductor switching device for respectively controlling the first electric power delivered to the first LED circuit and the second electric power delivered to the second LED circuit for creating different mingled light color temperatures are preprogrammed for operating a pick and play process according to the at least one first external control signal received and interpreted by the controller for performing a selected mingled light color temperature; wherein in programming the paired combinations of different conduction rates of the first semiconductor switching device and the second semiconductor switching device for controlling the first electric power delivered to the first LED circuit and the second electric power delivered to the second LED circuit are reversely and complementarily adjusted such that the sum of the first electric power delivered to the first LED circuit and the sum of the second electric power delivered to the second LED circuit remains unchanged.

11. The two-level LED security light according to claim 10, wherein the at least one first external control device includes a voltage divider, wherein the voltage divider is configured to output at least one voltage signal with a voltage value, wherein the at least one voltage signal with the voltage value is the at least one first external control signal, wherein upon receiving the at least one first external control signal, the controller operates the pick and play process to activate a corresponding mingled light color temperature tuning process in the at least one color temperature switching scheme according to the voltage value of the at least one voltage signal outputted by the voltage divider.

12. The two-level LED security light according to claim 11, wherein the voltage divider is designed with a step-less/free setting switch, wherein the voltage divider is configured to operate with a variable resistor to output the voltage value corresponding to a final parking location of a switch motion of the step-less/free setting switch on the variable resistor, wherein a full range of the voltage value outputted by the voltage divider corresponding to a full length of the variable resistor is divided into a plurality of different voltage domains for respectively activating the pick and play process, wherein the step-less/free setting switch is allowed to park at any location on the variable resistor to generate a corresponding voltage value to the controller, wherein the controller is designed to operate the pick and play process according to a belonging of a voltage domain with respect to the corresponding voltage value received from the voltage divider for selecting and activating the corresponding mingled light color temperature tuning process in the at least one color temperature switching scheme corresponding to the voltage domain.

13. A two-level LED security light, comprising:
at least a first light-emitting unit configured with a first LED load emitting a first white light with a first color temperature for generating a first illumination characterized by a first light intensity and the first color temperature, wherein the first illumination of the first light-emitting unit is designed to brighten up an outdoor living area;
at least one first light diffuser covering at least the first light-emitting unit;
a second light-emitting unit configured with at least a second LED load emitting a second white light with a second color temperature for generating a second illumination characterized by a second light intensity and the second color temperature, wherein the second illumination of the second light-emitting unit is an edge lighting for performing a surface-wash illumination designed to brighten up at least a first surface of a mounting surface behind the two-level LED security light, wherein the second light-emitting unit is installed inside a back plate housing which mounts the two-level LED security light to the mounting surface and covers an electric outlet of the mounting surface, wherein at least the first surface of the back plate housing is designed with a first opening covered by a second light diffuser to enable the second LED load to outwardly emit and diffuse the second white light along at least the first surface to perform the surface-wash illumination thru the first opening;
wherein the first LED load and the second LED load are configured with phosphor based white LEDs produced by coating different phosphor compounds on the surface of LEDs to respectively generate the white light LEDs with the first color temperature and the second color temperature;
a switching circuitry electrically coupled with a power source from a power supply unit and the two light-emitting units to output at least one DC power with a constant current for energizing at least the first light-emitting unit and the second light-emitting unit;
a first power allocation circuitry installed with the switching circuitry and at least the first light-emitting unit to control a first electric power delivered to the first LED load to emit the first white light with the first color temperature for generating the first illumination of at least the first light-emitting unit;
a second power allocation circuitry installed with the switching circuitry and the second light-emitting unit to control a second electric power delivered to the second LED load to emit the second white light with the second color temperature for generating the second illumination of the second light-emitting unit;
a light sensing control unit;
a motion sensing unit; and
a controller, electrically coupled with the first power allocation circuitry, the second power allocation circuitry, the light sensing control unit and the motion sensing unit;
wherein the first power allocation circuitry is configured with a first semiconductor switching device electrically connected with the switching circuitry and at least the first light-emitting unit; wherein the second power allocation circuitry is configured with a second semiconductor switching device electrically connected with the switching circuitry and the second light-emitting unit;
wherein the controller is electrically coupled with the first semiconductor switching device and the second semiconductor switching device; wherein for activating the first power allocation circuitry, the controller outputs a first control signal to control a first conduction rate of the first semiconductor switching device to deliver the first electric power to the first LED load for controlling the first light intensity of the first illumination generated by at least the first light-emitting unit; wherein for activating the second power allocation circuitry, the controller outputs a second control signal to control a second conduction rate of the second semiconductor switching device to deliver the second electric power to the second LED load for controlling the second light intensity of the second illumination generated by the second light-emitting unit such that the two-level LED security light respectively generates illuminations of different light intensities and different color temperatures according to control signals respectively received from at least the light sensing control unit and the motion sensing unit; wherein when an ambient light detected by the light sensing control unit is lower than a first predetermined value, the controller operates to activate the second power allocation circuitry to energize the second light-emitting unit to deliver the second electric power to the second LED load to perform the second illumination characterized by the second light intensity and the second color temperature for a first predetermined time duration with the motion sensing unit being activated;
wherein when a motion signal is detected by the motion sensing unit, the controller operates to activate the first power allocation circuitry to energize at least the first light-emitting unit, wherein the controller outputs the first control signal to control the first conduction rate of the first semiconductor switching device to generate the first illumination characterized by the first light intensity and the first color temperature for a second predetermined time duration before being turned off to continue the second illumination characterized by the second light intensity and the second color temperature; wherein the first light intensity of the first illumination is higher than the second light intensity of the second illumination; and wherein when the ambient light detected by the light sensing control unit is higher than a second predetermined value, the controller operates to switch off the two-level LED security light.

14. The two-level LED security light according to claim 13, wherein the first color temperature of the first illumination generated by the first light-emitting unit is higher than the second color temperature of the second illumination generated by the second light-emitting unit.

15. The two-level LED security light according to claim 13, wherein the first color temperature of the first illumination is higher than or equal to the third color temperature of the second illumination.

16. The two-level LED security light according to claim 13, wherein when the first illumination is generated upon detecting the motion signal, the controller operates to continue the surface-wash illumination of the second illumination.

17. The two-level LED security light according to claim 13, wherein when the first illumination is generated upon detecting the motion signal, the controller operates to turn off the surface-wash illumination of the second illumination.

18. The two-level LED security light according to claim 13, wherein the second color temperature is a low color temperature in a range between 1500K and 3500K, wherein the first color temperature is a high color temperature in a range between 3000K and 7500K, wherein the first color temperature selected is always higher than the second color temperature selected.

* * * * *